United States Patent
Gu et al.

(10) Patent No.: US 12,444,354 B2
(45) Date of Patent: Oct. 14, 2025

(54) ARRAY SUBSTRATE AND DISPLAY APPARATUS

(71) Applicants: Chengdu BOE Optoelectronics Technology Co., Ltd., Sichuan (CN); BOE Technology Group Co., Ltd., Beijing (CN)

(72) Inventors: Quanyong Gu, Beijing (CN); Tiaomei Zhang, Beijing (CN); Mengqi Wang, Beijing (CN); De Li, Beijing (CN); Hong Yi, Beijing (CN); Zhongliu Yang, Beijing (CN); Zhengkun Li, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/004,892

(22) PCT Filed: Jan. 4, 2022

(86) PCT No.: PCT/CN2022/070043
§ 371 (c)(1),
(2) Date: Jan. 10, 2023

(87) PCT Pub. No.: WO2023/130202
PCT Pub. Date: Jul. 13, 2023

(65) Prior Publication Data
US 2025/0273138 A1    Aug. 28, 2025

(51) Int. Cl.
*G09G 3/3233*    (2016.01)
*G09G 3/32*    (2016.01)
*H10D 86/40*    (2025.01)

(52) U.S. Cl.
CPC ............. *G09G 3/3233* (2013.01); *G09G 3/32* (2013.01); *H10D 86/441* (2025.01);
(Continued)

(58) Field of Classification Search
CPC ................... G09G 3/3233; G09G 3/32; G09G 2300/0426; G09G 2300/0819;
(Continued)

(56) References Cited

U.S. PATENT DOCUMENTS

| 2014/0159019 A1 | 6/2014 | Jung et al. |
| 2015/0243715 A1 | 8/2015 | Shin |
| 2018/0090553 A1 | 3/2018 | Rieutort-Louis et al. |
| 2020/0118508 A1 | 4/2020 | Park et al. |

(Continued)

FOREIGN PATENT DOCUMENTS

| CN | 103872082 A | 6/2014 |
| CN | 104867446 A | 8/2015 |

(Continued)

OTHER PUBLICATIONS

International Search Report & Written Opinion mailed Sep. 23, 2022, regarding PCT/CN2022/070043.

*Primary Examiner* — Stacy Khoo
(74) *Attorney, Agent, or Firm* — Intellectual Valley Law, P.C.

(57) ABSTRACT

An array substrate is provided. The array substrate includes a base substrate, and a plurality of pixel driving circuits configured to drive light emission in a plurality of subpixels. A respective pixel driving circuit includes a driving transistor; a compensation transistor configured to provide a compensation voltage signal to a gate electrode of the driving transistor; the compensation transistor including a source electrode, a drain electrode and a gate electrode; a node connecting line in a first signal line layer; a first pad in a second signal line layer on a side of the first signal line layer away from the base substrate; a voltage line configured to (Continued)

output a constant voltage signal; and a voltage connecting line electrically connecting the first pad with the voltage line. The node connecting line connects the gate electrode of the driving transistor and a drain electrode of the compensation transistor.

20 Claims, 84 Drawing Sheets

(52) U.S. Cl.
CPC ............... *G09G 2300/0426* (2013.01); *G09G 2300/0819* (2013.01); *G09G 2300/0842* (2013.01); *G09G 2300/0861* (2013.01)

(58) Field of Classification Search
CPC ... G09G 2300/0842; G09G 2300/0861; H10D 86/441
See application file for complete search history.

(56) References Cited

U.S. PATENT DOCUMENTS

| | | | |
|---|---|---|---|
| 2021/0193775 A1* | 6/2021 | Kang | H10K 59/131 |
| 2022/0013509 A1* | 1/2022 | Lee | H10D 86/441 |
| 2022/0209208 A1* | 6/2022 | Kang | H10K 71/00 |

FOREIGN PATENT DOCUMENTS

| | | |
|---|---|---|
| CN | 107068712 A | 8/2017 |
| CN | 107871765 A | 4/2018 |
| CN | 110992880 A | 4/2020 |
| CN | 111029367 A | 4/2020 |
| CN | 212256866 U | 12/2020 |
| CN | 112967682 A | 6/2021 |
| CN | 113228291 A | 8/2021 |
| CN | 113674693 A | 11/2021 |
| CN | 113745325 A | 12/2021 |
| JP | 2002202749 A | 7/2002 |
| WO | 2021056422 A1 | 4/2021 |

\* cited by examiner

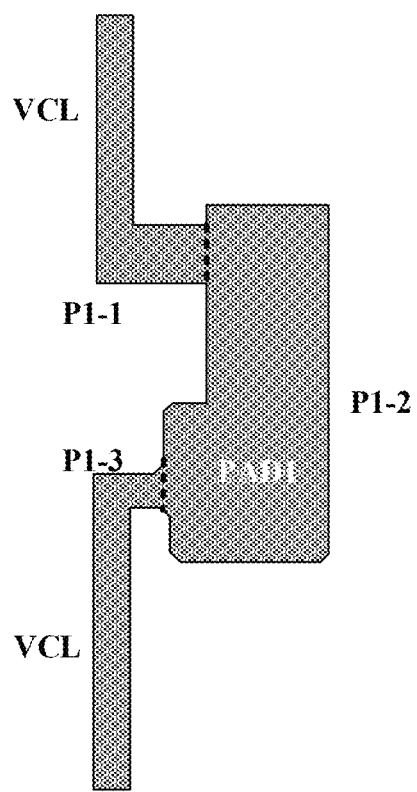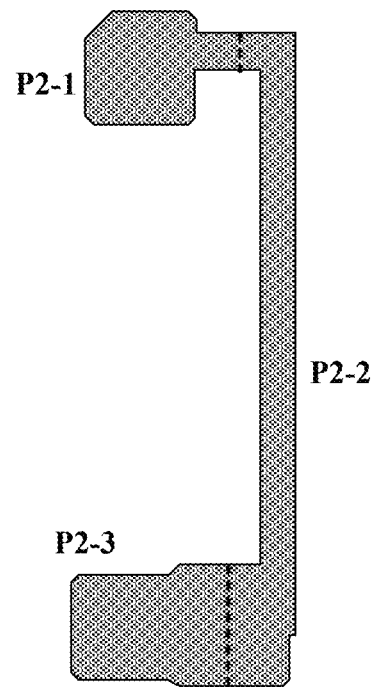
FIG. 5B    FIG. 5C

ARRAY SUBSTRATE AND DISPLAY APPARATUS

CROSS-REFERENCE TO RELATED APPLICATION

This application is a national stage application under 35 U.S.C. § 371 of International Application No. PCT/CN2022/070043, filed Jan. 4, 2022, the contents of which are incorporated by reference in the entirety.

TECHNICAL FIELD

The present invention relates to display technology, more particularly, to an array substrate and a display apparatus.

BACKGROUND

Organic Light Emitting Diode (OLED) display is one of the hotspots in the field of flat panel display research today. Unlike Thin Film Transistor-Liquid Crystal Display (TFT-LCD), which uses a stable voltage to control brightness, OLED is driven by a driving current required to be kept constant to control illumination. The OLED display panel includes a plurality of pixel units configured with pixel-driving circuits arranged in multiple rows and columns. Each pixel-driving circuit includes a driving transistor having a gate terminal connected to one gate line per row and a drain terminal connected to one data line per column. When the row in which the pixel unit is gated is turned on, the switching transistor connected to the driving transistor is turned on, and the data voltage is applied from the data line to the driving transistor via the switching transistor, so that the driving transistor outputs a current corresponding to the data voltage to an OLED device. The OLED device is driven to emit light of a corresponding brightness.

SUMMARY

In one aspect, the present disclosure provides an array substrate, comprising a base substrate, and a plurality of pixel driving circuits configured to drive light emission in a plurality of subpixels; wherein a respective pixel driving circuit comprises a driving transistor; a compensation transistor configured to provide a compensation voltage signal to a gate electrode of the driving transistor; the compensation transistor comprising a source electrode, a drain electrode and a gate electrode; a node connecting line in a first signal line layer; a first pad in a second signal line layer on a side of the first signal line layer away from the base substrate; a voltage line configured to output a constant voltage signal; and a voltage connecting line electrically connecting the first pad with the voltage line; wherein the node connecting line connects the gate electrode of the driving transistor and a drain electrode of the compensation transistor; an orthographic projection of the first pad on a base substrate at least partially overlaps with an orthographic projection of the node connecting line on the base substrate; and an orthographic projection of the voltage line and the voltage connecting line on the base substrate is spaced apart from the orthographic projection of the node connecting line on the base substrate.

Optionally, the first pad, a portion of the voltage connecting line, and a portion of the voltage line are parts of a closed loop.

Optionally, the array substrate further comprises a connecting line layer on a side of the second signal line layer away from the base substrate, the connecting line layer comprising a plurality of connecting lines; an anode layer on a side of the connecting line layer away from the base substrate; wherein the respective pixel driving circuit further comprises a second pad in the second signal line layer; the second pad is connected to a respective anode through a respective connecting line of the plurality of connecting lines; and the respective connecting line comprises a transparent conducting material.

Optionally, the respective pixel driving circuit further comprises a first transistor having two gate electrodes, and an active layer comprising a portion, an orthographic projection of the portion on the base substrate is non-overlapping with orthographic projections of the two gate electrodes of the first transistor on the base substrate; wherein a drain electrode of the first transistor is electrically connected to the gate electrode of the driving transistor; the array substrate further comprising a second conductive layer on a side of the first signal line layer closer to the base substrate; wherein the second conductive layer comprises a shielding block, an orthographic projection of the shielding block on the base substrate at least partially overlaps with an orthographic projection of the portion on the base substrate.

Optionally, the array substrate further comprising a second conductive layer on a side of the first signal line layer closer to the base substrate; the second conductive layer comprises a plurality of second capacitor electrodes, adjacent second capacitor electrodes of the plurality of second capacitor electrodes being connected to each other by a connecting portion; and an orthographic projection of the connecting portion on the base substrate at least partially overlaps with an orthographic projection of the voltage connecting line on the base substrate.

Optionally, the node connecting line has a length along a first direction less than a length along a second direction; the voltage line has a length along the first direction less than a length along the second direction; and the first direction and the second direction cross over each other.

Optionally, the orthographic projection of the first pad on the base substrate covers the orthographic projection of the node connecting line on the base substrate; and the orthographic projection of the first pad on the base substrate at least partially overlaps with an orthographic projection of an active layer of the compensation transistor on the base substrate.

Optionally, the orthographic projection of the first pad on the base substrate at least partially overlaps with an orthographic projection of a gate electrode of the compensation transistor on the base substrate.

Optionally, the respective pixel driving circuit further comprises a second pad in the second signal line layer; wherein the second pad is connected to a drain electrode of a fifth transistor and a drain electrode of a sixth transistor, and electrically connected to an anode of a light emitting element connected to the respective pixel driving circuit; a source electrode of the fifth transistor is electrically connected to a drain electrode of the driving transistor; and a source electrode of the sixth transistor is electrically connected to the voltage line.

Optionally, the first pad and the second pad cross over a respective gate line of a plurality of gate lines.

Optionally, a length of the second pad along a first direction is greater than a length of the first pad along the first direction; a length of the second pad along a second direction is greater than a length of the first pad along the second direction; and the second pad at least partially surrounds the first pad.

Optionally, an orthographic projection of the second pad on the base substrate at least partially overlaps with an orthographic projection of a signal line in the first signal line layer on the base substrate; and the signal line is configured to transmit a continuous direct current.

Optionally, a portion of the second pad extends along a direction substantially parallel to an extension direction of a respective second reset signal line of a plurality of second reset signal lines, a respective second reset signal line of the plurality of second reset signal lines being configured to provide a reset signal to a gate electrode of the driving transistor; and an orthographic projection of the respective second reset signal line on the base substrate at least partially overlaps with an orthographic projection of the portion of the second pad on the base substrate.

Optionally, a portion of the second pad extends along a direction substantially parallel to an extension direction of a respective voltage supply line of a plurality of voltage supply lines; an orthographic projection of the respective voltage supply line on the base substrate at least partially overlaps with an orthographic projection of the portion of the second pad on the base substrate; and the respective voltage supply line is configured to provide a driving voltage to a light emitting element connected to the respective pixel driving circuit.

Optionally, the first pad is configured to receive a reset signal; the first pad is electrically connected to a vertical reset signal line, the vertical reset signal line extending along a second direction; the vertical reset signal line is electrically connected to a horizontal reset signal line, the horizontal reset signal line extending along a first direction; and the horizontal reset signal line is in a second signal line layer.

Optionally, the array substrate further comprises a plurality of reset signal transmission lines in a semiconductor material layer, the semiconductor material layer being on a side of the first signal line layer closer to the base substrate; wherein a respective reset signal transmission line of the plurality of reset signal transmission lines connects source electrodes of first transistors and sixth transistors in a row of pixel driving circuit together; the respective reset signal transmission line extends along the first direction; and a drain electrode of a respective one of the first transistors is electrically connected to the gate electrode of the driving transistor.

Optionally, the first pad is configured to receive a voltage supply signal; the first pad is connected to a respective voltage supply line of a plurality of voltage supply lines in an adjacent pixel driving circuit; and the respective voltage supply line is configured to provide a driving voltage to a light emitting element connected to the respective pixel driving circuit.

Optionally, the voltage connecting line crosses over a respective data line of a plurality of data lines, the respective data line being in a pixel driving circuit adjacent to the respective pixel driving circuit.

Optionally, the plurality of pixel driving circuits comprise at least a first pixel driving circuit and a second pixel driving circuit; and orthographic projections of a first node connecting line in the first pixel driving circuit and a second node connecting line in the second pixel driving circuit on the base substrate respectively overlap with orthographic projections of a first anode in the first pixel driving circuit and a second anode in the second pixel driving circuit on the base substrate, at different portions, respectively, and by different percentages; the second node connecting line connects a gate electrode of a driving transistor in the second pixel driving circuit with a drain electrode of a compensation transistor in the second pixel driving circuit; a voltage level at a first node is the same as a voltage level at the gate electrode of the driving transistor in the first pixel driving circuit; and a voltage level at a second node is the same as a voltage level at the gate electrode of the driving transistor in the second pixel driving circuit.

In another aspect, the present disclosure provides a display apparatus, comprising the array substrate described herein, and an integrated circuit connected to the array substrate.

BRIEF DESCRIPTION OF THE FIGURES

The following drawings are merely examples for illustrative purposes according to various disclosed embodiments and are not intended to limit the scope of the present invention.

FIG. 5B illustrates the structure of a first pad in some embodiments according to the present disclosure.

FIG. 5C illustrates the structure of a second pad in some embodiments according to the present disclosure.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

The present disclosure provides, inter alia, an array substrate and a display apparatus that substantially obviate one or more of the problems due to limitations and disadvantages of the related art. In one aspect, the present disclosure provides an array substrate. In some embodiments, the array substrate includes a plurality of pixel driving circuits. In some embodiments, a respective pixel driving circuit includes a node connecting line in a first signal line layer; and a first pad in a second signal line layer. Optionally, the node connecting line connects a first capacitor electrode in the respective pixel driving circuit and a portion of a semiconductor material layer together, the portion of the semiconductor material layer being between a source electrode of a first transistor and a drain electrode of the driving transistor. Optionally, an orthographic projection of the first pad on a base substrate at least partially overlaps with an orthographic projection of the node connecting line on the base substrate.

Various appropriate pixel driving circuits may be used in the present array substrate. Examples of appropriate driving circuits include 3T1C, 2T1C, 4T1C, 4T2C, 5T2C, 6T1C, 7T1C, 7T2C, 8T1C, and 8T2C. In some embodiments, the respective one of the plurality of pixel driving circuits is an 7T1C driving circuit. Various appropriate light emitting elements may be used in the present array substrate. Examples of appropriate light emitting elements include organic light emitting diodes, quantum dots light emitting diodes, and micro light emitting diodes. Optionally, the light emitting element is micro light emitting diode. Optionally, the light emitting element is an organic light emitting diode including an organic light emitting layer.

Figure 1:
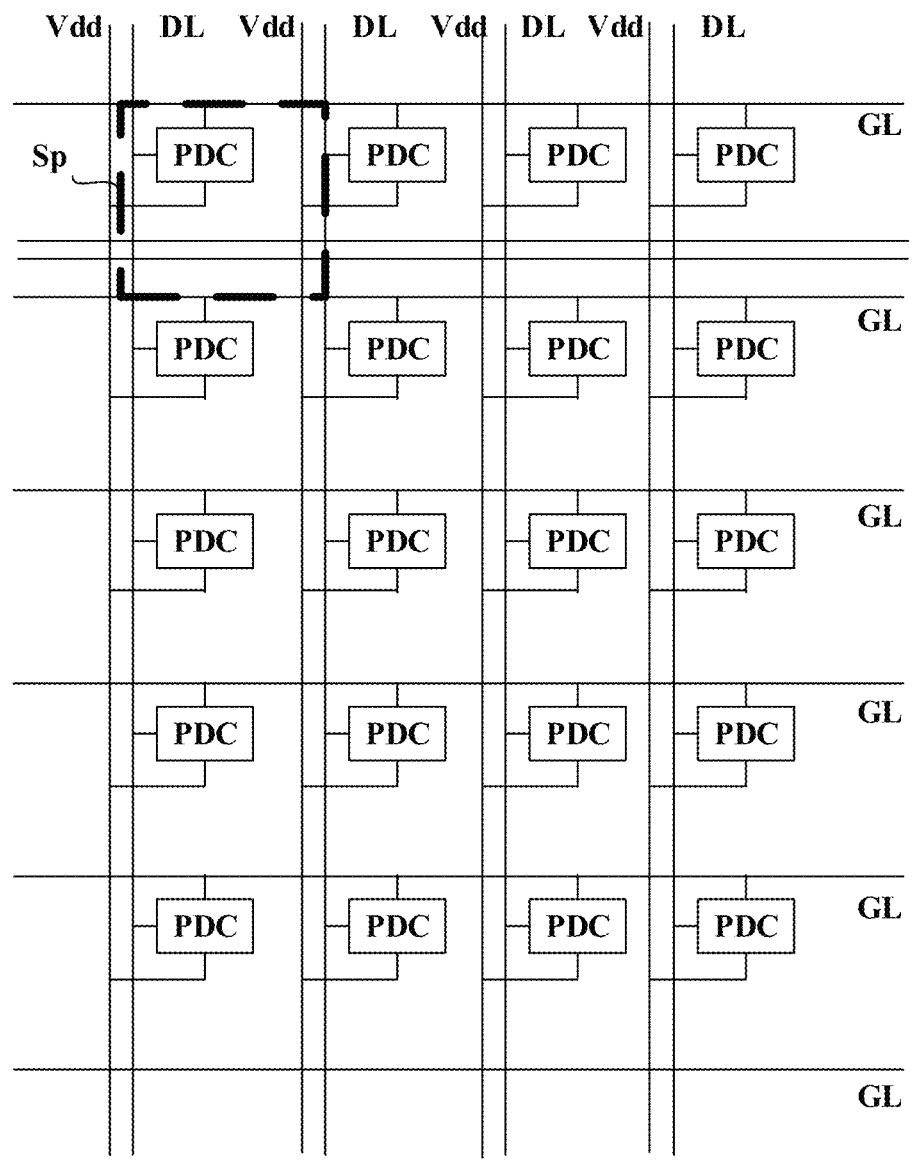
FIG. 1 is a plan view of an array substrate in some embodiments according to the present disclosure.

FIG. 1 is a plan view of an array substrate in some embodiments according to the present disclosure. Referring to FIG. 1, the array substrate includes an array of subpixels Sp. Each subpixel includes an electronic component, e.g., a light emitting element. In one example, the light emitting element is driven by a respective pixel driving circuit PDC. The array substrate includes a plurality of gate lines GL, a plurality of data lines DL, and a plurality of high voltage signal lines Vdd. Light emission in a respective subpixel is driven by a respective pixel driving circuit PDC. In one example, a high voltage signal is input, through a respective one of the plurality of high voltage signal lines Vdd, to the respective pixel driving circuit PDC connected to an anode of the light emitting element; a low voltage signal is input to a cathode of the light emitting element. A voltage difference between the high voltage signal (e.g., the VDD signal) and the low voltage signal (e.g., the VSS signal) is a driving voltage $\Delta V$ that drives light emission in the light emitting element.

The array substrate in some embodiments includes a plurality of subpixels. In some embodiments, the plurality of subpixels includes a respective first subpixel, a respective second subpixel, a respective third subpixel, and a respective fourth subpixel. Optionally, a respective pixel of the array substrate includes the respective first subpixel, the respective second subpixel, the respective third subpixel, and the respective fourth subpixel. The plurality of subpixels in the array substrate are arranged in an array. In one example, the array of the plurality of subpixels includes a S1-S2-S3-S4 format repeating array, in which S1 stands for the respective first subpixel, S2 stands for the respective second subpixel, S3 stands for the respective third subpixel, and S4 stands for the respective fourth subpixel. In another example, the S1-S2-S3-S4 format is a C1-C2-C3-C4 format, in which C1 stands for the respective first subpixel of a first color, C2 stands for the respective second subpixel of a second color, C3 stands for the respective third subpixel of a third color, and C4 stands for the respective fourth subpixel of a fourth color. In another example, the S1-S2-S3-S4 format is a C1-C2-C3-C2' format, in which C1 stands for the respective first subpixel of a first color, C2 stands for the respective second subpixel of a second color, C3 stands for the respective third subpixel of a third color, and C2' stands for the respective fourth subpixel of the second color. In another example, the C1-C2-C3-C2' format is a R-G-B-G format, in which the respective first subpixel is a red subpixel, the respective second subpixel is a green subpixel, the respective third subpixel is a blue subpixel, and the respective fourth subpixel is a green subpixel.

In some embodiments, a minimum repeating unit of the plurality of subpixels of the array substrate includes the respective first subpixel, the respective second subpixel, the respective third subpixel, and the respective fourth subpixel. Optionally, each of the respective first subpixel, the respective second subpixel, the respective third subpixel, and the respective fourth subpixel, includes the first transistor T1, the second transistor T2, the third transistor T3, the fourth transistor T4, the fifth transistor T5, the sixth transistor T6, and the driving transistor Td.

Figure 2A:
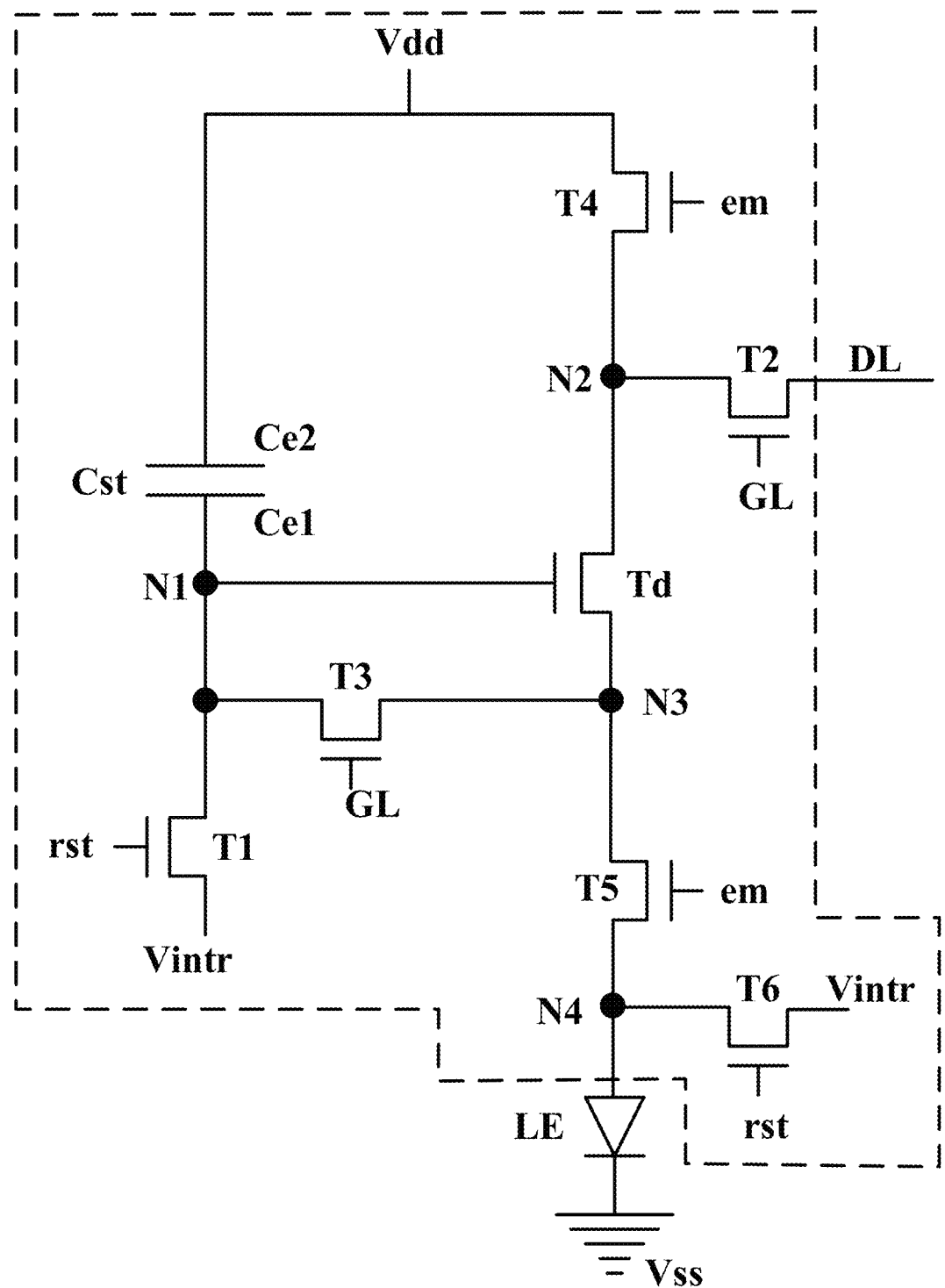
FIG. 2A is a circuit diagram illustrating the structure of a pixel driving circuit in some embodiments according to the present disclosure.

FIG. 2A is a circuit diagram illustrating the structure of a pixel driving circuit in some embodiments according to the present disclosure. Referring to FIG. 2A, in some embodiments, the respective pixel driving circuit includes a driving transistor Td; a storage capacitor Cst having a first capacitor electrode Ce1 and a second capacitor electrode Ce2; a first transistor T1 having a gate electrode connected to a respective reset control signal line of a plurality of reset control signal lines rst, a source electrode connected to a respective first reset signal line of a plurality of first reset signal lines Vintr, and a drain electrode connected to a first capacitor electrode Ce1 of the storage capacitor Cst and a gate electrode of the driving transistor Td; a second transistor T2 having a gate electrode connected to a respective gate line of a plurality of gate lines GL, a source electrode connected to a respective data line of a plurality of data lines DL, and a drain electrode connected to a source electrode of the driving transistor Td; a third transistor T3 having a gate electrode connected to the respective gate line, a drain electrode connected to the first capacitor electrode Ce1 of the storage capacitor Cst and the gate electrode of the driving transistor Td, and a source electrode connected to a drain electrode of the driving transistor Td; a fourth transistor T4 having a gate electrode connected to a respective light emitting control signal line of a plurality of light emitting control signal lines em, a source electrode connected to a respective voltage supply line of a plurality of voltage supply lines Vdd, and a drain electrode connected to the source electrode of the driving transistor Td and the drain electrode of the second transistor T2; a fifth transistor T5 having a gate electrode connected to the respective light emitting control signal line, a source electrode connected to the drain electrodes of the driving transistor Td and the source electrode of the third transistor T3, and a drain electrode connected to an anode of a light emitting element LE; and a sixth transistor T6 having a gate electrode connected to the respective reset control signal line of the plurality of reset control signal lines rst, a source electrode connected to the respective first reset signal line of the plurality of first reset signal lines Vintr, and a drain electrode connected to the drain electrode of the fifth transistor and the anode of the light emitting element LE. The second capacitor electrode Ce2 is connected to the respective voltage supply line and the source electrode of the fourth transistor T4.

Figure 2B:
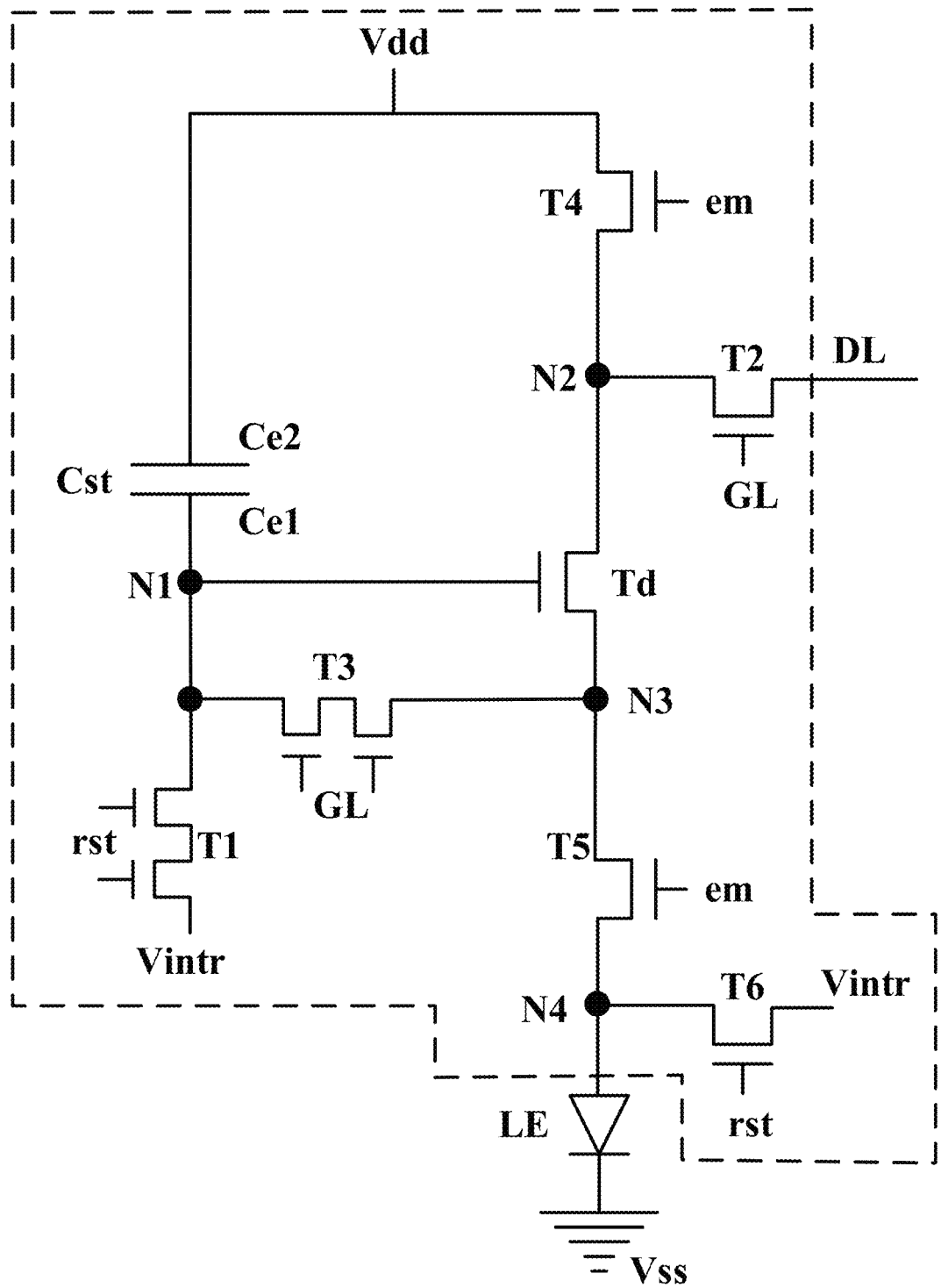
FIG. 2B is a circuit diagram illustrating the structure of a pixel driving circuit in some embodiments according to the present disclosure.

FIG. 2B is a circuit diagram illustrating the structure of a pixel driving circuit in some embodiments according to the present disclosure. Referring to FIG. 2B, in some embodiments, the third transistor T3 is a "double gate" transistor, and the first transistor T1 is a "double gate" transistor. Optionally, in a "double gate" first transistor, the active layer of the first transistor crosses over a respective reset control signal lines twice (alternatively, the respective reset control signal line crosses over the active layer of the first transistor T1 twice). Similarly, in a "double gate" third transistor, the active layer of the third transistor T3 crosses over a respective gate line of the plurality of gate lines GL twice (alternatively, the respective gate line crosses over the active layer of the third transistor T3 twice).

The pixel driving circuit further include a first node N1, a second node N2, a third node N3, and a fourth node N4. The first node N1 is connected to the gate electrode of the driving transistor Td, the first capacitor electrode Ce1, and the drain electrode of the third transistor T3. The second node N2 is connected to the drain electrode of the fourth transistor T4, the drain electrode of the second transistor T2, and the source electrode of the driving transistor Td. The third node N3 is connected to the drain electrode of the driving transistor Td, the source electrode of the third transistor T3, and the source electrode of the fifth transistor T5. The fourth node N4 is connected to the drain electrode of the fifth transistor T5, the drain electrode of the sixth transistor T6, and the anode of the light emitting element LE.

As used herein, a source electrode or a drain electrode refers to one of a first terminal and a second terminal of a transistor, the first terminal and the second terminal being connected to an active layer of the transistor. A direction of a current flowing through the transistor may be configured to be from a source electrode to a drain electrode, or from a drain electrode to a source electrode. Accordingly, depending on the direction of the current flowing through the transistor, in one example, the source electrode is configured to receive an input signal and the drain electrode is configured to output an output signal; in another example, the drain electrode is configured to receive an input signal and the source electrode is configured to output an output signal.

Figure 3A:
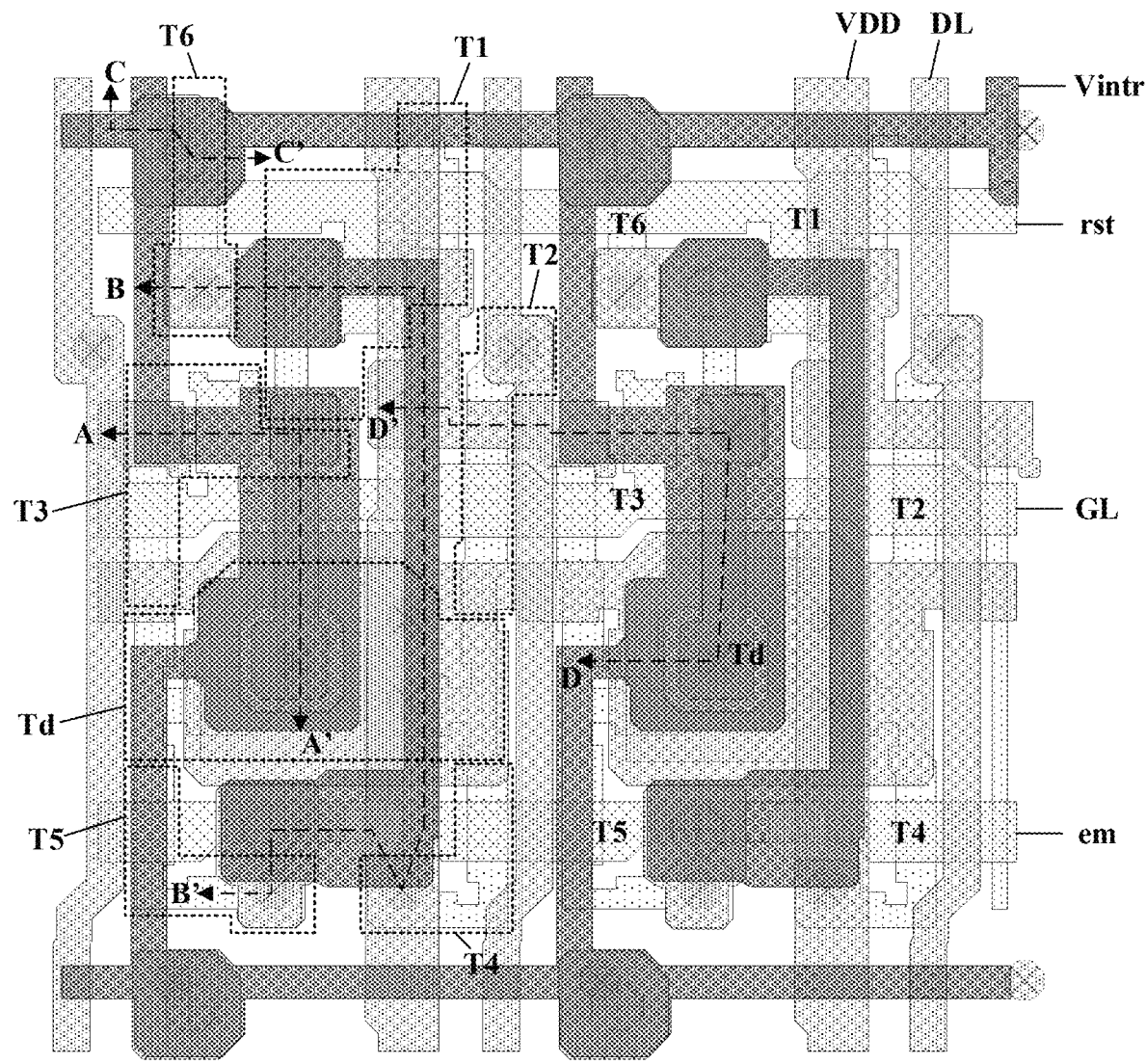
FIG. 3A is a diagram illustrating the structure of an array substrate in some embodiments according to the present disclosure.
Figure 3B:
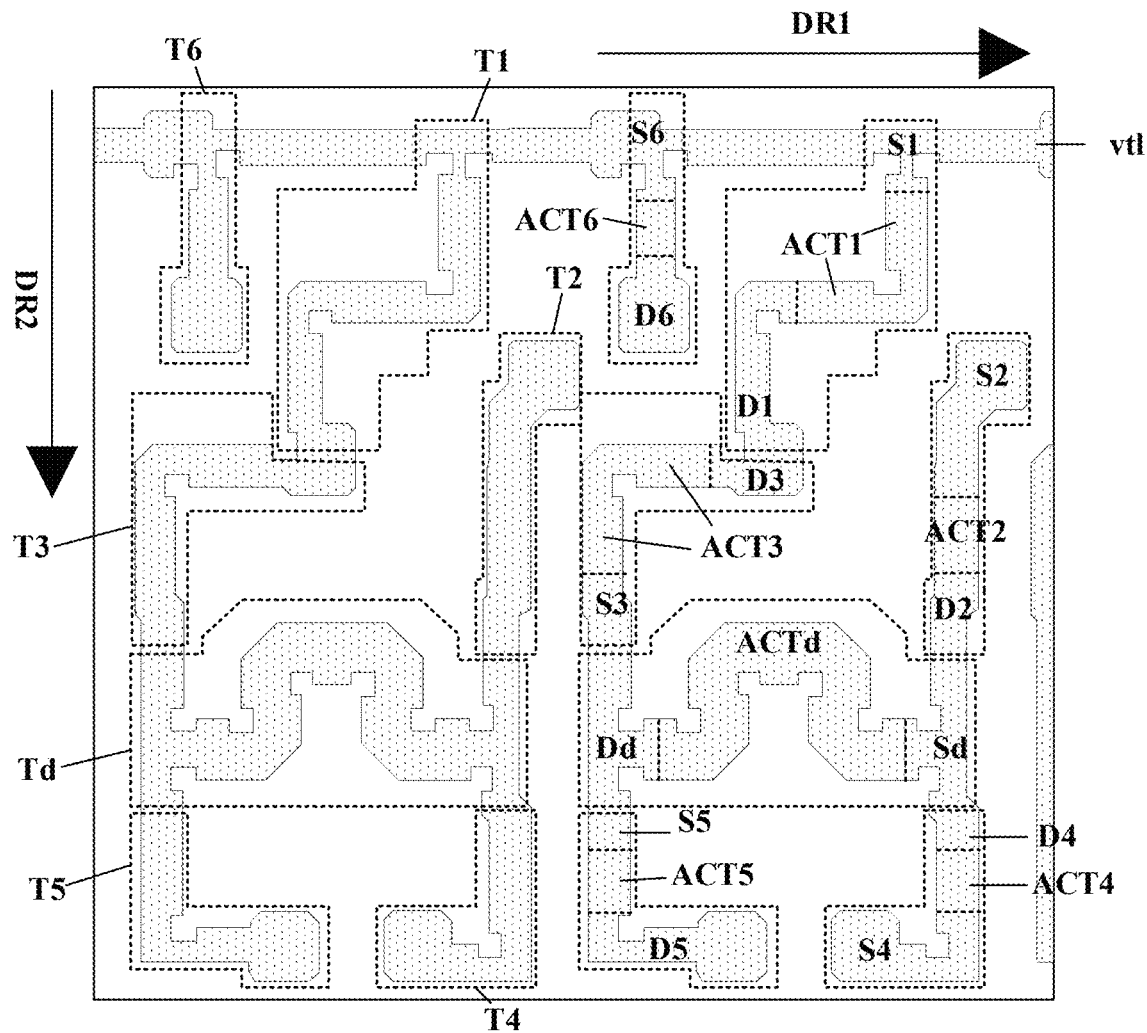
FIG. 3B is a diagram illustrating the structure of a semiconductor material layer in an array substrate depicted in FIG. 3A.
Figure 3C:
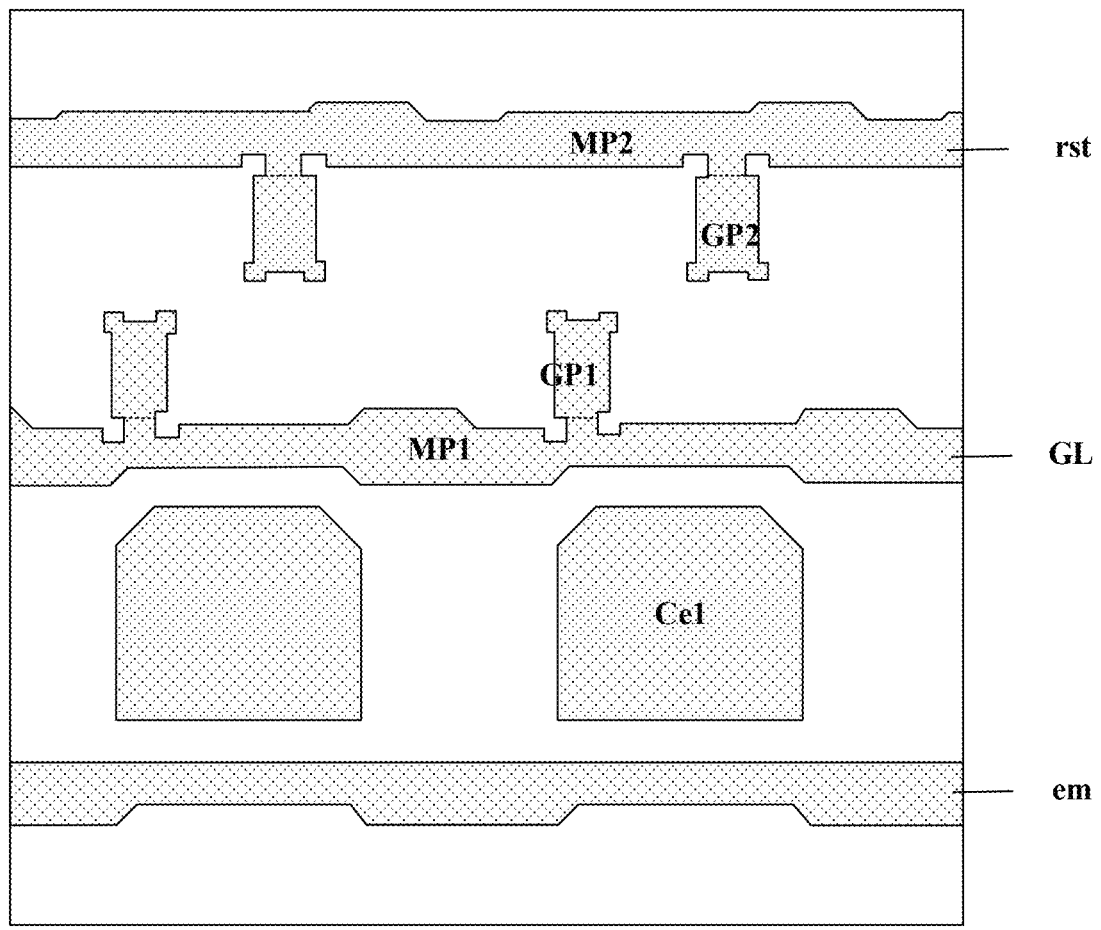
FIG. 3C is a diagram illustrating the structure of a first conductive layer in an array substrate depicted in FIG. 3A.
Figure 3D:
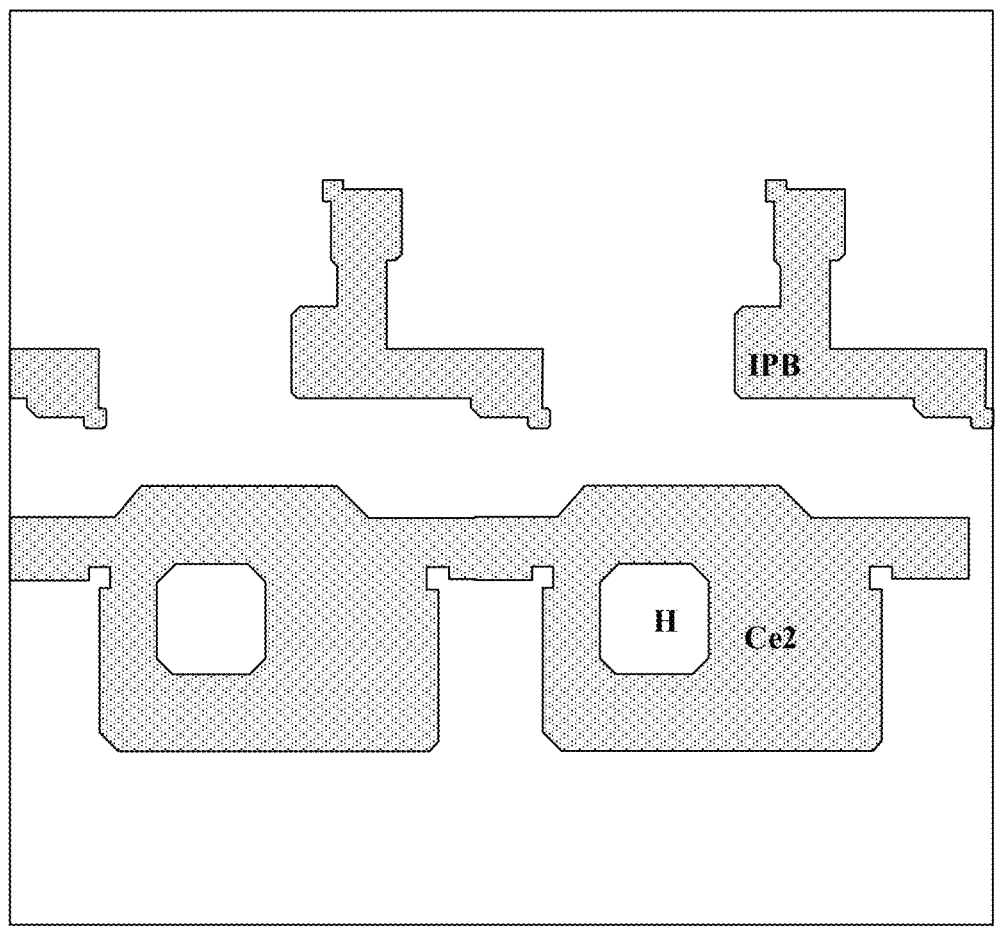
FIG. 3D is a diagram illustrating the structure of a second conductive layer in an array substrate depicted in FIG. 3A.
Figure 3E:
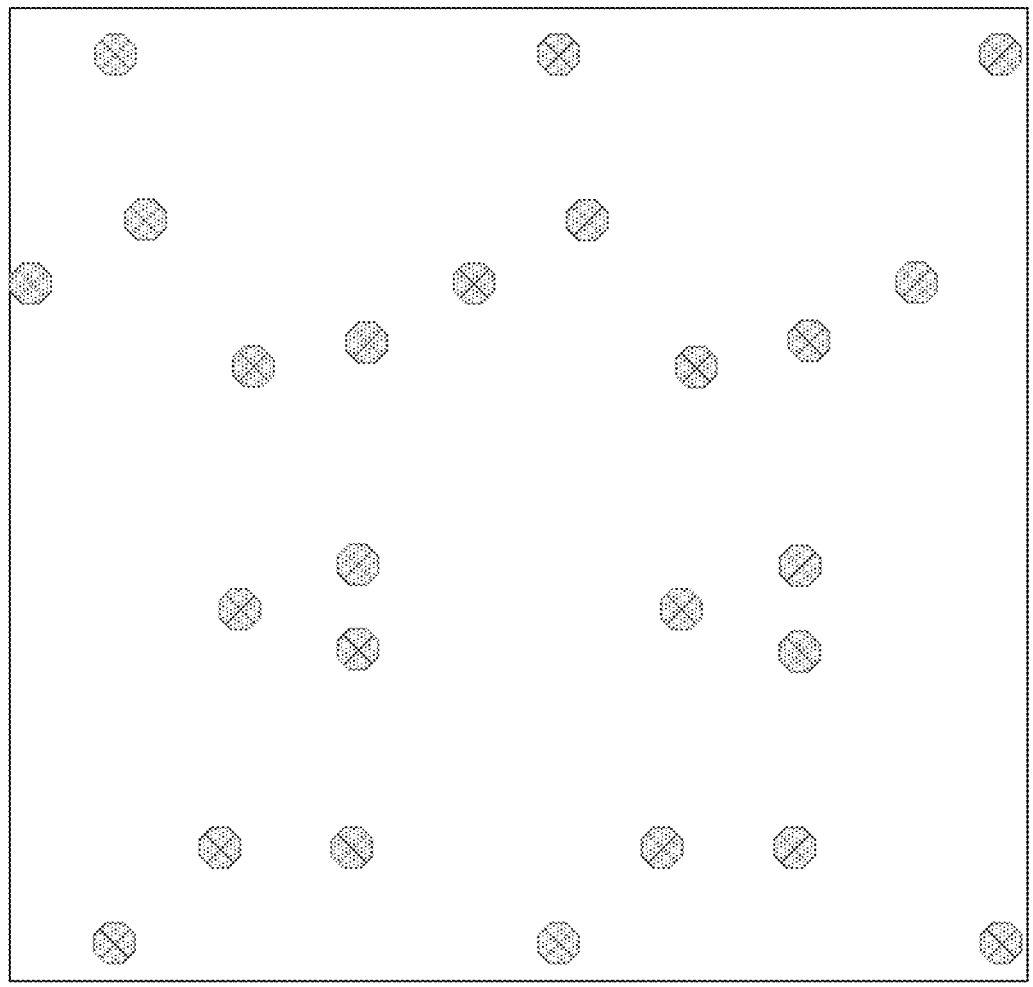
FIG. 3E is a diagram illustrating the structure of an inter-layer dielectric layer in an array substrate depicted in FIG. 3A.
Figure 3F:
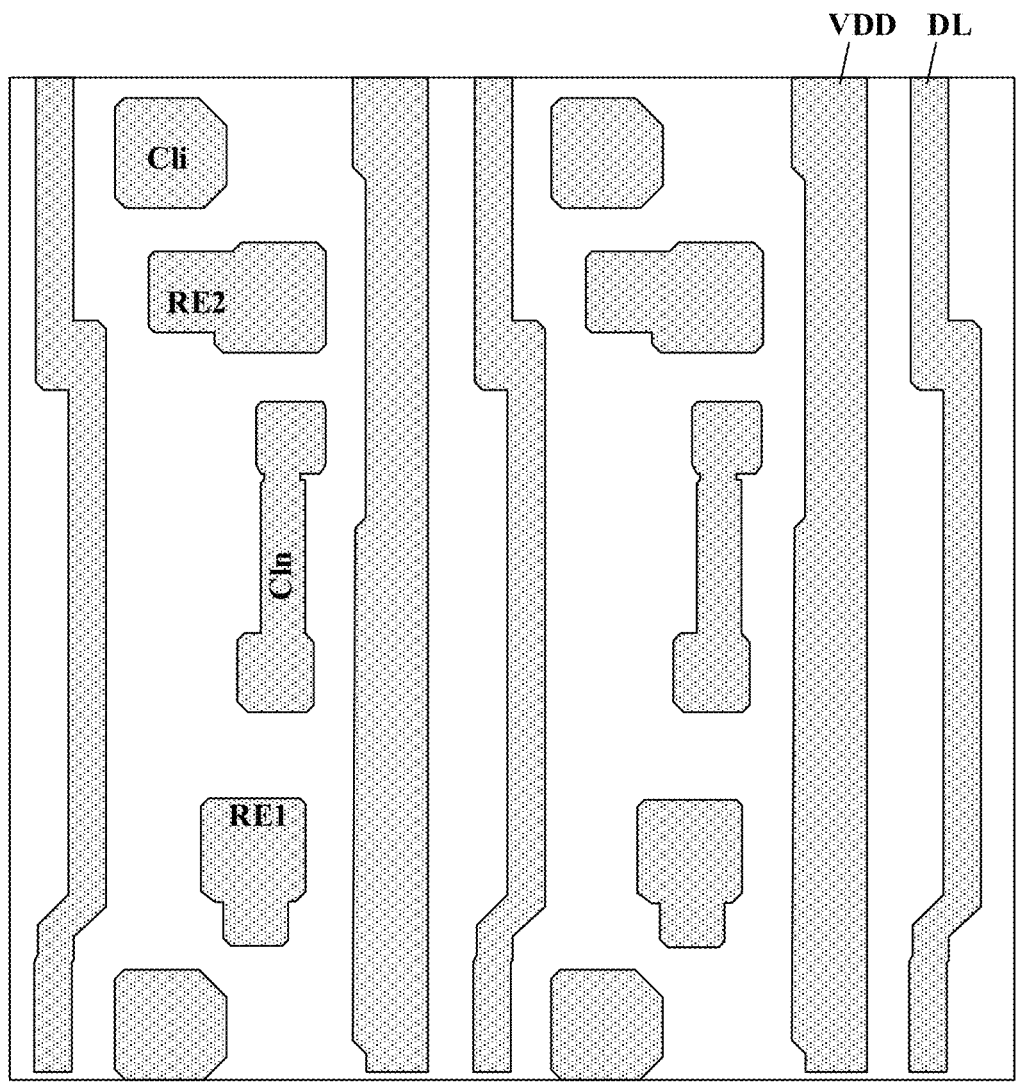
FIG. 3F is a diagram illustrating the structure of a first signal line layer in an array substrate depicted in FIG. 3A.
Figure 3G:
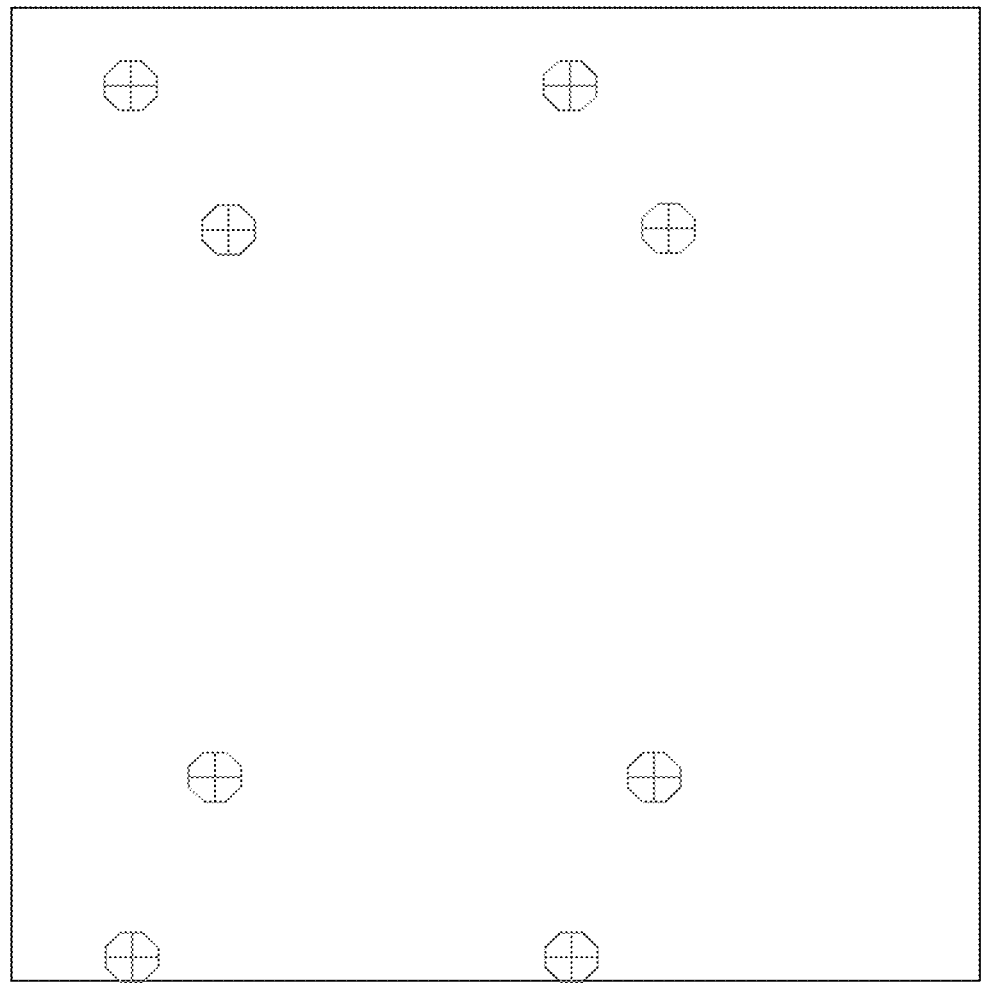
FIG. 3G is a diagram illustrating the structure of a passivation layer in an array substrate depicted in FIG. 3A.
Figure 3H:
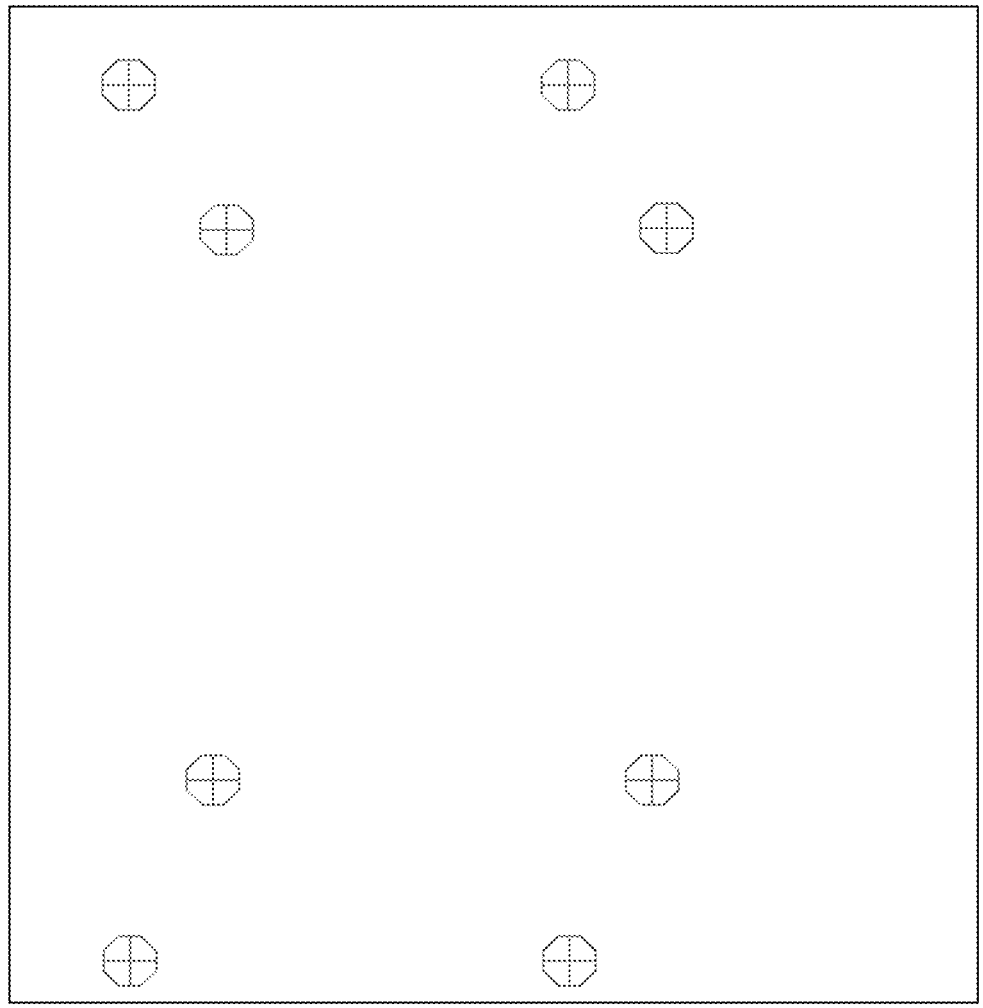
FIG. 3H is a diagram illustrating the structure of a first planarization layer in an array substrate depicted in FIG. 3A.
Figure 3I:
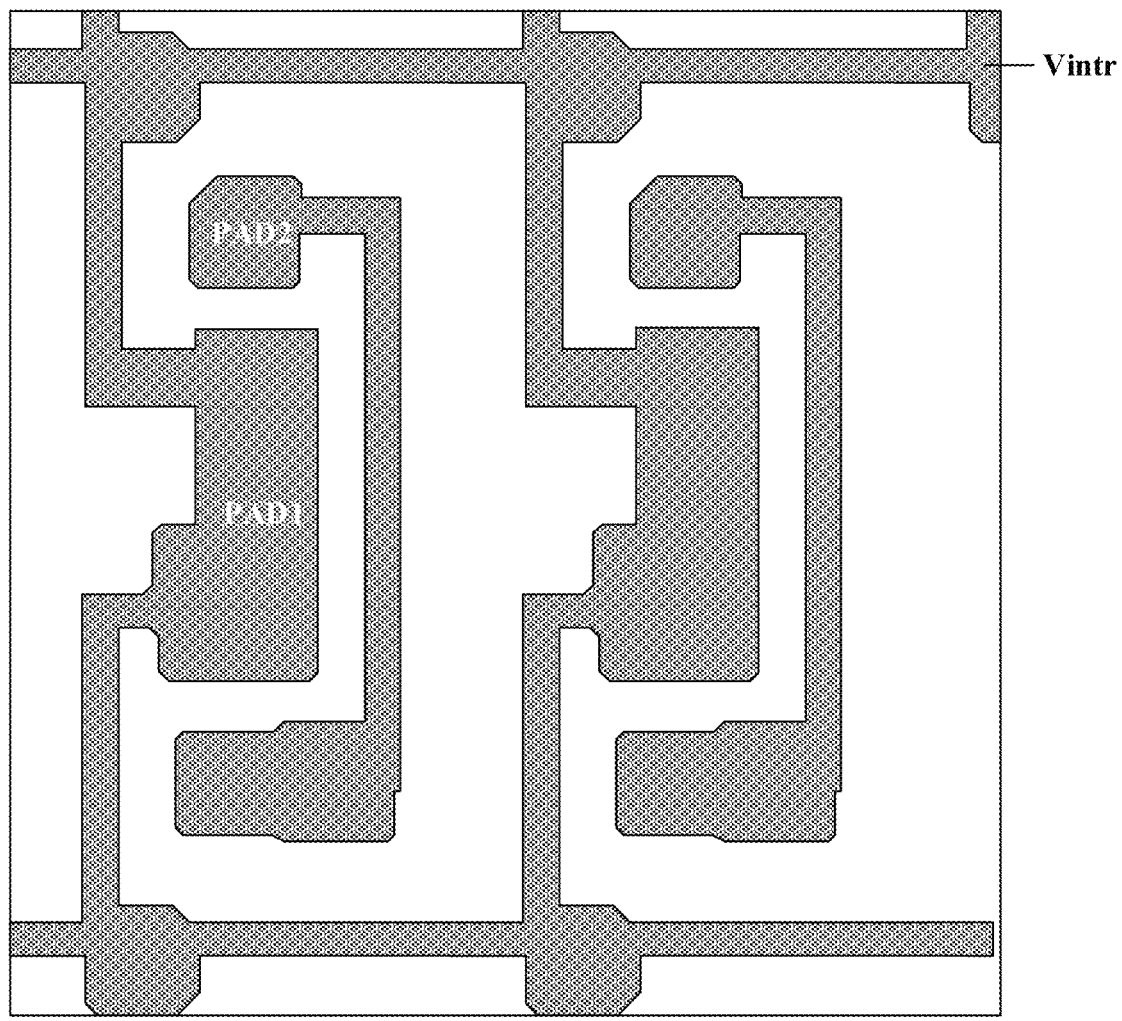
FIG. 3I is a diagram illustrating the structure of a second signal line layer in an array substrate depicted in FIG. 3A.
Figure 3J:
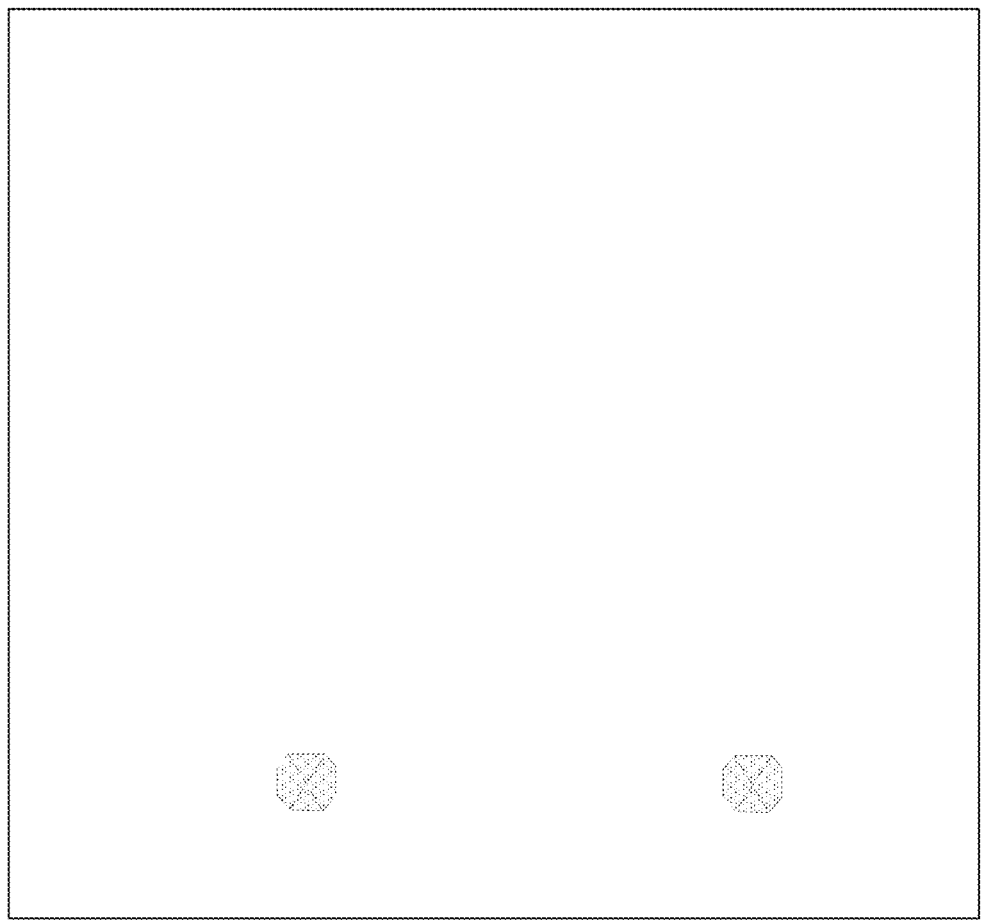
FIG. 3J is a diagram illustrating the structure of a second planarization layer in an array substrate depicted in FIG. 3A.
Figure 4A:
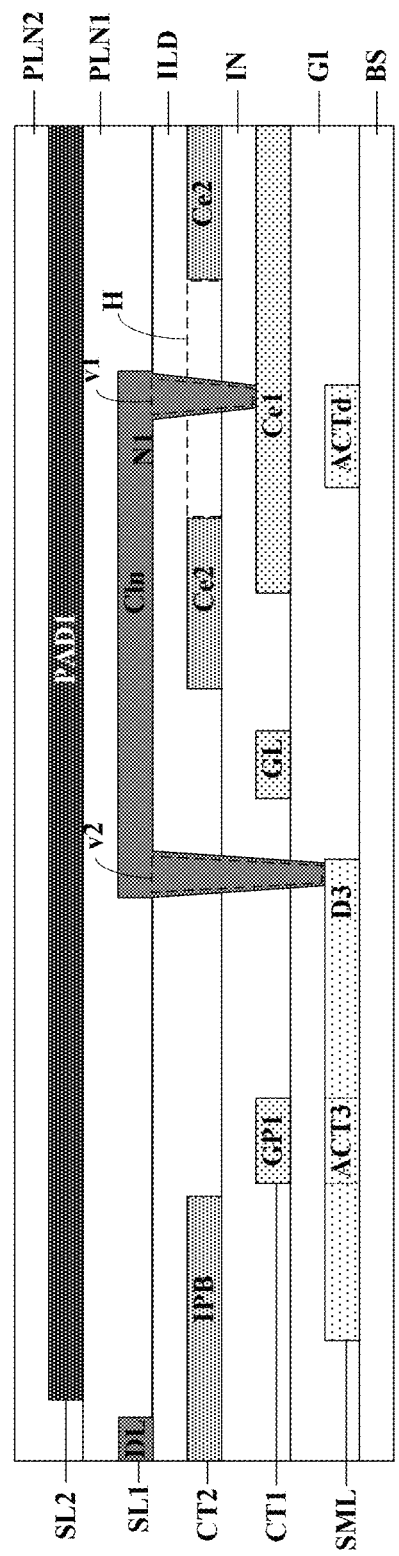
FIG. 4A is a cross-sectional view along an A-A' line in FIG. 3A.
Figure 4B:
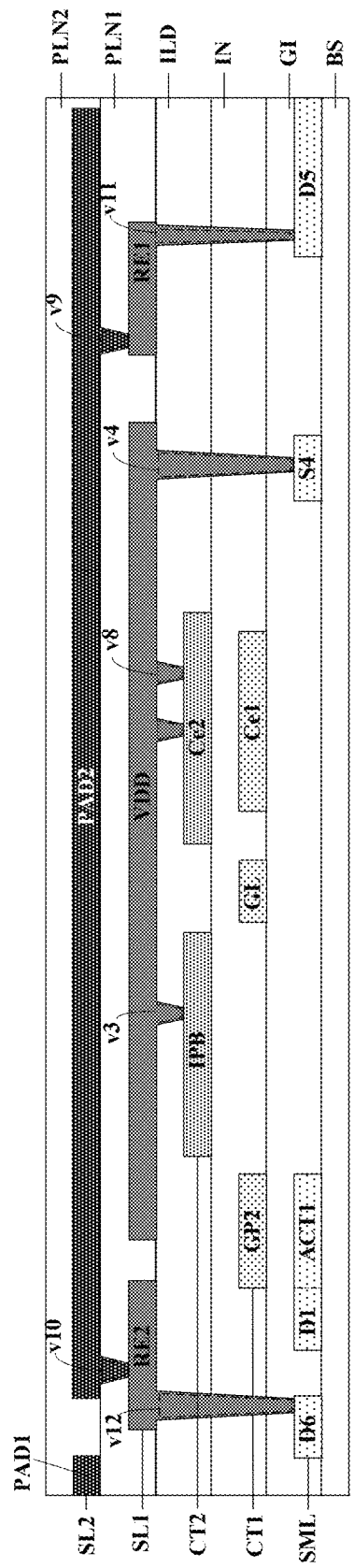
FIG. 4B is a cross-sectional view along a B-B' line in FIG. 3A.
Figure 4C:
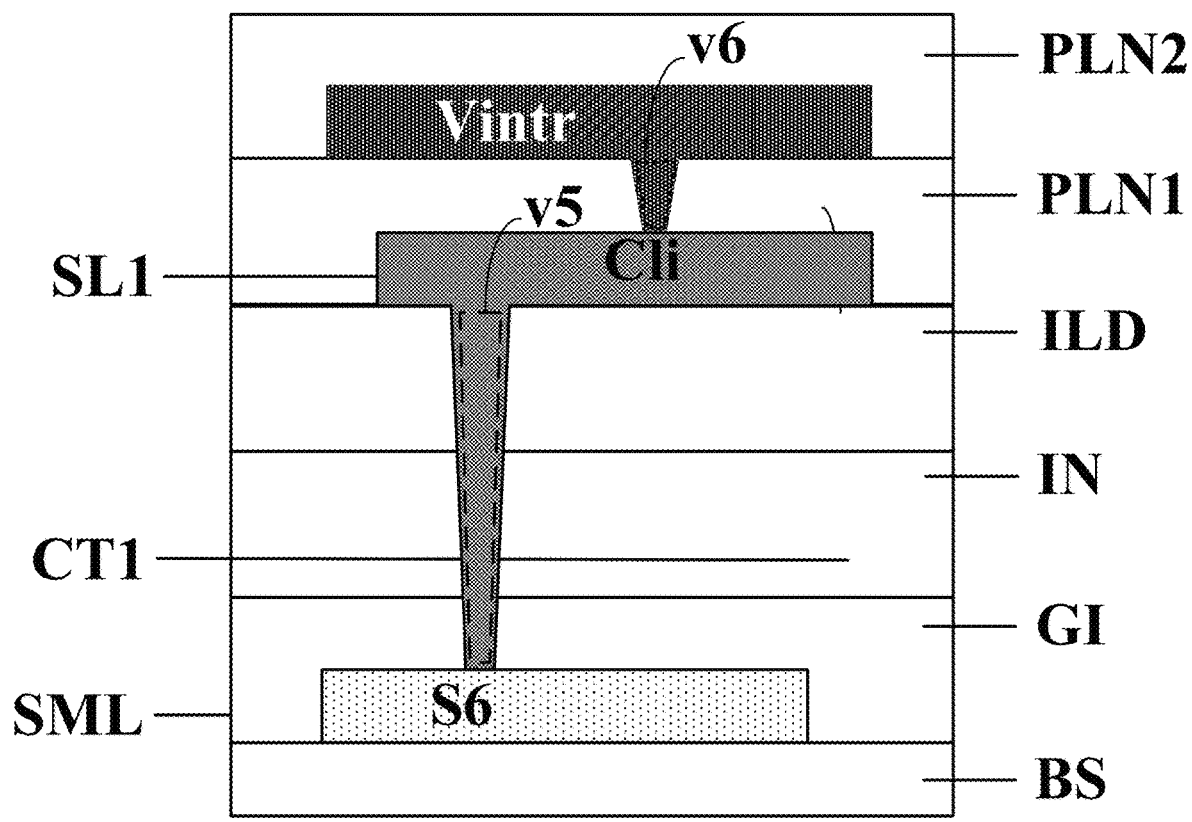
FIG. 4C is a cross-sectional view along a C-C' line in FIG. 3A.
Figure 4D:
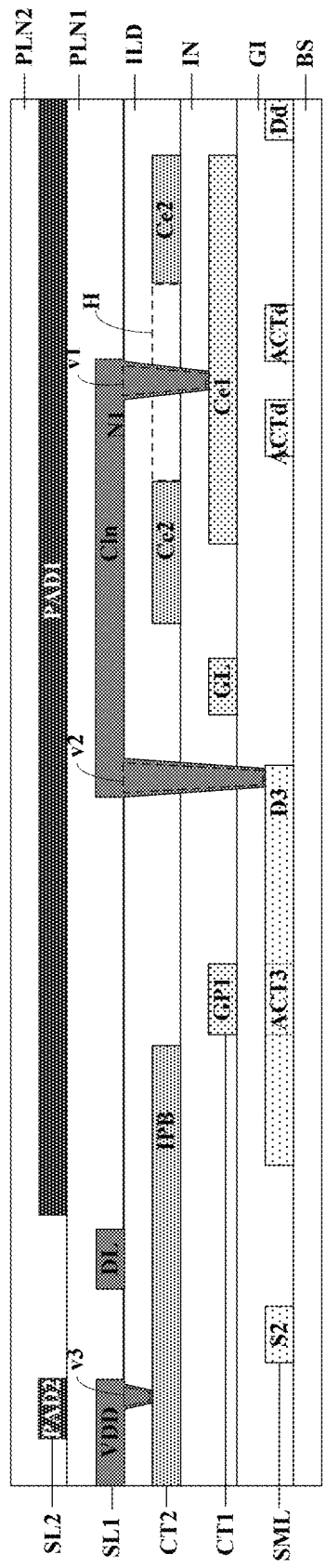
FIG. 4D is a cross-sectional view along a D-D' line in FIG. 3A.

FIG. 3A is a diagram illustrating the structure of an array substrate in some embodiments according to the present disclosure. FIG. 3B is a diagram illustrating the structure of a semiconductor material layer in an array substrate depicted in FIG. 3A. FIG. 3C is a diagram illustrating the structure of a first conductive layer in an array substrate depicted in FIG. 3A. FIG. 3D is a diagram illustrating the structure of a second conductive layer in an array substrate depicted in FIG. 3A. FIG. 3E is a diagram illustrating the structure of an inter-layer dielectric layer in an array substrate depicted in FIG. 3A. FIG. 3F is a diagram illustrating the structure of a first signal line layer in an array substrate depicted in FIG. 3A. FIG. 3G is a diagram illustrating the structure of a passivation layer in an array substrate depicted in FIG. 3A. FIG. 3H is a diagram illustrating the structure of a first planarization layer in an array substrate depicted in FIG. 3A. FIG. 3I is a diagram illustrating the structure of a second signal line layer in an array substrate depicted in FIG. 3A. FIG. 3J is a diagram illustrating the structure of a second planarization layer in an array substrate depicted in FIG. 3A. FIG. 4A is a cross-sectional view along an A-A' line in FIG. 3A. FIG. 4B is a cross-sectional view along a B-B' line in FIG. 3A. FIG. 4C is a cross-sectional view along a C-C' line in FIG. 3A. FIG. 4D is a cross-sectional view along a D-D' line in FIG. 3A.

Referring to FIG. 3A to FIG. 3J, and FIG. 4A to FIG. 4D, in some embodiments, the array substrate includes a base substrate BS, a semiconductor material layer SML on the base substrate BS, a gate insulating layer G1 on a side of the semiconductor material layer SML away from the base substrate BS, a first conductive layer CT1 on a side of the gate insulating layer G1 away from the semiconductor material layer SML, an insulating layer IN on a side of the first conductive layer away from the gate insulating layer G1, a second conductive layer CT2 on a side of the insulating layer IN away from the first conductive layer CT1, an inter-layer dielectric layer ILD on a side of the second conductive layer CT2 away from the insulating layer IN, a first signal line layer SL1 on a side of the inter-layer dielectric layer ILD away from the second conductive layer CT2, a first planarization layer PLN1 on a side of the first signal line layer SL1 away from the inter-layer dielectric layer ILD, a second signal line layer SL2 on a side of the first planarization layer PLN1 away from the first signal line layer SL1, and a second planarization layer PLN2 on a side of the second signal line layer SL2 away from the first planarization layer PLN1. Various appropriate semiconductor materials may be used for making the semiconductor material layer SML. Examples of appropriate semiconductor materials for making the semiconductor material layer SML include polycrystalline silicon, amorphous silicon, and metal oxides.

Referring to FIG. 2A, FIG. 2B, FIG. 3A, and FIG. 3B, a respective pixel driving circuit is annotated with labels indicating regions corresponding to the plurality of transistors in the respective pixel driving circuit, including the first transistor T1, the second transistor T2, the third transistor T3, the fourth transistor T4, the fifth transistor T5, the sixth transistor T6, and the driving transistor Td. The respective pixel driving circuit is further annotated with labels indicating components of each of the plurality of transistors in the pixel driving circuit. For example, the first transistor T1 includes an active layer ACT1, a source electrode S1, and a drain electrode D1. The second transistor T2 includes an active layer ACT2, a source electrode S2, and a drain electrode D2. The third transistor T3 includes an active layer ACT3, a source electrode S3, and a drain electrode D3. The fourth transistor T4 includes an active layer ACT4, a source electrode S4, and a drain electrode D4. The fifth transistor T5 includes an active layer ACT5, a source electrode S5, and a drain electrode D5. The sixth transistor T6 includes an active layer ACT6, a source electrode S6, and a drain electrode D6. The driving transistor Td includes an active layer ACTd, a source electrode Sd, and a drain electrode Dd.

In some embodiments, the active layers (ACT1, ACT2, ACT3, ACT4, ACT5, ACT6, and ACTd) of the transistors (T1, T2, T3, T4, T5, T6, and Td) in the respective pixel driving circuit are in a same layer. Optionally, the active layers (ACT1, ACT2, ACT3, ACT4, ACT5, ACT6, and ACTd), at least portions of the source electrodes (S1, S2, S3, S4, S5, S6, and Sd), and at least portions of the drain electrodes (D1, D2, D3, D4, D5, D6, and Dd) of the transistors (T1, T2, T3, T4, T5, T6, and Td) in the respective pixel driving circuit are in a same layer. Optionally, the active layers (ACT1, ACT2, ACT3, ACT4, ACT5, ACT6, and ACTd), the source electrodes (S1, S2, S3, S4, S5, S6, and Sd), and the drain electrodes (D1, D2, D3, D4, D5, D6, and Dd) of the transistors (T1, T2, T3, T4, T5, T6, and Td) in the respective pixel driving circuit are in a same layer.

In some embodiments, the active layers ACT1, ACT2, ACT3, ACT4, ACT5, ACT6, and ACTd of the transistors T1, T2, T3, T4, T5, T6, and Td in the respective pixel driving circuit are parts of a first unitary structure. In another example, the active layers ACT1, ACT2, ACT3, ACT4, ACT5, ACT6, and ACTd, the source electrodes S1, S2, S3, S4, S5, S6, and Sd, and the drain electrodes D1, D2, D3, D4, D5, D6, and Dd, of the transistors T1, T2, T3, T4, T5, T6, and Td in the respective pixel driving circuit are parts of a first unitary structure.

As used herein, the active layer refers to a component of the transistor comprising at least a portion of the semiconductor material layer whose orthographic projection on the base substrate overlaps with an orthographic projection of a gate electrode on the base substrate. As used herein, a source electrode refers to a component of the transistor connected to one side of the active layer, and a drain electrode refers to a component of the transistor connected to another side of the active layer. In the context of a double-gate type transistor (for example, the third transistor T3), the active layer refers to a component of the transistor comprising a first portion of the semiconductor material layer whose orthographic projection on the base substrate overlaps with an orthographic projection of a first gate on the base substrate, a second portion of the semiconductor material layer whose orthographic projection on the base substrate overlaps with an orthographic projection of a second gate on the base substrate, and a third portion between the first portion and the second portion. In the context of a double-gate type transistor, a source electrode refers to a component of the transistor connected to a side of the first portion distal to the third portion, and a drain electrode refers to a component of the transistor connected to a side of the second portion distal to the third portion.

In some embodiments, the semiconductor material layer further includes a plurality of reset signal transmission lines vtl. A respective reset signal transmission line of the plurality of reset signal transmission lines vtl connects the source electrodes of the first transistor T1 and the sixth transistor T6 together. In one example, as shown in FIG. 3B, the respective reset signal transmission line connects the source electrodes of all first transistors and all sixth transistors in a row of pixel driving circuit together. The respective reset signal transmission line extends along a first direction DR1.

Referring to FIG. 2A, FIG. 2B, FIG. 3A, and FIG. 3C, the first conductive layer in some embodiments includes a plurality of gate lines GL, a plurality of reset control signal lines rst, a plurality of light emitting control signal lines em, and a first capacitor electrode Ce1 of the storage capacitor Cst. Various appropriate electrode materials and various appropriate fabricating methods may be used to make the first conductive layer. For example, a conductive material may be deposited on the substrate by a plasma-enhanced chemical vapor deposition (PECVD) process and patterned. Examples of appropriate conductive materials for making the first conductive layer include, but are not limited to, aluminum, copper, molybdenum, chromium, aluminum copper alloy, copper molybdenum alloy, molybdenum aluminum alloy, aluminum chromium alloy, copper chromium alloy, molybdenum chromium alloy, copper molybdenum aluminum alloy, and the like.

Optionally, the plurality of gate lines GL, the plurality of reset control signal lines rst, the plurality of light emitting control signal lines em, and the first capacitor electrode Ce1 are in a same layer.

As used herein, the term "same layer" refers to the relationship between the layers simultaneously formed in the same step. In one example, the plurality of gate lines GL and the first capacitor electrode Ce1 are in a same layer when they are formed as a result of one or more steps of a same patterning process performed in a same layer of material. In another example, the plurality of gate lines GL and the first capacitor electrode Ce1 can be formed in a same layer by simultaneously performing the step of forming the plurality of gate lines GL, and the step of forming the first capacitor electrode Ce1. The term "same layer" does not always mean that the thickness of the layer or the height of the layer in a cross-sectional view is the same.

In some embodiments, in a respective pixel driving circuit, a respective gate line of the plurality of gate lines GL includes a first main portion MP1 extending along an extension direction of the respective gate line, and a first gate protrusion GP1 protruding away from the first main portion MP1, e.g., along a direction from the respective gate line of the plurality of gate lines GL in the respective pixel driving circuit toward the respective reset control signal line of the plurality of reset control signal lines rst in the respective pixel driving circuit.

In some embodiments, as discussed above, the third transistor T3 is a double gate transistor. In some embodiments, the first gate protrusion GP1 is one of the double gates G3 in the third transistor T3. In some embodiments, and referring to FIG. 4A, an orthographic projection of the first gate protrusion GP1 on the base substrate BS at least partially overlaps with an orthographic projection of the active layer ACT3 of the third transistor T3 on the base substrate BS.

In some embodiments, in a respective pixel driving circuit, a respective reset control signal line of the plurality of reset control signal lines rst includes a second main portion MP2 extending along an extension direction of the respective reset control signal line, and a second gate protrusion GP2 protruding away from the second main portion MP2, e.g., along a direction from the respective reset control signal line of the plurality of reset control signal lines rst in the respective pixel driving circuit toward the respective gate line of the plurality of gate lines GL in the respective pixel driving circuit.

In some embodiments, as discussed above, the first transistor T1 is a double gate transistor. In some embodiments, the second gate protrusion GP2 is one of the double gates G1 in the first transistor T1. In some embodiments, and referring to FIG. 4B, an orthographic projection of the second gate protrusion GP2 on the base substrate BS at least partially overlaps with an orthographic projection of the active layer ACT1 of the first transistor T1 on the base substrate BS.

Referring to FIG. 2A, FIG. 2B, FIG. 3A, and FIG. 3D, the second conductive layer in some embodiments includes an interference preventing block IPB and a second capacitor electrode Ce2 of the storage capacitor Cst. The interference preventing block IPB can effectively reduce crosstalk, particularly vertical crosstalk between the N1 node of the adjacent data lines. Various appropriate conductive materials and various appropriate fabricating methods may be used to make the second conductive layer. For example, a conductive material may be deposited on the substrate by a plasma-enhanced chemical vapor deposition (PECVD) process and patterned. Examples of appropriate conductive materials for making the second conductive layer include, but are not limited to, aluminum, copper, molybdenum, chromium, aluminum copper alloy, copper molybdenum alloy, molybdenum aluminum alloy, aluminum chromium alloy, copper chromium alloy, molybdenum chromium alloy, copper molybdenum aluminum alloy, and the like. Optionally, the second capacitor electrode Ce2 and the interference preventing block IPB are in a same layer.

Vias extending through the inter-layer dielectric layer ILD are depicted in FIG. 3E.

Referring to FIG. 2A, FIG. 2B, FIG. 3A, and FIG. 3F, the first signal line layer in some embodiments includes a plurality of voltage supply lines Vdd, a node connecting line Cln, an initialization connecting line Cli, a first relay electrode RE1, a second relay electrode RE2, and a plurality of data lines DL. The node connecting line Cln connects the first capacitor electrode Ce1 and the drain electrode of the third transistor T3 in a respective pixel driving circuit together. Various appropriate conductive materials and various appropriate fabricating methods may be used to make the first signal line layer. For example, a conductive material may be deposited on the substrate by a plasma-enhanced chemical vapor deposition (PECVD) process and patterned. Examples of appropriate conductive materials for making the first signal line layer include, but are not limited to, aluminum, copper, molybdenum, chromium, aluminum copper alloy, copper molybdenum alloy, molybdenum aluminum alloy, aluminum chromium alloy, copper chromium alloy, molybdenum chromium alloy, copper molybdenum aluminum alloy, and the like. Optionally, the plurality of voltage supply lines Vdd, the node connecting line Cln, the initialization connecting line Cli, the first relay electrode RE1, the second relay electrode RE2, and the plurality of data lines DL are in a same layer.

Vias extending through the passivation layer PVX are depicted in FIG. 3G.

Vias extending through the first planarization layer PLN1 are depicted in FIG. 3H.

Referring to Referring to FIG. 2A, FIG. 2B, FIG. 3A, and FIG. 3I, the second signal line layer in some embodiments includes a plurality of first reset signal lines Vintr, and a first pad PAD1 and a second pad PAD2 in a respective pixel driving circuit. Various appropriate conductive materials and various appropriate fabricating methods may be used to make the second signal line layer. For example, a conductive material may be deposited on the substrate by a plasma-enhanced chemical vapor deposition (PECVD) process and patterned. Examples of appropriate conductive materials for making the second signal line layer include, but are not limited to, aluminum, copper, molybdenum, chromium, aluminum copper alloy, copper molybdenum alloy, molybdenum aluminum alloy, aluminum chromium alloy, copper chromium alloy, molybdenum chromium alloy, copper molybdenum aluminum alloy, and the like. Optionally, the plurality of first reset signal lines Vintr, the first pad PAD1, and the second PAD2 are in a same layer.

The first pad PAD1 is configured to ensure that first nodes respectively in different pixel driving circuits are situated in a similar environment. As shown in FIG. 2A and FIG. 2B, the first node N1 is connected to the gate electrode of the driving transistor Td, the drain electrode of the first transistor T1, the drain electrode of the third transistor T3, and the first capacitor electrode Ce1 of the storage capacitor Cst.

The inventors of the present disclosure discover that the first nodes respectively in different pixel driving circuits in a related display panel typically are often situated in different environments, due to the layout in the related display panel such as the anode layout in the related display panel. In particular, in a gate-on-array in panel (GOP) type display panel, the issue is more severe. In the related GOP type display panel, first nodes respectively in different pixel driving circuits are typically in environments having different anode layouts. The inventors of the present disclosure discover that, by having the first pads respectively in the pixel driving circuits, the first nodes respectively underneath the first pads can be situated in a highly similar environment. Surprisingly and unexpectedly, the unique structure of the present array substrate significantly enhances display uniformity.

Referring to FIG. 3A and FIG. 3I, the first pad PAD1 is connected to two adjacent first reset signal lines of the plurality of first reset signal lines Vintr. In one example, the first pad PAD1 is connected to two adjacent first reset signal lines in two rows of pixel driving circuits, respectively.

Referring to FIG. 3A and FIG. 3I, in some embodiments, first pads respectively in the pixel driving circuits and the plurality of first reset signal lines Vintr form an interconnected first reset signal network.

The second pad PAD2 is configured to provide a parasitic capacitance at the fourth node N4. As shown in FIG. 2A and FIG. 2B, the fourth node N4 is connected to the drain electrode of the fifth transistor T5, the drain electrode of the sixth transistor T6, and the anode of the light emitting element LE. The second pad PAD2 is connected to the drain electrode of the fifth transistor T5, the drain electrode of the sixth transistor T6, and the anode of the light emitting element LE.

Vias extending through the second planarization layer PLN2 are depicted in FIG. 3J.

Referring to FIG. 2A, FIG. 2B, FIG. 3A, FIG. 3C, FIG. 3D, and FIG. 4A, in some embodiments, an orthographic projection of the second capacitor electrode Ce2 on a base substrate BS completely covers, with a margin, an orthographic projection of the first capacitor electrode Ce1 on the base substrate BS except for a hole region H in which a portion of the second capacitor electrode Ce2 is absent. In some embodiments, the first signal line layer includes a node connecting line Cln on a side of the inter-layer dielectric layer ILD away from the second capacitor electrode Ce2. The node connecting line Cln is in a same layer as the plurality of voltage supply lines Vdd. Optionally, the array substrate further includes a first via v1 in the hole region H and extending through the inter-layer dielectric layer ILD and the insulating layer IN. Optionally, the node connecting line Cln is connected to the first capacitor electrode Ce1 through the first via v1. In some embodiments, the second capacitor electrode Ce2 is on a side of the gate insulating layer IN away from the base substrate BS. Optionally, the array substrate further includes a first via v1 and a second via v2. The first via v1 is in the hole region H and extends through the inter-layer dielectric layer ILD and the insulating layer IN. The second via v2 extends through the inter-layer dielectric layer ILD, the insulating layer IN, and the gate insulating layer G1. Optionally, the node connecting line Cln is connected to the first capacitor electrode Ce1 through the first via v1, and is connected to the semiconductor material layer SML through the second via v2. Optionally, the node connecting line Cln is connected to the drain electrode D3 of third transistor, as depicted in FIG. 4A.

Referring to Referring to FIG. 2A, FIG. 2B, FIG. 3A, FIG. 3D, FIG. 4B, and FIG. 4D, in some embodiments, the interference preventing block IPB is in a same layer as the second capacitor electrode Ce2. A respective voltage supply line of the plurality of voltage supply lines Vdd is connected to the interference preventing block IPB through a third via v3. Optionally, the third via v3 extends through the inter-layer dielectric layer ILD. Optionally, an orthographic projection of the interference preventing block IPB on the base substrate BS partially overlaps with an orthographic projection of the respective voltage supply line of the plurality of voltage supply lines Vdd on the base substrate BS.

Referring to FIG. 2A, FIG. 2B, FIG. 3A, FIG. 3F, and FIG. 4C, the initialization connecting line Cli is connected to the source electrode S6 of the sixth transistor T6 through a fifth via v5 extending through the inter-layer dielectric layer ILD, the insulating layer IN, and the gate insulating layer G1. A respective first reset signal line of the plurality of first reset signal lines Vintr is connected to the initialization connecting line Cli through a sixth via v6 extending through the first planarization layer PLN1. An initialization signal is provided to the source electrode S6 of the sixth transistor T6 from the respective first reset signal line through the initialization connecting line Cli.

Referring to FIG. 4B, a respective voltage supply line of the plurality of voltage supply lines Vdd is connected to the second capacitor electrode Ce2 through an eighth via v8 extending through the inter-layer dielectric layer ILD. Referring to FIG. 4B, in some embodiments, an orthographic projection of the respective voltage supply line on the base substrate BS at least partially overlaps with an orthographic projection of the second pad PAD2 on the base substrate BS.

Figure 5A:
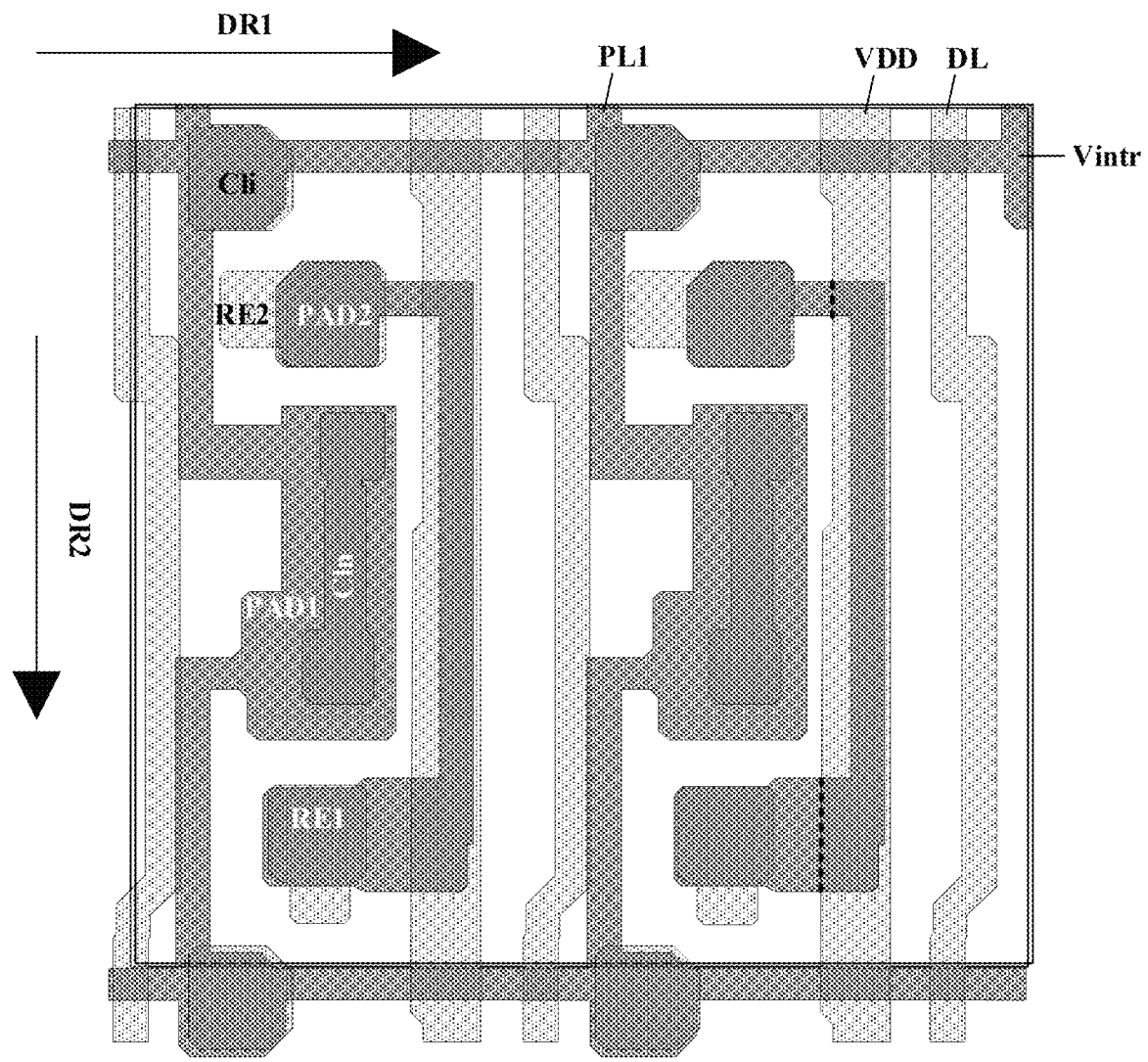
FIG. 5A illustrates the structure of a first signal line layer and a second signal line layer in some embodiments according to the present disclosure.

FIG. 5A illustrates the structure of a first signal line layer and a second signal line layer in some embodiments according to the present disclosure. As shown in FIG. 4A, FIG. 4D, and FIG. 5A, in some embodiments, an orthographic projection of the first pad PAD1 in a respective pixel driving circuit on the base substrate BS covers at least 50% (e.g., at least 55%, at least 60%, at least 65%, at least 70%, at least 75%, at least 80%, at least 85%, at least 90%, at least 95%, at least 99%, or 100%) of an orthographic projection of the node connecting line Cln in the respective pixel driving circuit on the base substrate BS. In some embodiments, the orthographic projection of the first pad PAD1 in the respective pixel driving circuit on the base substrate BS at least partially overlaps with an orthographic projection of the active layer ACT3 of the third transistor T3 on the base substrate BS. In some embodiments, the orthographic projection of the first pad PAD1 in the respective pixel driving circuit on the base substrate BS covers at least 50% (e.g., at least 55%, at least 60%, at least 65%, at least 70%, at least 75%, at least 80%, at least 85%, at least 90%, at least 95%, at least 99%, or 100%) of an orthographic projection of the first gate protrusion GP1 of a respective gate line of the plurality of gate lines GL on the base substrate BS. As discussed above, the inventors of the present disclosure discover that by having the first pads respectively in the pixel driving circuits, the first nodes (including the node connecting line Cln) respectively underneath the first pads can be situated in a highly similar environment, resulting in significantly improved display uniformity.

In some embodiments, the respective pixel driving circuit in the array substrate further includes a voltage line configured to output a constant voltage signal, and a voltage connecting line VCL electrically connecting the first pad PAD1 with the voltage line. In FIG. 3A to FIG. 3J, a respective first reset signal line of a plurality of first reset signal lines Vintr may be considered as the voltage line configured to output a constant reset voltage signal. The voltage line is electrically connected to a source electrode of the sixth transistor. For example, as shown in FIG. 2A and FIG. 2B, a source electrode of the sixth transistor T6 is electrically connected to the respective one of the plurality of first reset signal lines Vintr (e.g., the voltage line).

In some embodiments, a combination of the voltage connecting line VCL and the first pad PAD1 electrically connects the plurality of first reset signal lines Vintr together, forming a reset signal line network. The first pad PAD1 and a portion of the voltage connecting line VCL form an open loop.

In some embodiments, the respective pixel driving circuit includes a driving transistor Td and a compensation transistor (e.g., the third transistor T3) configured to provide a compensation voltage signal to a gate electrode of the driving transistor. The compensation transistor includes a source electrode, a drain electrode and a gate electrode. The node connecting line Cln connects the gate electrode of the driving transistor Td and a drain electrode of the compensation transistor (e.g., D3 of the third transistor T3).

Referring to FIG. 3A to FIG. 3J, in some embodiments, an orthographic projection of the voltage line and the voltage connecting line VCL on the base substrate is spaced apart from the orthographic projection of the node connecting line Cln on the base substrate. An orthographic projection of the first pad PAD1 on a base substrate at least partially overlaps with an orthographic projection of the node connecting line Cln on the base substrate. The orthographic projection of the first pad PAD1 on the base substrate at least partially overlaps with an orthographic projection of an active layer of the compensation transistor (e.g., the third transistor T3) on the base substrate, see, e.g., FIG. 4A depicts that the orthographic projection of the first pad PAD1 on the base substrate BS at least partially overlaps with an orthographic projection of the active layer ACT3 of the third transistor (compensation transistor) on the base substrate BS.

Referring to FIG. 3A to FIG. 3J, in some embodiments, the node connecting line Cln has a length along a first direction DR1 less than a length along a second direction DR2. The voltage line (e.g., each of the plurality of first reset signal lines Vintr) has a length along the first direction DR1 less than a length along the second direction DR2. The first direction DR1 and the second direction DR2 cross over each other. In some embodiments, a length of the second pad PAD2 along the first direction DR1 is greater than a length of the first pad PAD1 along the first direction DR1; a length of the second pad PAD2 along the second direction DR2 is greater than a length of the first pad PAD1 along the second direction DR2. As shown in FIG. 3I, in some embodiments, the second pad PAD2 at least partially (e.g., at least 30%, at least 35%, at least 40%, at least 45%, at least 50%, at least 55%, at least 60%, at least 65%, or at least 70%) surrounds the first pad PAD1.

FIG. 5B illustrates the structure of a first pad in some embodiments according to the present disclosure. Referring to FIG. 5A and FIG. 5B, the first pad in some embodiments includes a first-first pad part P1-1, a second-first pad part P1-2, and a third-first pad part P1-3. The second-first pad part P1-2 connects the first-first pad part P1-1 to the third-first pad part P1-3. The first-first pad part P1-1 is connected to a first adjacent first reset signal line of the plurality of first reset signal lines Vintr. The third-first pad part P1-3 is connected to a second adjacent first reset signal line of the plurality of first reset signal lines Vintr.

In one example, the first-first pad part P1-1 has a L shape. In another example, the second-first pad part P1-2 has a L shape. In another example, the third-first pad part P1-3 has a L shape.

Referring to FIG. 3A, FIG. 4D, FIG. 5A, and FIG. 5B, in some embodiments, an orthographic projection of the second-first pad part P1-2 on the base substrate BS at least partially overlaps with an orthographic projection of the node connecting line Cln in the respective pixel driving circuit on the base substrate BS.

Referring to FIG. 3A, FIG. 4D, FIG. 5A, and FIG. 5B, in some embodiments, an orthographic projection of the first-first pad part P1-1 on the base substrate BS at least partially overlaps with an orthographic projection of the first gate protrusion GP1 of the respective gate line of the plurality of gate lines GL in the respective pixel driving circuit on the base substrate BS.

Referring to FIG. 3A, FIG. 4D, FIG. 5A, and FIG. 5B, in some embodiments, an orthographic projection of the third-first pad part P1-3 on the base substrate BS at least partially overlaps with an orthographic projection of the active layer ACT5 of the fifth transistor T5 on the base substrate BS. Optionally, the orthographic projection of the third-first pad part P1-3 on the base substrate BS at least partially overlaps an orthographic projection of the source electrode S5 of the fifth transistor T5 on the base substrate BS. Optionally, the orthographic projection of the third-first pad part P1-3 on the base substrate BS at least partially overlaps an orthographic projection of the drain electrode D5 of the fifth transistor T5 on the base substrate BS. Optionally, the orthographic projection of the third-first pad part P1-3 on the base substrate BS at least partially overlaps an orthographic projection of the drain electrode Dd of the driving transistor Td on the base substrate BS.

Referring to FIG. 5A, in some embodiments, the array substrate includes an interconnected first reset signal network formed by the first pads respectively in the pixel driving circuits and the plurality of first reset signal lines Vintr. The interconnected first reset signal network in the array substrate includes plurality of first reset signal lines Vintr extending along a first direction DR1, respectively; and a plurality of first pad lines PL1 extending along a second direction DR2. A respective first pad line includes a plurality of first pads respectively in a column of pixel driving circuits. A respective first pad line intersects and connects to multiple first reset signal lines of the plurality of first reset signal lines Vintr. A respective first reset signal line intersects and connects to multiple first pad lines of the plurality of first pad lines PL1.

As discussed above, and referring to FIG. 2A, FIG. 2B, FIG. 3A, FIG. 3I, FIG. 4B, FIG. 5A, and FIG. 5B, the second pad PAD2 is configured to provide a parasitic capacitance at the fourth node N4. In one example, the parasitic capacitance at the fourth node N4 is formed between the second pad PAD2 and the respective voltage supply line of the plurality of voltage supply lines Vdd. An orthographic projection of the second pad PAD2 on a base substrate BS at least partially overlaps with an orthographic projection of the respective voltage supply line of the plurality of voltage supply lines Vdd on the base substrate BS. The second pad PAD2 is connected to the drain electrode of the fifth transistor T5, the drain electrode of the sixth transistor T6, and the anode of the light emitting element LE.

In some embodiments, the second pad PAD2 crosses over a respective gate line of the plurality of gate lines GL. Optionally, an orthographic projection of the second pad PAD2 on the base substrate BS at least partially overlaps with an orthographic projection of a respective light emitting control signal line of the plurality of light emitting control signal lines em on the base substrate BS. Optionally, the orthographic projection of the second pad PAD2 on the base substrate BS at least partially overlaps with an orthographic projection of a respective reset control signal line of the plurality of reset control signal lines rst on the base substrate BS.

Referring to FIG. 3A and FIG. 4B, the second pad PAD2 is connected to a first relay electrode RE1 in the first signal line layer SL1 through a ninth via v9 extending through the first planarization layer PLN1, and is connected to a second relay electrode RE2 in the first signal line layer SL1 through a tenth via v10 extending through the first planarization layer PLN1. The first relay electrode RE1 is connected to the drain electrode D5 of the fifth transistor T5 through an eleventh via v11 extending through the inter-layer dielectric layer ILD, the insulating layer IN, and the gate insulating layer G1. The second relay electrode RE2 is connected to the drain electrode D6 of the sixth transistor T6 through a twelfth via v12 extending through the inter-layer dielectric layer ILD, the insulating layer IN, and the gate insulating layer G1. In some embodiments, the array substrate further includes an anode connecting pad, the anode connecting pad being connected to the second pad PAD2 through a via extending through the second planarization layer PLN2. The anode connecting pad is connected to an anode.

In some embodiments, an orthographic projection of the second pad PAD2 in a respective pixel driving circuit on the base substrate BS at least partially overlaps with an orthographic projection of a respective voltage supply line of the plurality of voltage supply lines VDD on the base substrate BS. In some embodiments, the orthographic projection of the second pad PAD2 in the respective pixel driving circuit on the base substrate BS at least partially overlaps with an orthographic projection of the interference preventing block IPB on the base substrate BS. In some embodiments, the orthographic projection of the second pad PAD2 in the respective pixel driving circuit on the base substrate BS at least partially overlaps with an orthographic projection of the second capacitor electrode Ce2 in the respective pixel driving circuit on the base substrate BS. In some embodiments, the orthographic projection of the second pad PAD2 in the respective pixel driving circuit on the base substrate BS at least partially overlaps with an orthographic projection of the first capacitor electrode Ce1 in the respective pixel driving circuit on the base substrate BS.

FIG. 5C illustrates the structure of a second pad in some embodiments according to the present disclosure. Referring to FIG. 5C, the second pad in some embodiments includes a first-second pad part P2-1, a second-second pad part P2-2, and a third-second pad part P2-3. The second-second pad part P2-2 connects the first-second pad part P2-1 to the third-second pad part P2-3. Referring to FIG. 3A, FIG. 4B, and FIG. 5C, the third-second pad part P2-3 is connected to the first relay electrode RE1; the first-second pad part P2-1 is connected to the second relay electrode RE2. The first-first pad part P1-1 is connected to a first adjacent first reset signal line of the plurality of first reset signal lines Vintr. The third-first pad part P1-3 is connected to a second adjacent first reset signal line of the plurality of first reset signal lines Vintr. An orthographic projection of the second-second pad part P2-2 on the base substrate BS at least partially overlaps with the orthographic projection of the respective voltage supply line of the plurality of voltage supply lines VDD on the base substrate BS. In one example, the orthographic projection of the respective voltage supply line of the plurality of voltage supply lines VDD on the base substrate BS covers the orthographic projection of the second-second pad part P2-2 on the base substrate BS.

Figure 6A:
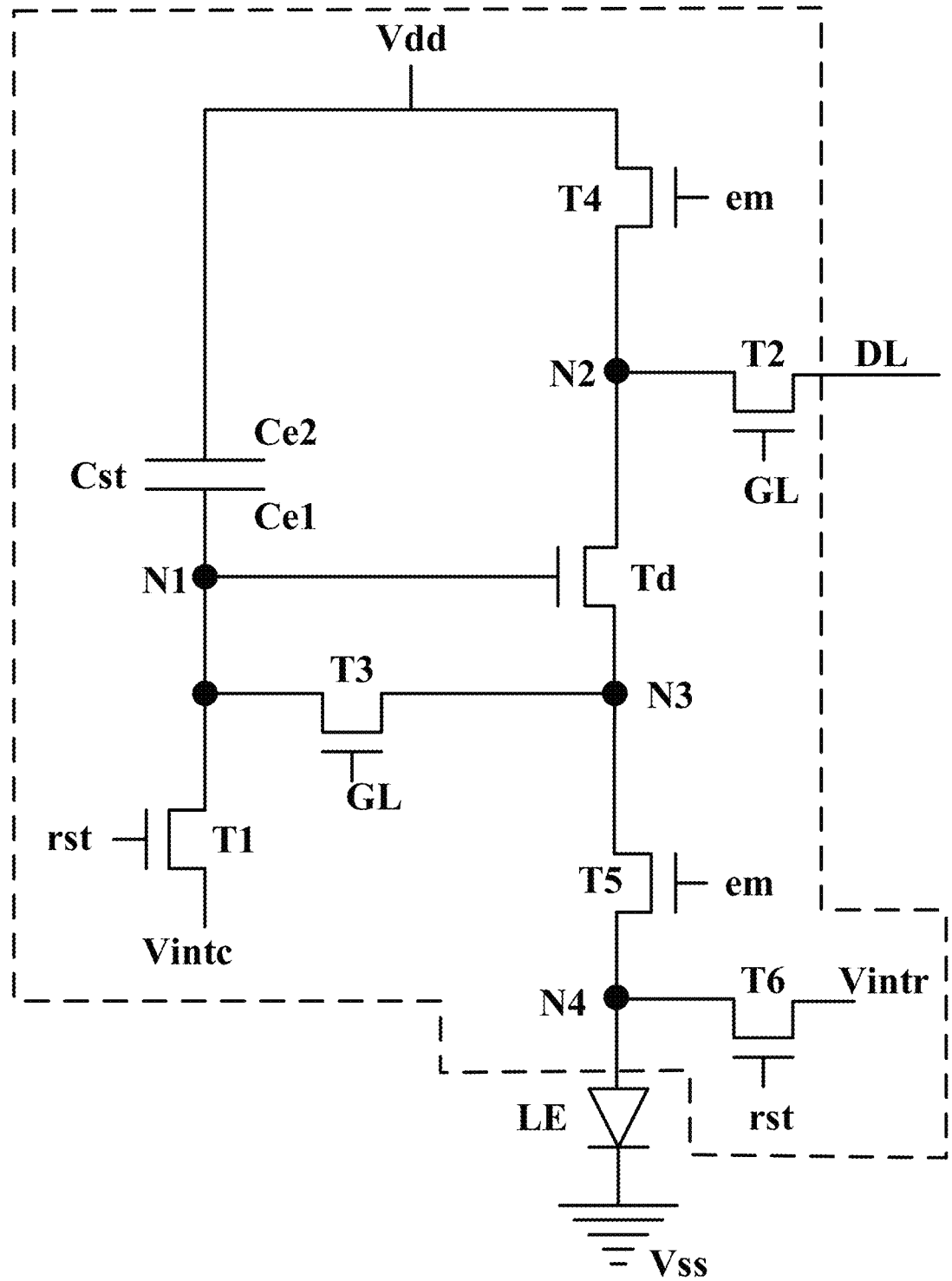
FIG. 6A is a circuit diagram illustrating the structure of a pixel driving circuit in some embodiments according to the present disclosure.

FIG. 6A is a circuit diagram illustrating the structure of a pixel driving circuit in some embodiments according to the present disclosure. Referring to FIG. 6A, in some embodiments, the respective pixel driving circuit includes a driving transistor Td; a storage capacitor Cst having a first capacitor electrode Ce1 and a second capacitor electrode Ce2; a first transistor T1 having a gate electrode connected to a respective reset control signal line of a plurality of reset control signal lines rst, a source electrode connected to a respective second reset signal line of a plurality of second reset signal lines Vintc, and a drain electrode connected to a first capacitor electrode Ce1 of the storage capacitor Cst and a gate electrode of the driving transistor Td; a second transistor T2 having a gate electrode connected to a respective gate line of a plurality of gate lines GL, a source electrode connected to a respective data line of a plurality of data lines DL, and a drain electrode connected to a source electrode of the driving transistor Td; a third transistor T3 having a gate electrode connected to the respective gate line, a drain electrode connected to the first capacitor electrode Ce1 of the storage capacitor Cst and the gate electrode of the driving transistor Td, and a source electrode connected to a drain electrode of the driving transistor Td; a fourth transistor T4 having a gate electrode connected to a respective light emitting control signal line of a plurality of light emitting control signal lines em, a source electrode connected to a respective voltage supply line of a plurality of voltage supply lines Vdd, and a drain electrode connected to the source electrode of the driving transistor Td and the drain electrode of the second transistor T2; a fifth transistor T5 having a gate electrode connected to the respective light emitting control signal line, a source electrode connected to a drain electrode of the driving transistor Td and a source electrode of the third transistor T3, and a drain electrode connected to an anode of a light emitting element LE; and a sixth transistor T6 having a gate electrode connected to the respective reset control signal line of a plurality of reset control signal lines rst, a source electrode connected to a respective first reset signal line of the plurality of first reset signal lines Vintr, and a drain electrode connected to the drain electrode of the fifth transistor and the anode of the light emitting element LE. The second capacitor electrode Ce2 is connected to the respective voltage supply line and the source electrode of the fourth transistor T4.

Figure 6B:
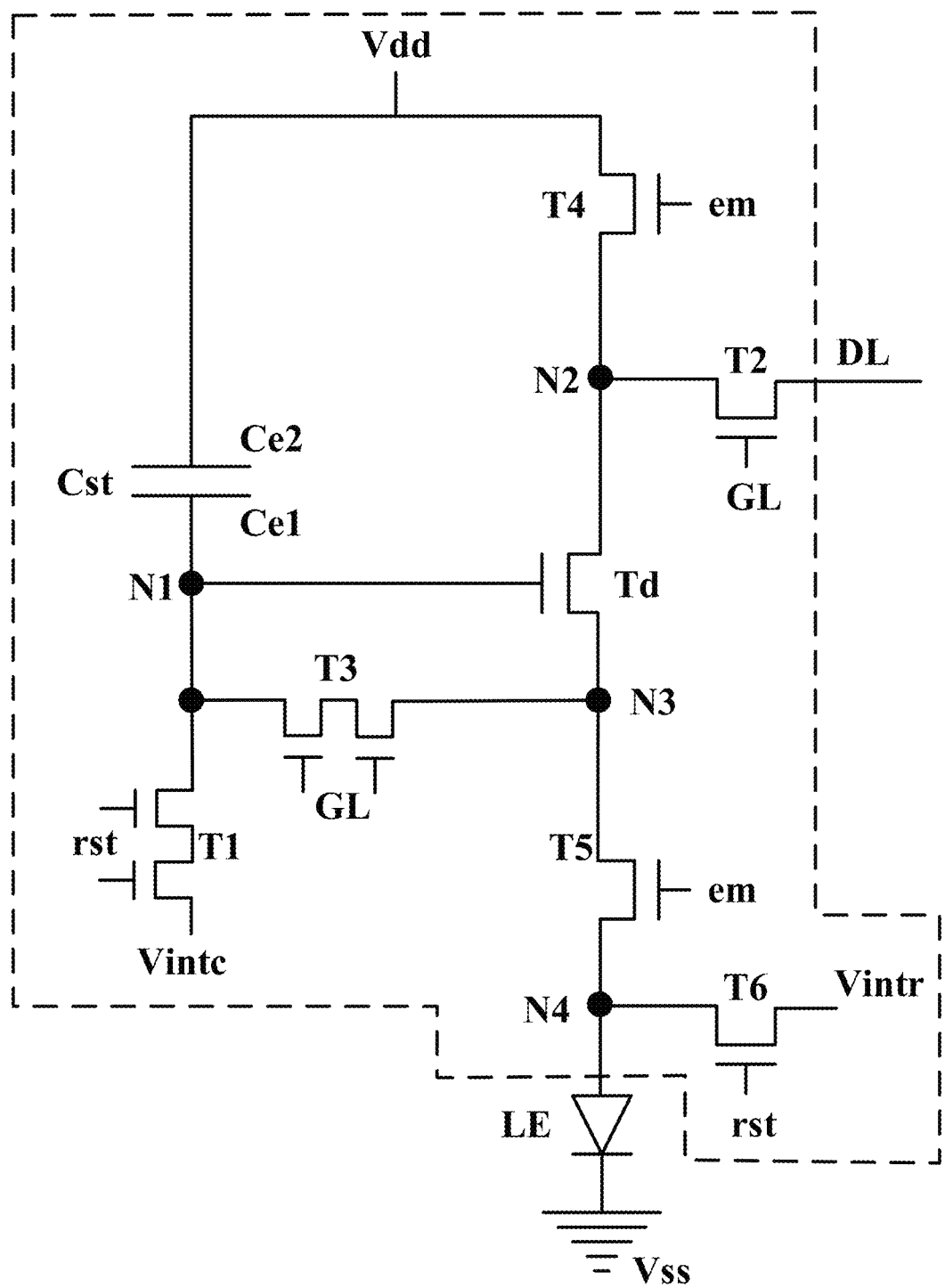
FIG. 6B is a circuit diagram illustrating the structure of a pixel driving circuit in some embodiments according to the present disclosure.

FIG. 6B is a circuit diagram illustrating the structure of a pixel driving circuit in some embodiments according to the present disclosure. Referring to FIG. 6B, in some embodiments, the third transistor T3 is a "double gate" transistor, and the first transistor T1 is a "double gate" transistor. Optionally, in a "double gate" first transistor, the active layer of the first transistor crosses over a respective reset control signal lines twice (alternatively, the respective reset control signal line crosses over the active layer of the first transistor T1 twice). Similarly, in a "double gate" third transistor, the active layer of the third transistor T3 crosses over a respective gate line of the plurality of gate lines GL twice (alternatively, the respective gate line crosses over the active layer of the third transistor T3 twice).

The pixel driving circuits depicted in FIG. 6A and FIG. 6B differ from the pixel driving circuits depicted in FIG. 2A and FIG. 2B in that the source electrodes of the first transistor T1 and the sixth transistor T6 in the pixel driving circuits depicted in FIG. 2A and FIG. 2B are connected to a same reset signal line, whereas the source electrodes of the first transistor T1 and the sixth transistor T6 in the pixel driving circuits depicted in FIG. 6A and FIG. 6B are connected to different reset signal lines.

The pixel driving circuit further include a first node N1, a second node N2, a third node N3, and a fourth node N4. The first node N1 is connected to the gate electrode of the driving transistor Td, the first capacitor electrode Ce1, and the drain electrode of the third transistor T3. The second node N2 is connected to the drain electrode of the fourth transistor T4, the drain electrode of the second transistor T2, and the source electrode of the driving transistor Td. The third node N3 is connected to the drain electrode of the driving transistor Td, the source electrode of the third transistor T3, and the source electrode of the fifth transistor T5. The fourth node N4 is connected to the drain electrode of the fifth transistor T5, the drain electrode of the sixth transistor T6, and the anode of the light emitting element LE.

Figure 7A:
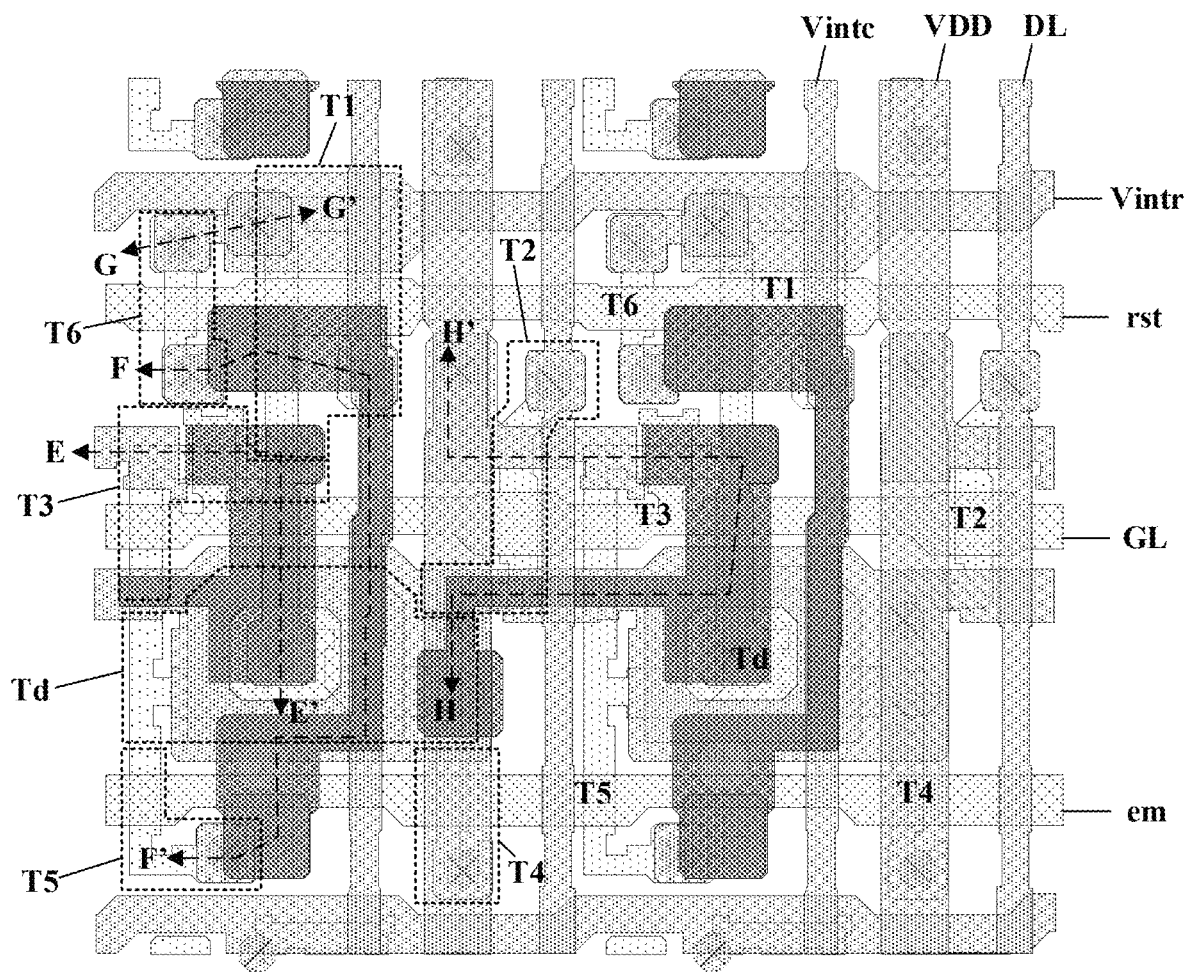
FIG. 7A is a diagram illustrating the structure of an array substrate in some embodiments according to the present disclosure.
Figure 7B:
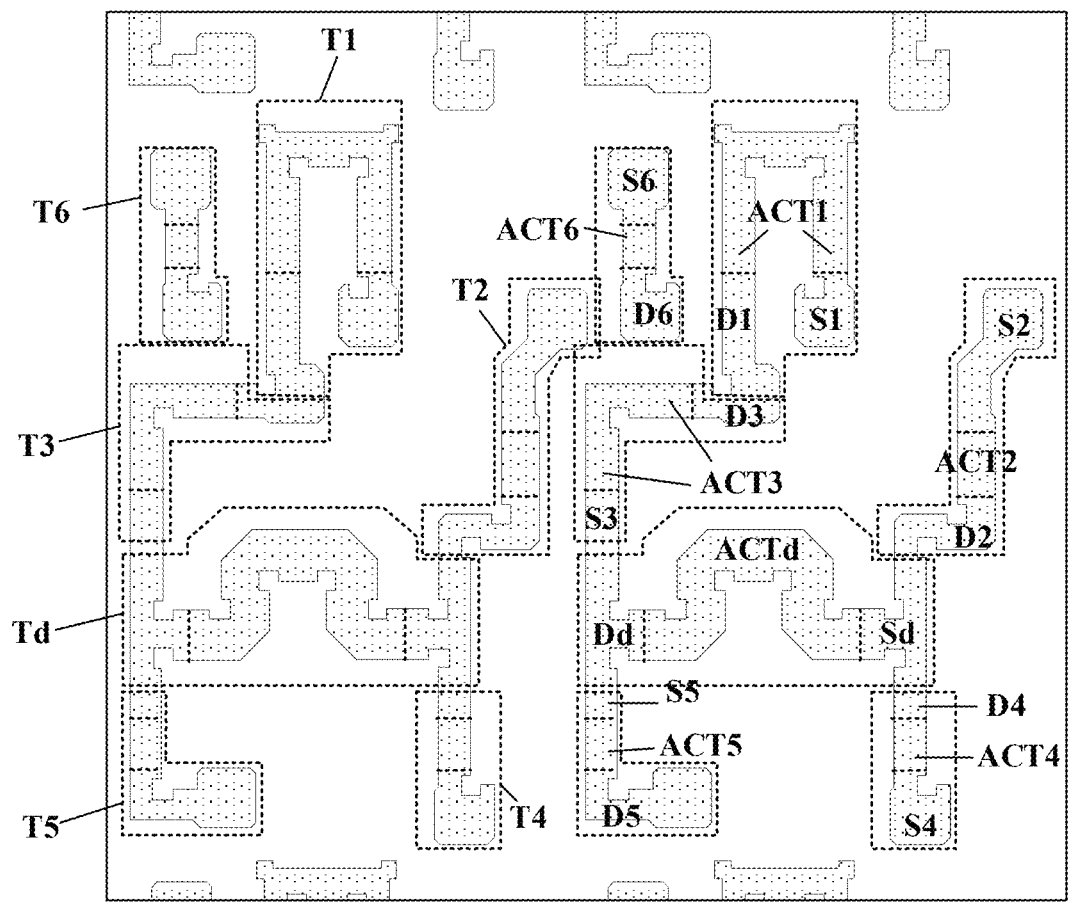
FIG. 7B is a diagram illustrating the structure of a semiconductor material layer in an array substrate depicted in FIG. 7A.
Figure 7C:
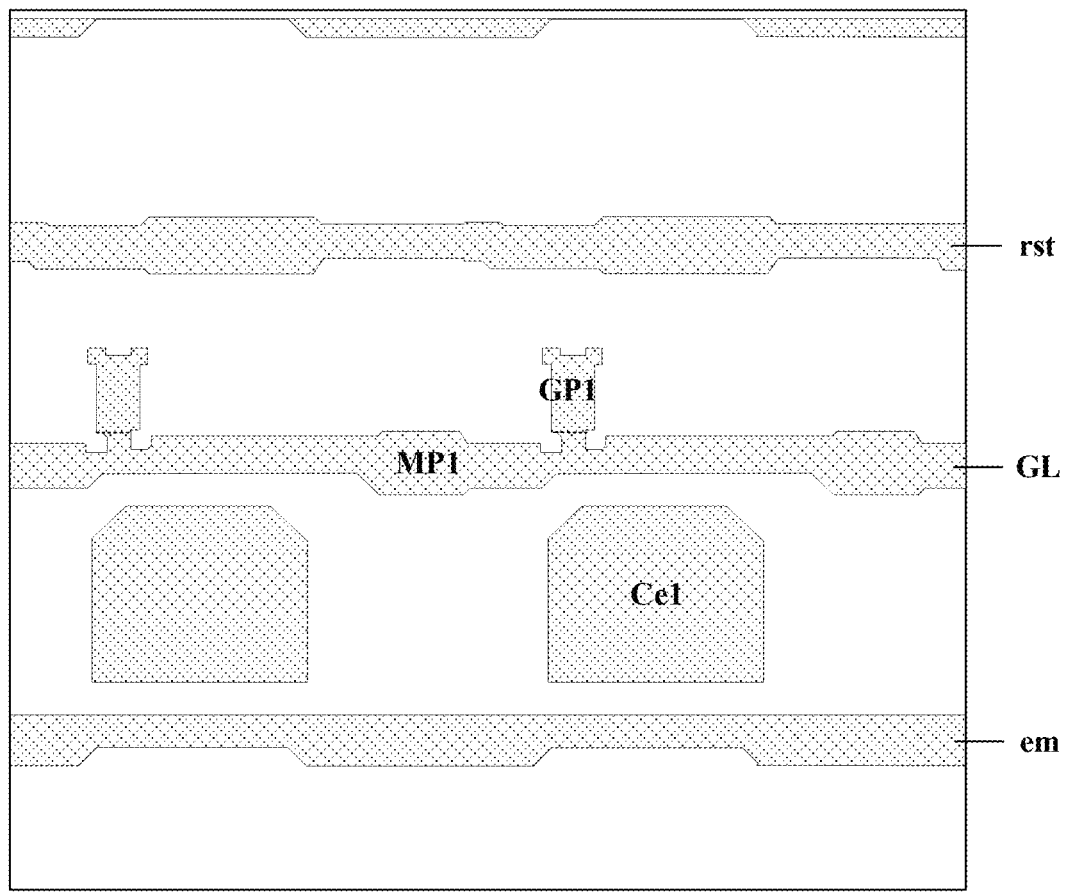
FIG. 7C is a diagram illustrating the structure of a first conductive layer in an array substrate depicted in FIG. 7A.
Figure 7D:
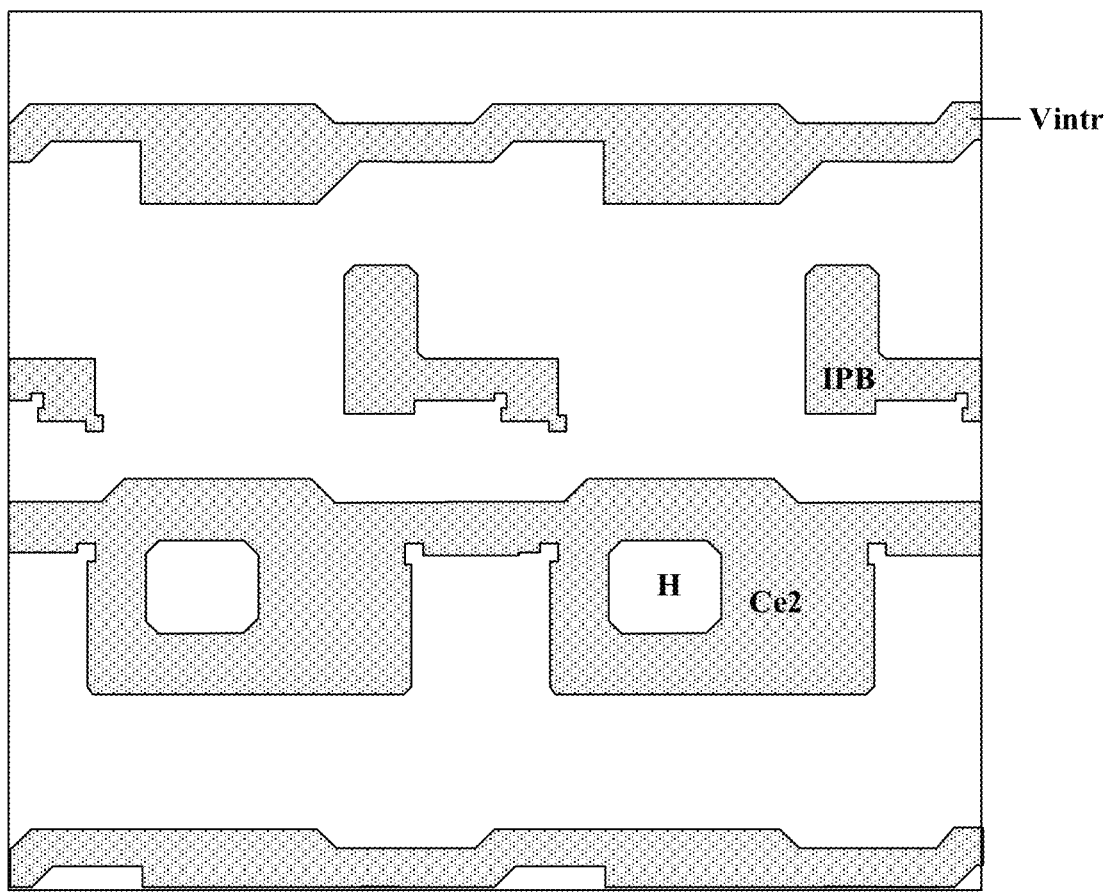
FIG. 7D is a diagram illustrating the structure of a second conductive layer in an array substrate depicted in FIG. 7A.
Figure 7E:
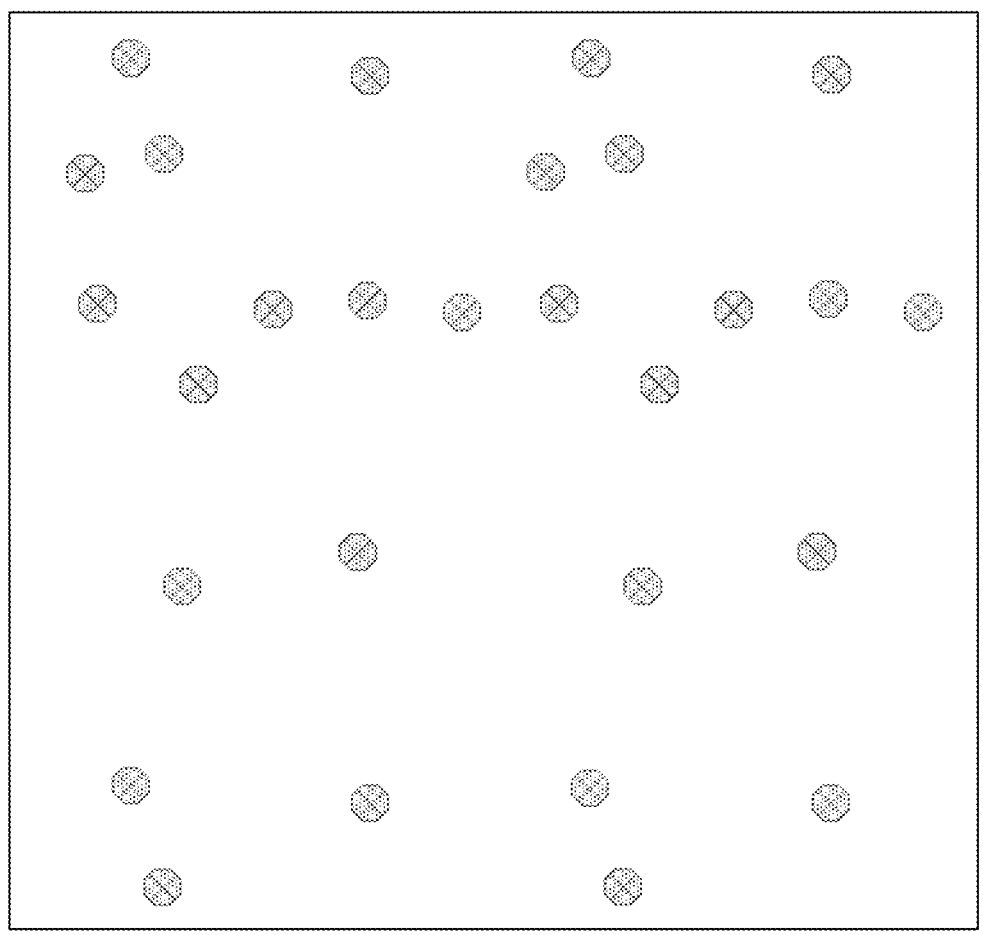
FIG. 7E is a diagram illustrating the structure of an inter-layer dielectric layer in an array substrate depicted in FIG. 7A.
Figure 7F:
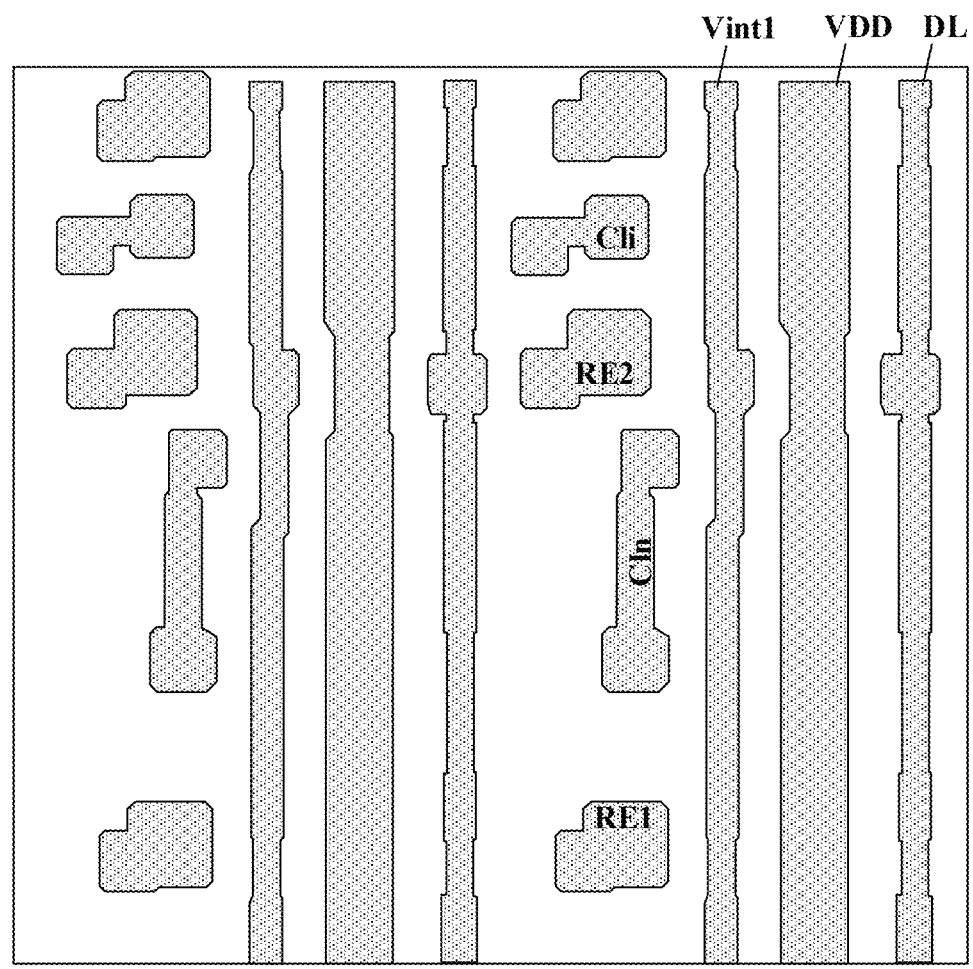
FIG. 7F is a diagram illustrating the structure of a first signal line layer in an array substrate depicted in FIG. 7A.
Figure 7G:
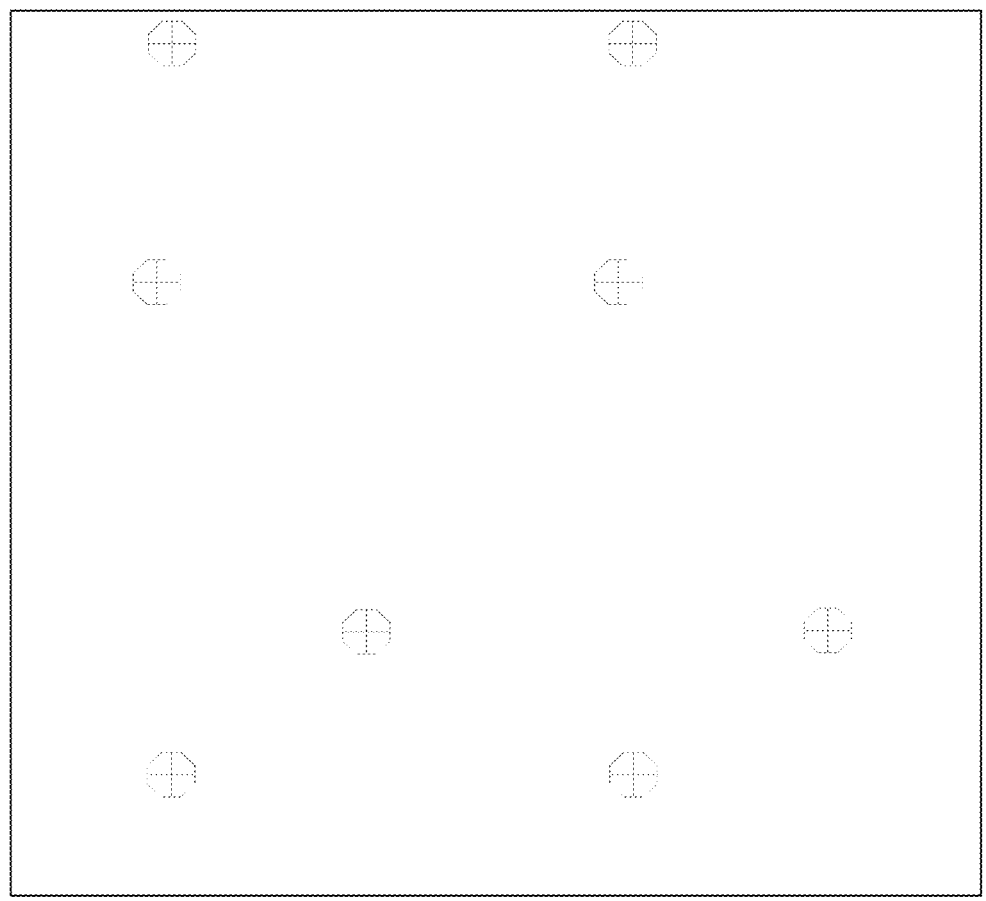
FIG. 7G is a diagram illustrating the structure of a passivation layer in an array substrate depicted in FIG. 7A.
Figure 7H:
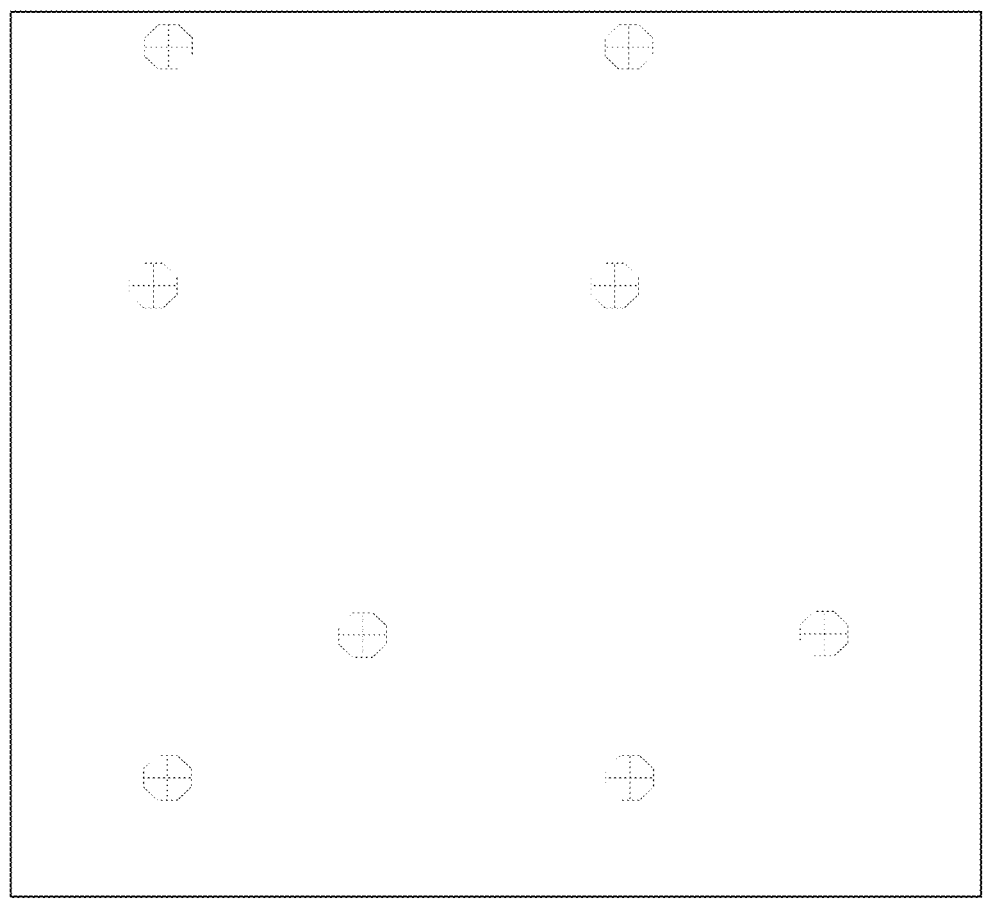
FIG. 7H is a diagram illustrating the structure of a first planarization layer in an array substrate depicted in FIG. 7A.
Figure 7I:
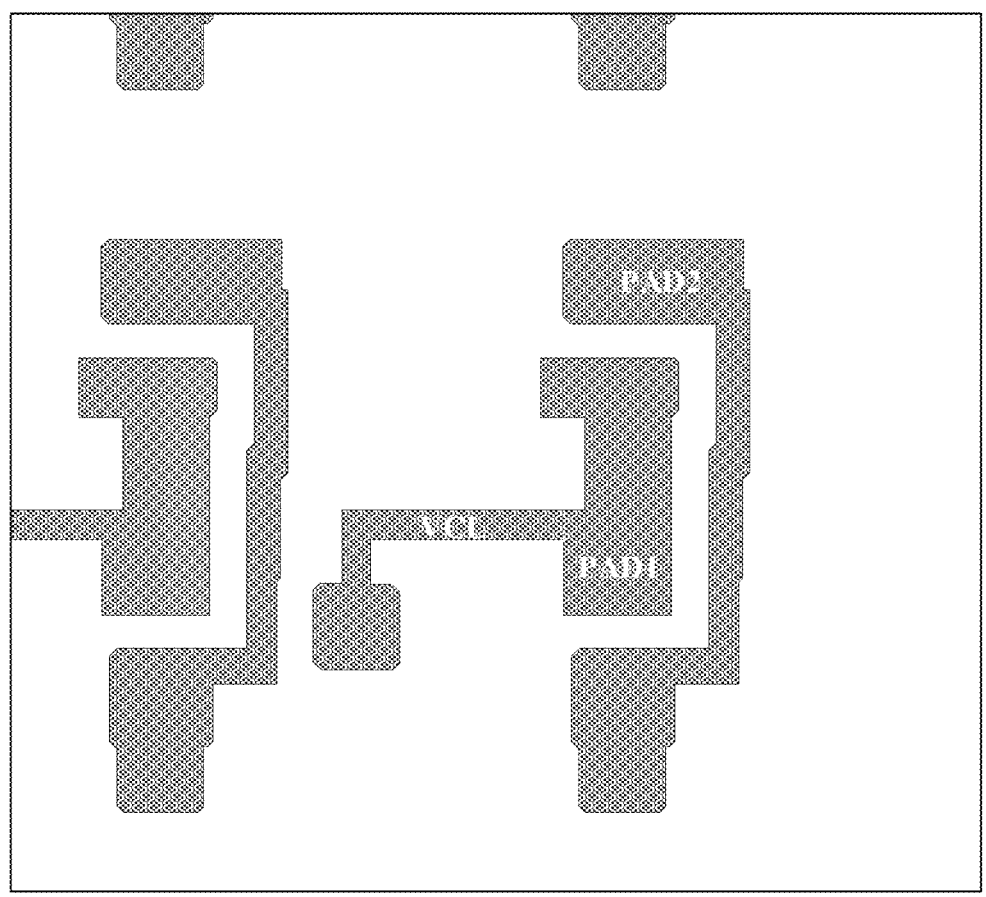
FIG. 7I is a diagram illustrating the structure of a second signal line layer in an array substrate depicted in FIG. 7A.
Figure 7J:
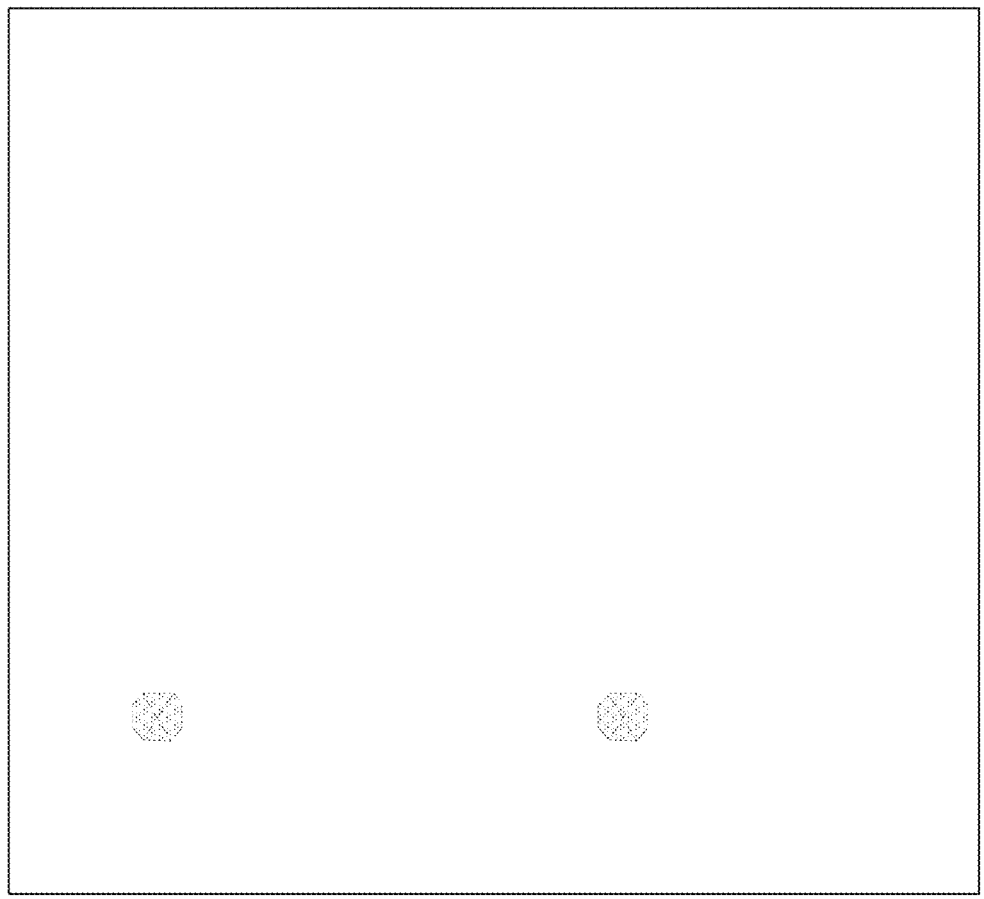
FIG. 7J is a diagram illustrating the structure of a second planarization layer in an array substrate depicted in FIG. 7A.
Figure 8A:
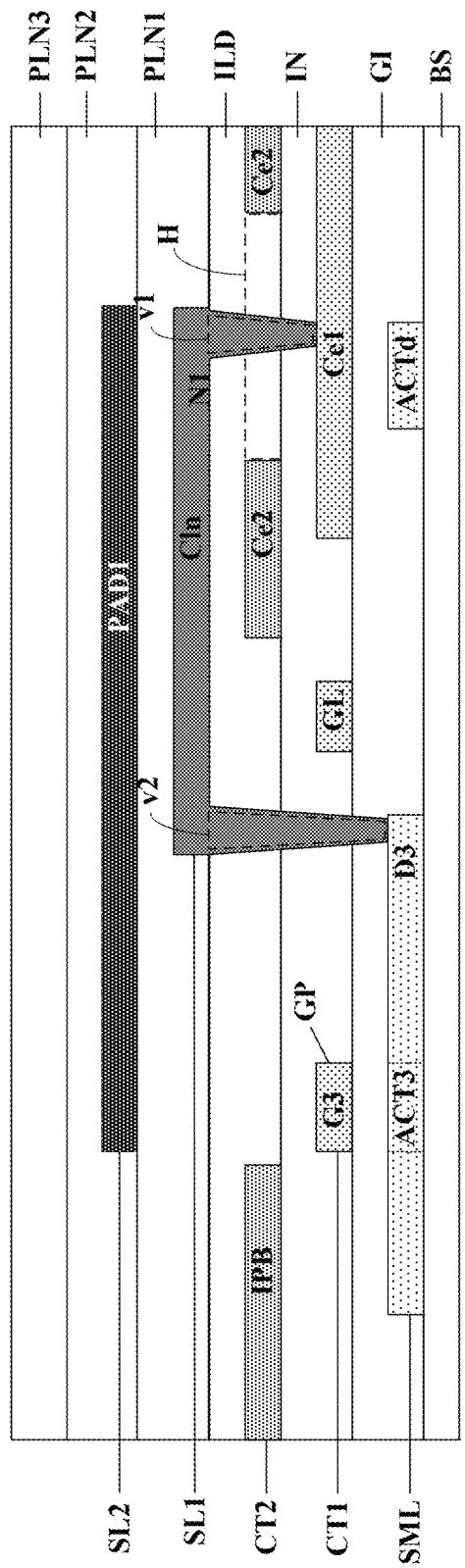
FIG. 8A is a cross-sectional view along a E-E' line in FIG. 7A.
Figure 8B:
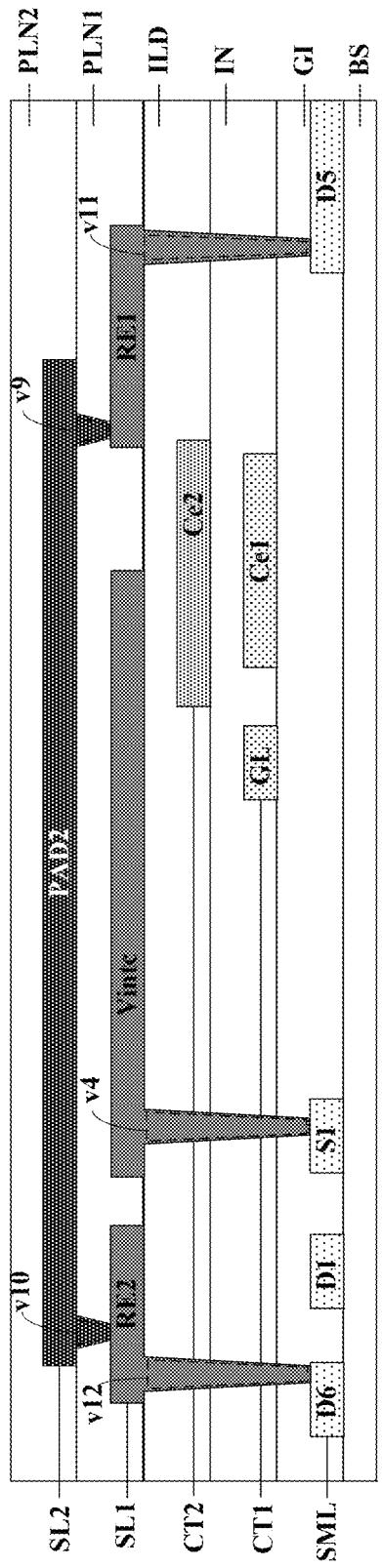
FIG. 8B is a cross-sectional view along an F-F' line in FIG. 7A.
Figure 8C:
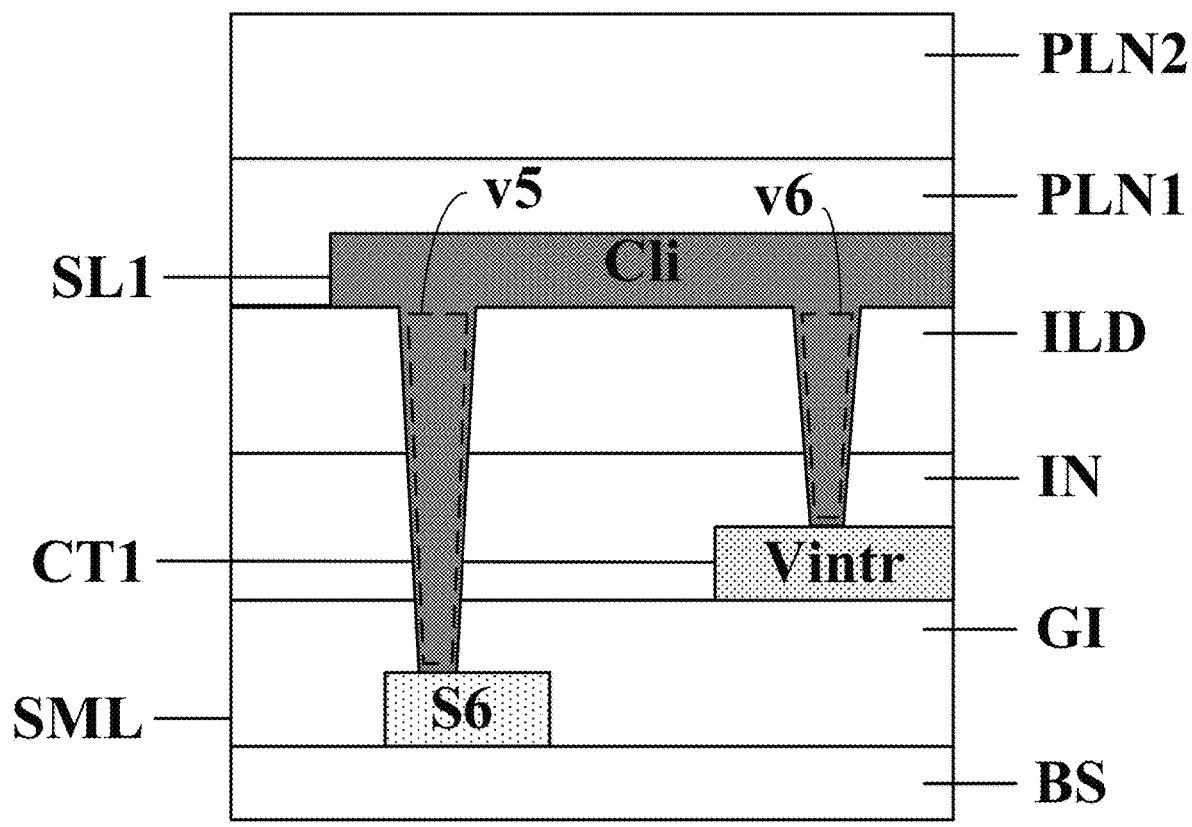
FIG. 8C is a cross-sectional view along a G-G' line in FIG. 7A.
Figure 8D:
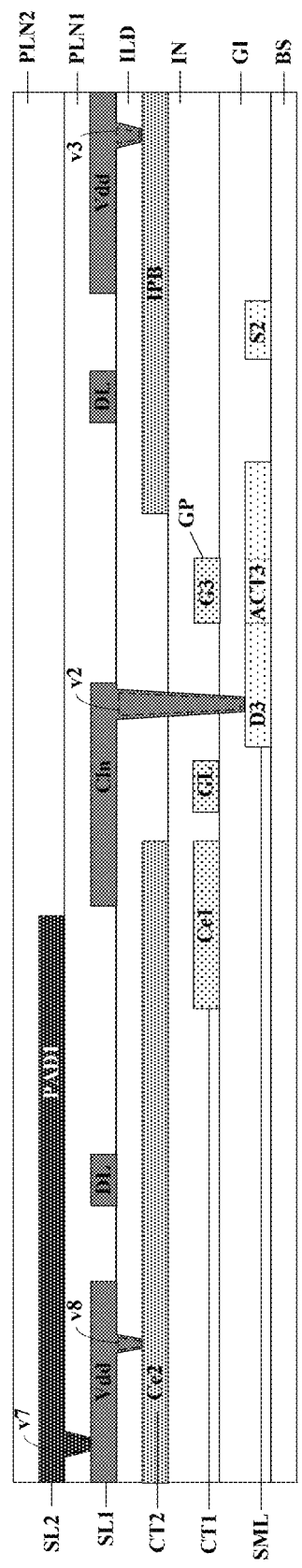
FIG. 8D is a cross-sectional view along an H-H' line in FIG. 7A.

FIG. 7A is a diagram illustrating the structure of an array substrate in some embodiments according to the present disclosure. FIG. 7B is a diagram illustrating the structure of a semiconductor material layer in an array substrate depicted in FIG. 7A. FIG. 7C is a diagram illustrating the structure of a first conductive layer in an array substrate depicted in FIG. 7A. FIG. 7D is a diagram illustrating the structure of a second conductive layer in an array substrate depicted in FIG. 7A. FIG. 7E is a diagram illustrating the structure of an inter-layer dielectric in an array substrate depicted in FIG. 7A. FIG. 7F is a diagram illustrating the structure of a first signal line layer in an array substrate depicted in FIG. 7A. FIG. 7G is a diagram illustrating the structure of a passivation layer in an array substrate depicted in FIG. 7A. FIG. 7H is a diagram illustrating the structure of a first planarization layer in an array substrate depicted in FIG. 7A. FIG. 7I is a diagram illustrating the structure of a second signal line layer in an array substrate depicted in FIG. 7A. FIG. 7J is a diagram illustrating the structure of a second planarization layer in an array substrate depicted in FIG. 7A. FIG. 8A is a cross-sectional view along a E-E' line in FIG. 7A. FIG. 8B is a cross-sectional view along an F-F' line in FIG. 7A. FIG. 8C is a cross-sectional view along a G-G' line in FIG. 7A. FIG. 8D is a cross-sectional view along an H-H' line in FIG. 7A.

Referring to FIG. 6A, FIG. 6B, FIG. 7A, and FIG. 7B, a respective pixel driving circuit is annotated with labels indicating regions corresponding to the plurality of transistors in the respective pixel driving circuit, including the first transistor T1, the second transistor T2, the third transistor T3, the fourth transistor T4, the fifth transistor T5, the sixth transistor T6, and the driving transistor Td. The respective pixel driving circuit is further annotated with labels indicating components of each of the plurality of transistors in the pixel driving circuit. For example, the first transistor T1 includes an active layer ACT1, a source electrode S1, and a drain electrode D1. The second transistor T2 includes an active layer ACT2, a source electrode S2, and a drain electrode D2. The third transistor T3 includes an active layer ACT3, a source electrode S3, and a drain electrode D3. The fourth transistor T4 includes an active layer ACT4, a source electrode S4, and a drain electrode D4. The fifth transistor T5 includes an active layer ACT5, a source electrode S5, and a drain electrode D5. The sixth transistor T6 includes an active layer ACT6, a source electrode S6, and a drain electrode D6. The driving transistor Td includes an active layer ACTd, a source electrode Sd, and a drain electrode Dd.

In some embodiments, the active layers (ACT1, ACT2, ACT3, ACT4, ACT5, ACT6, and ACTd) of the transistors (T1, T2, T3, T4, T5, T6, and Td) in the respective pixel driving circuit are in a same layer. Optionally, the active layers (ACT1, ACT2, ACT3, ACT4, ACT5, ACT6, and ACTd), at least portions of the source electrodes (S1, S2, S3, S4, S5, S6, and Sd), and at least portions of the drain electrodes (D1, D2, D3, D4, D5, D6, and Dd) of the transistors (T1, T2, T3, T4, T5, T6, and Td) in the respective pixel driving circuit are in a same layer. Optionally, the active layers (ACT1, ACT2, ACT3, ACT4, ACT5, ACT6, and ACTd), the source electrodes (S1, S2, S3, S4, S5, S6, and Sd), and the drain electrodes (D1, D2, D3, D4, D5, D6, and Dd) of the transistors (T1, T2, T3, T4, T5, T6, and Td) in the respective pixel driving circuit are in a same layer.

In some embodiments, the active layers ACT1, ACT2, ACT3, ACT4, ACT5, and ACTd of the transistors T1, T2, T3, T4, T5, and Td in the respective pixel driving circuit are parts of a first unitary structure. In another example, the active layers ACT1, ACT2, ACT3, ACT4, ACT5, and ACTd, the source electrodes S1, S2, S3, S4, S5, and Sd, and the drain electrodes D1, D2, D3, D4, D5, and Dd, of the transistors T1, T2, T3, T4, T5, and Td in the respective pixel driving circuit are parts of a first unitary structure. As shown in FIG. 7B, in some embodiments, the active layer ACT6 of the transistor T6 in the respective pixel driving circuit is spaced apart from the first unitary structure comprising the active layers ACT1, ACT2, ACT3, ACT4, ACT5, and ACTd of the transistors T1, T2, T3, T4, T5, and Td in the respective pixel driving circuit.

In some embodiments, the active layer ACT6, at least a portion of the source electrode S6, and at least a portion of the drain electrode D6, of the transistor T6 in the respective pixel driving circuit, are parts of a second unitary structure. Optionally, the active layer ACT6, the source electrode S6, and the drain electrode D6, of the transistor T6 in the respective pixel driving circuit, are parts of a second unitary structure. The second unitary structure in the respective pixel driving circuit is spaced apart from the first unitary structure.

Referring to FIG. 6A, FIG. 6B, FIG. 7A, and FIG. 7C, the first conductive layer in some embodiments includes a plurality of gate lines GL, a plurality of reset control signal lines rst, a plurality of light emitting control signal lines em, and a first capacitor electrode Ce1 of the storage capacitor Cst. Optionally, the plurality of gate lines GL, the plurality of reset control signal lines rst, the plurality of light emitting control signal lines em, and the first capacitor electrode Ce1 are in a same layer.

In some embodiments, in a respective pixel driving circuit, a respective gate line of the plurality of gate lines GL includes a first main portion MP1 extending along an extension direction of the respective gate line, and a first gate protrusion GP1 protruding away from the first main portion MP1, e.g., along a direction from the respective gate line of the plurality of gate lines GL in the respective pixel driving circuit toward the respective reset control signal line of the plurality of reset control signal lines rst in the respective pixel driving circuit.

In some embodiments, as discussed above, the third transistor T3 is a double gate transistor. In some embodiments, the first gate protrusion GP1 is one of the double gates G3 in the third transistor T3. In some embodiments, and referring to FIG. 8A, an orthographic projection of the first gate protrusion GP1 on the base substrate BS at least partially overlaps with an orthographic projection of the active layer ACT3 of the third transistor T3 on the base substrate BS.

Referring to FIG. 6A, FIG. 6B, FIG. 7A, and FIG. 7D, the second conductive layer in some embodiments includes a plurality of first reset signal lines Vintr, an interference preventing block IPB and a second capacitor electrode Ce2 of the storage capacitor Cst. The interference preventing block IPB can effectively reduce crosstalk, particularly vertical crosstalk between the N1 node of the adjacent data lines.

Vias extending through the inter-layer dielectric layer ILD are depicted in FIG. 7E.

Referring to FIG. 6A, FIG. 6B, FIG. 7A, and FIG. 7F, the first signal line layer in some embodiments includes a plurality of voltage supply lines Vdd, a node connecting line Cln, an initialization connecting line Cli, a first relay electrode RE1, a second relay electrode RE2, a plurality of second reset signal lines Vintc, and a plurality of data lines DL. The node connecting line Cln connects the first capacitor electrode Ce1 and the drain electrode of the third transistor T3 in a respective pixel driving circuit together.

Optionally, the plurality of voltage supply lines Vdd, the node connecting line Cln, the initialization connecting line Cli, the first relay electrode RE1, the second relay electrode RE2, the plurality of second reset signal lines Vintc, and the plurality of data lines DL are in a same layer. A respective second reset signal line of the plurality of second reset signal lines Vintc are configured to provide a reset signal to a gate electrode of the driving transistor.

Vias extending through the passivation layer PVX are depicted in FIG. 7G.

Vias extending through the first planarization layer PLN1 are depicted in FIG. 7H.

Referring to Referring to FIG. 6A, FIG. 6B, FIG. 7A, and FIG. 7I, the second signal line layer in some embodiments includes a first pad PAD1 and a second PAD2 in a respective pixel driving circuit. Optionally, the plurality of first reset signal lines Vintr, the first pad PAD1, and the second PAD2 are in a same layer. The first pad PAD1 is configured to ensure that first nodes respectively in different pixel driving circuits are situated in a similar environment. As shown in FIG. 6A and FIG. 6B, the first node N1 is connected to the gate electrode of the driving transistor Td, the drain electrode of the first transistor T1, the drain electrode of the third transistor T3, and the first capacitor electrode Ce1 of the storage capacitor Cst.

Vias extending through the second planarization layer PLN2 are depicted in FIG. 7J.

Referring to FIG. 6A, FIG. 6B, FIG. 7A, FIG. 7C, FIG. 7D, and FIG. 8A, in some embodiments, an orthographic projection of the second capacitor electrode Ce2 on a base substrate BS completely covers, with a margin, an orthographic projection of the first capacitor electrode Ce1 on the base substrate BS except for a hole region H in which a portion of the second capacitor electrode Ce2 is absent. In some embodiments, the first signal line layer includes a node connecting line Cln on a side of the inter-layer dielectric layer ILD away from the second capacitor electrode Ce2. The node connecting line Cln is in a same layer as the plurality of voltage supply lines Vdd. Optionally, the array substrate further includes a first via v1 in the hole region H and extending through the inter-layer dielectric layer ILD and the insulating layer IN. Optionally, the node connecting line Cln is connected to the first capacitor electrode Ce1 through the first via v1. In some embodiments, the first capacitor electrode Ce1 is on a side of the gate insulating layer G1 away from the base substrate BS. Optionally, the array substrate further includes a first via v1 and a second via v2. The first via v1 is in the hole region H and extends through the inter-layer dielectric layer ILD and the insulating layer IN. The second via v2 extends through the inter-layer dielectric layer ILD, the insulating layer IN, and the gate insulating layer G1. Optionally, the node connecting line Cln is connected to the first capacitor electrode Ce1 through the first via v1, and is connected to the semiconductor material layer SML through the second via v2. Optionally, the node connecting line Cln is connected to the drain electrode D3 of third transistor, as depicted in FIG. 8A.

Referring to Referring to FIG. 6A, FIG. 6B, FIG. 7A, FIG. 7D, and FIG. 8D, in some embodiments, the interference preventing block IPB is in a same layer as the second capacitor electrode Ce2. A respective voltage supply line of the plurality of voltage supply lines Vdd is connected to the interference preventing block IPB through a third via v3. Optionally, the third via v3 extends through the inter-layer dielectric layer ILD. Optionally, an orthographic projection of the interference preventing block IPB on the base substrate BS partially overlaps with an orthographic projection of the respective voltage supply line of the plurality of voltage supply lines Vdd on the base substrate BS. Optionally, the orthographic projection of the interference preventing block IPB on the base substrate BS at least partially overlaps with an orthographic projection of an active layer ACT3 of the third transistor T3 on the base substrate BS.

Figure 9A:
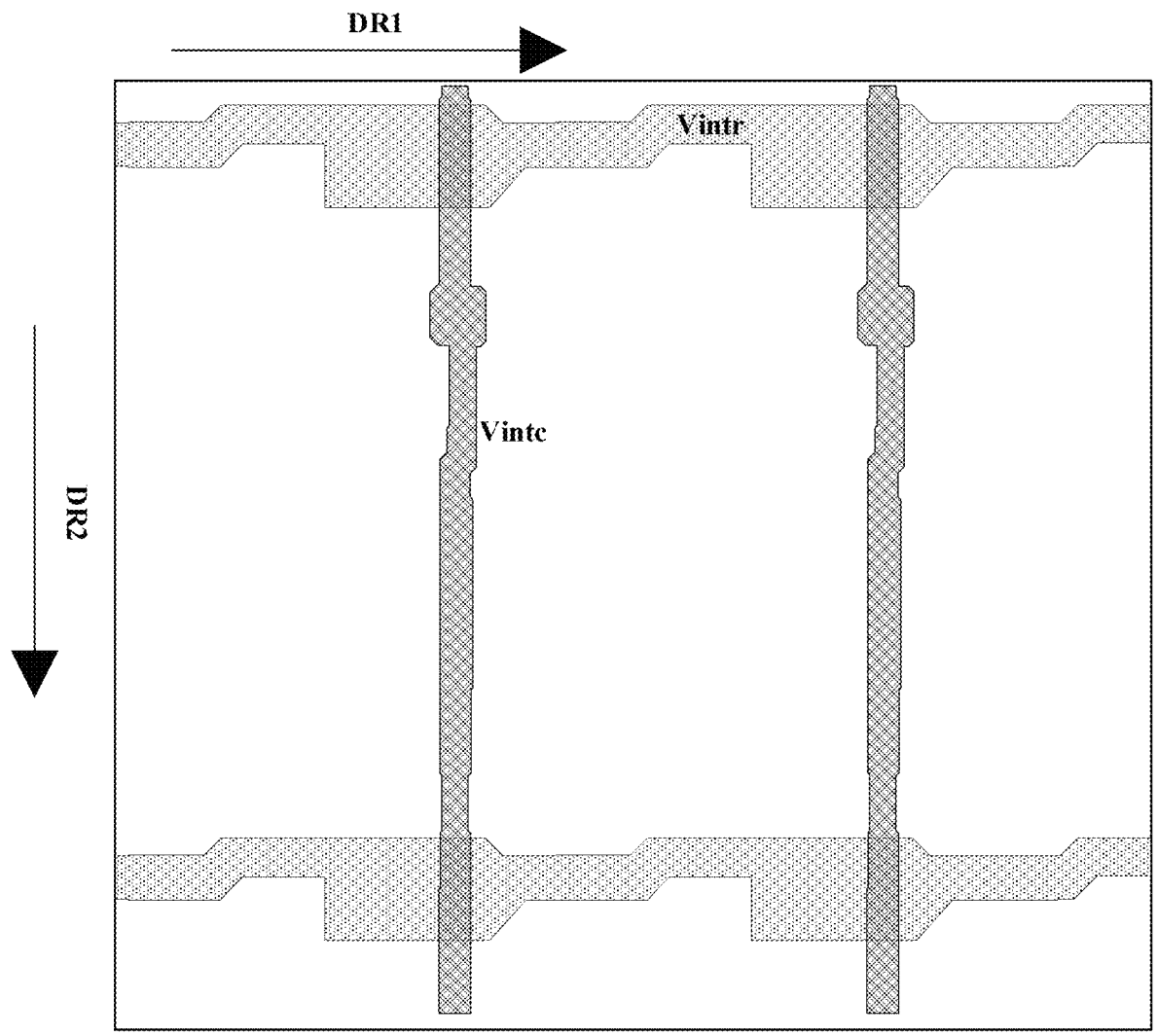
FIG. 9A illustrates a network of reset signal lines in an array substrate depicted in FIG. 7A.

FIG. 9A illustrates a network of reset signal lines in an array substrate depicted in FIG. 7A. Referring to FIG. 9A and FIG. 7A, the network of reset signal lines in the array substrate includes a plurality of first reset signal lines Vintr extending along a first direction DR1, respectively; and a plurality of second reset signal lines Vintc extending along a second direction DR2. A respective first reset signal line crosses over multiple second reset signal lines. A respective second reset signal line crosses over multiple first reset signal lines. The respective first reset signal line is not connected to the multiple second reset signal lines where the respective first reset signal line crosses over the multiple second reset signal lines. The respective second reset signal line is not connected to the multiple first reset signal lines where the respective second reset signal line crosses over the multiple first reset signal lines.

Referring to FIG. 6A, FIG. 6B, FIG. 7A, and FIG. 8B, a respective second reset signal line of the plurality of second reset signal lines Vintc is connected to the source electrode S1 of the first transistor T1 through a fourth via v4 extending through the inter-layer dielectric layer ILD, the insulating layer IN, and the gate insulating layer G1, thereby providing an initialization signal to the source electrode S1 of the first transistor T1.

Referring to FIG. 6A, FIG. 6B, FIG. 7A, FIG. 7F, and FIG. 8C, the initialization connecting line Cli is connected to the source electrode S6 of the sixth transistor T6 through a fifth via v5 extending through the inter-layer dielectric layer ILD, the insulating layer IN, and the gate insulating layer G1; and is connected to a respective first reset signal line of the plurality of first reset signal lines Vintr through a sixth via v6 extending through the inter-layer dielectric layer ILD and the insulating layer IN; thereby providing an initialization signal to the source electrode S6 of the sixth transistor T6.

As discussed above, the inventors of the present disclosure discover that the first nodes respectively in different pixel driving circuits in a related display panel typically are often situated in different environments, due to the layout in the related display panel. In particular, in a gate-on-array in panel (GOP) type display panel, the issue is more severe. In the related GOP type display panel, first nodes respectively in different pixel driving circuits are typically in environments having different anode layouts. The inventors of the present disclosure discover that, by having the first pads respectively in the pixel driving circuits, the first nodes respectively underneath the first pads can be situated in a highly similar environment. Surprisingly and unexpectedly, the unique structure of the present array substrate significantly enhances display uniformity.

In some embodiments, the respective pixel driving circuit in the array substrate further includes a voltage line configured to output a constant voltage signal, and a voltage connecting line VCL electrically connecting the first pad PAD1 with the voltage line. In FIG. 7A to FIG. 7J, the respective voltage supply line of the plurality of voltage supply lines Vdd may be considered as the voltage line configured to output a constant voltage signal. Optionally, an orthographic projection of the voltage line and the voltage connecting line VCL on the base substrate is spaced apart from the orthographic projection of the node connecting line Cln on the base substrate.

Figure 9B:
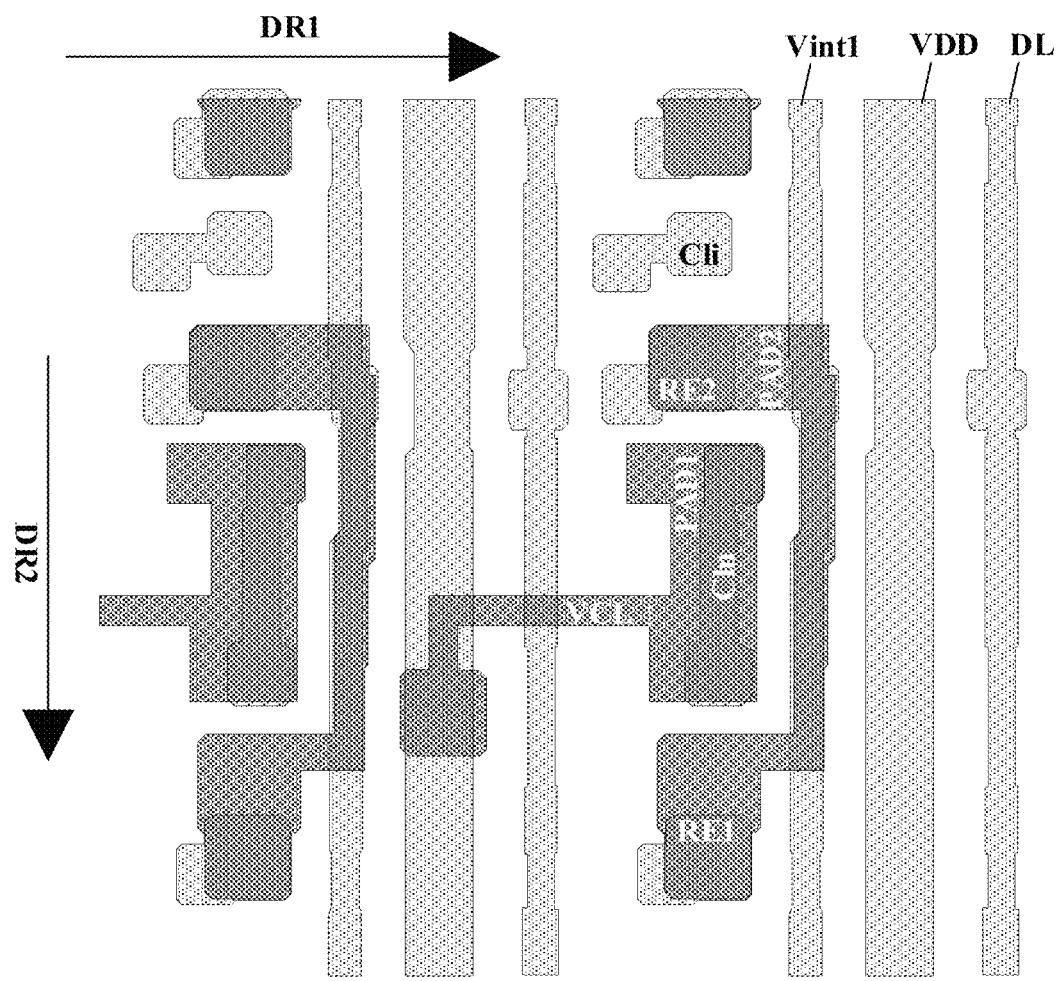
FIG. 9B illustrates the structure of a first signal line layer and a second signal line layer in some embodiments according to the present disclosure.

Referring to FIG. 8D, the first pad PAD1 is connected to a respective voltage supply line of the plurality of voltage supply lines Vdd in an adjacent pixel driving circuit through the voltage connecting line VCL. The voltage connecting line VCL is connected to the respective voltage supply line of the plurality of voltage supply lines Vdd in the adjacent pixel driving circuit through a seventh via v7 extending through the first planarization layer PLN1. The respective voltage supply line of the plurality of voltage supply lines Vdd is connected to the second capacitor electrode Ce2 through an eighth via v8 extending through the inter-layer dielectric layer ILD. FIG. 9B illustrates the structure of a first signal line layer and a second signal line layer in some embodiments according to the present disclosure. As shown in FIG. 9B and FIG. 8A, in some embodiments, an orthographic projection of the first pad PAD1 in a respective pixel driving circuit on the base substrate BS covers at least 50% (e.g., at least 55%, at least 60%, at least 65%, at least 70%, at least 75%, at least 80%, at least 85%, at least 90%, at least 95%, at least 99%, or 100%) of an orthographic projection of the node connecting line Cln in the respective pixel driving circuit on the base substrate BS. In some embodiments, the orthographic projection of the first pad PAD1 in the respective pixel driving circuit on the base substrate BS at least partially overlaps with an orthographic projection of the active layer ACT3 of the third transistor T3 on the base substrate BS. In some embodiments, the orthographic projection of the first pad PAD1 in the respective pixel driving circuit on the base substrate BS covers at least 50% (e.g., at least 55%, at least 60%, at least 65%, at least 70%, at least 75%, at least 80%, at least 85%, at least 90%, at least 95%, at least 99%, or 100%) of an orthographic projection of the first gate protrusion GP1 of a respective gate line of the plurality of gate lines GL on the base substrate BS.

Referring to FIG. 7A, FIG. 8D, and FIG. 9B, an orthographic projection of the first pad PAD1 on the base substrate BS at least partially overlaps with the orthographic projection of the node connecting line Cln in the respective pixel driving circuit on the base substrate BS, and at least partially overlaps with the orthographic projection of the first gate protrusion GP1 of the respective gate line of the plurality of gate lines GL on the base substrate BS. An orthographic projection of the voltage connecting line VCL on the base substrate BS at least partially overlaps with an orthographic projection of a respective voltage supply line of the plurality of voltage supply lines Vdd in an adjacent pixel driving circuit on the base substrate BS. The voltage connecting line VCL crosses over a respective data line of the plurality of data lines DL in the adjacent pixel driving circuit, the respective data line being in a pixel driving circuit adjacent to the respective pixel driving circuit. The adjacent pixel driving circuit and the respective pixel driving circuit are in a same row along the first direction DR1.

The second pad PAD2 is configured to provide a parasitic capacitance at the fourth node N4. As shown in FIG. 6A and FIG. 6B, the fourth node N4 is connected to the drain electrode of the fifth transistor T5, the drain electrode of the sixth transistor T6, and the anode of the light emitting element LE. The second pad PAD2 is connected to the drain electrode of the fifth transistor T5, the drain electrode of the sixth transistor T6, and the anode of the light emitting element LE.

Figures 10A, 10B:
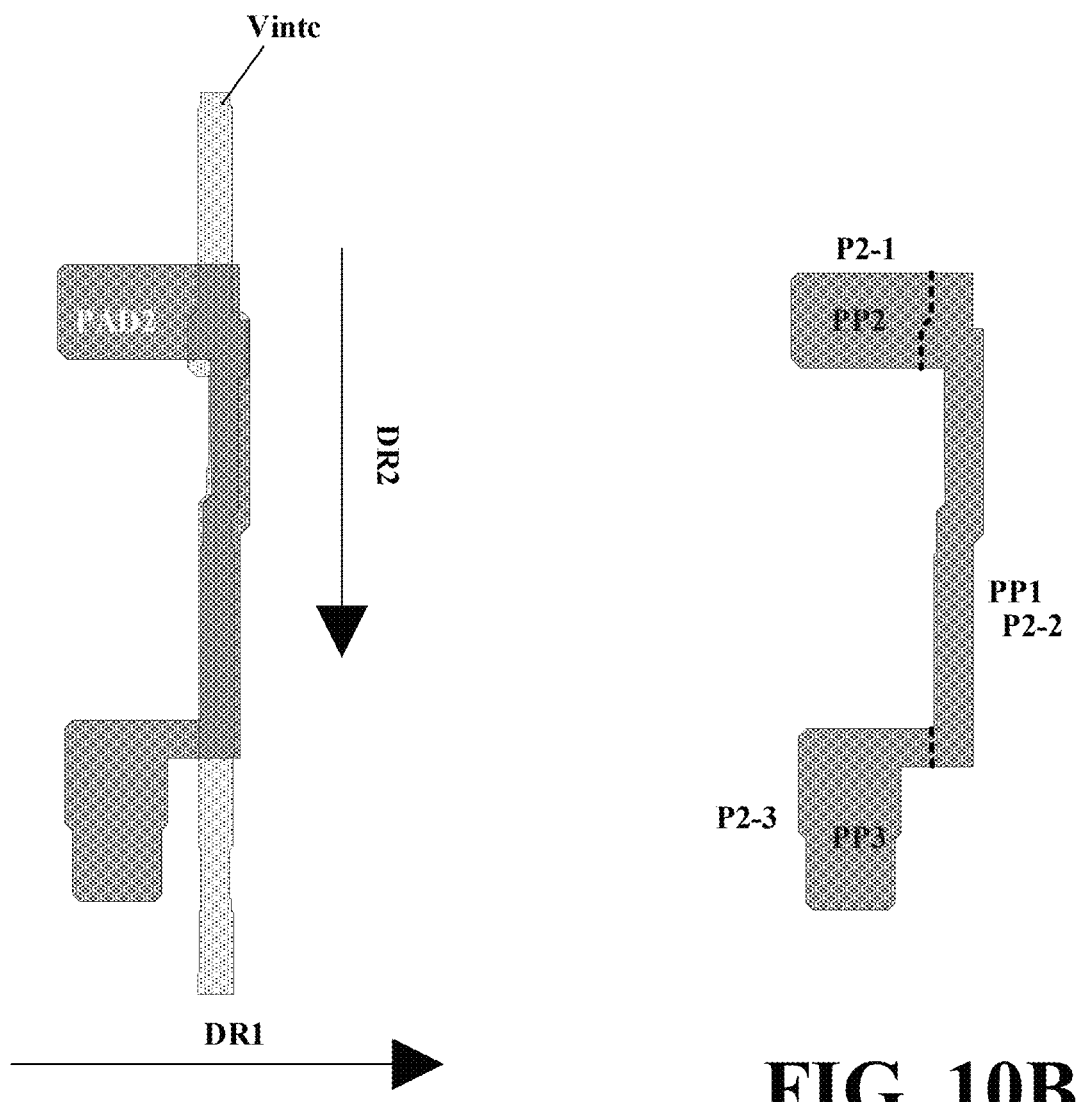
FIG. 10A illustrates the structure of a second pad and a respective second reset signal line in an array substrate depicted in FIG. 7A.
FIG. 10B illustrates the structure of a second pad in some embodiments according to the present disclosure.

FIG. 10A illustrates the structure of a second pad and a respective second reset signal line in an array substrate depicted in FIG. 7A. Referring to Referring to FIG. 6A, FIG. 6B, FIG. 7A, FIG. 7I, FIG. 8B, and FIG. 10A, the second pad PAD2 is configured to provide a parasitic capacitance at the fourth node N4. In one example, the parasitic capacitance at the fourth node N4 is formed between the second pad PAD2 and the respective first reset signal line of the plurality of first reset signal lines Vintr. An orthographic projection of the second pad PAD2 on a base substrate BS at least partially overlaps with an orthographic projection of the respective first reset signal line on the base substrate BS. The second pad PAD2 is connected to the drain electrode of the fifth transistor T5, the drain electrode of the sixth transistor T6, and the anode of the light emitting element LE.

In some embodiments, the second pad PAD2 crosses over a respective gate line of the plurality of gate lines GL. Optionally, an orthographic projection of the second pad PAD2 on the base substrate BS at least partially overlaps with an orthographic projection of a respective reset control signal line of the plurality of reset control signal lines rst on the base substrate BS. Optionally, the orthographic projection of the second pad PAD2 on the base substrate BS at least partially overlaps with an orthographic projection of a respective light emitting control signal line of the plurality of light emitting control signal lines em on the base substrate BS. In one example, the orthographic projection of the second pad PAD2 on the base substrate BS at least partially overlaps with the orthographic projection of the respective reset control signal line of the plurality of reset control signal lines rst on the base substrate BS, and at least partially overlaps with the orthographic projection of a respective light emitting control signal line of the plurality of light emitting control signal lines em on the base substrate BS.

FIG. 10B illustrates the structure of a second pad in some embodiments according to the present disclosure. Referring to FIG. 10A and FIG. 10B, the first pad in some embodiments includes a first-second pad part P2-1, a second-second pad part P2-2, and a third-second pad part P2-3. The second-second pad part P2-2 connects the first-second pad part P2-1 to the third-second pad part P2-3. The first-second pad part P2-1 and the third-second pad part P2-3 extend from the second-second pad part P2-2 to a same side (e.g., to the left side). An orthographic projection of the second-second pad part P2-2 on the base substrate at least partially overlaps with an orthographic projection of the respective first reset signal line on the base substrate. An orthographic projection of the first-second pad part P2-1 on the base substrate is at least partially non-overlapping with the orthographic projection of the respective first reset signal line on the base substrate, e.g., the orthographic projection of the first-second pad part P2-1 on the base substrate is completely non-overlapping with the orthographic projection of the respective first reset signal line on the base substrate. An orthographic projection of the third-second pad part P2-3 on the base substrate is at least partially non-overlapping with the orthographic projection of the respective first reset signal line on the base substrate, e.g., the orthographic projection of the third-second pad part P2-3 on the base substrate is completely non-overlapping with the orthographic projection of the respective first reset signal line on the base substrate.

Referring to FIG. 7A and FIG. 8B, the second pad PAD2 is connected to a first relay electrode RE1 in the first signal line layer SL1 through a ninth via v9 extending through the first planarization layer PLN1, and is connected to a second relay electrode RE2 in the first signal line layer SL1 through a tenth via v10 extending through the first planarization layer PLN1. The first relay electrode RE1 is connected to the drain electrode D5 of the fifth transistor T5 through an eleventh via v11 extending through the inter-layer dielectric layer ILD, the insulating layer IN, and the gate insulating layer G1. The second relay electrode RE2 is connected to the drain electrode D6 of the sixth transistor T6 through a twelfth via v12 extending through the inter-layer dielectric layer ILD, the insulating layer IN, and the gate insulating layer G1. In some embodiments, an anode connecting pad is connected to the second pad PAD2 through a via extending through the second planarization layer PLN2. Optionally, an anode is connected to the anode connecting pad.

Figure 11A:
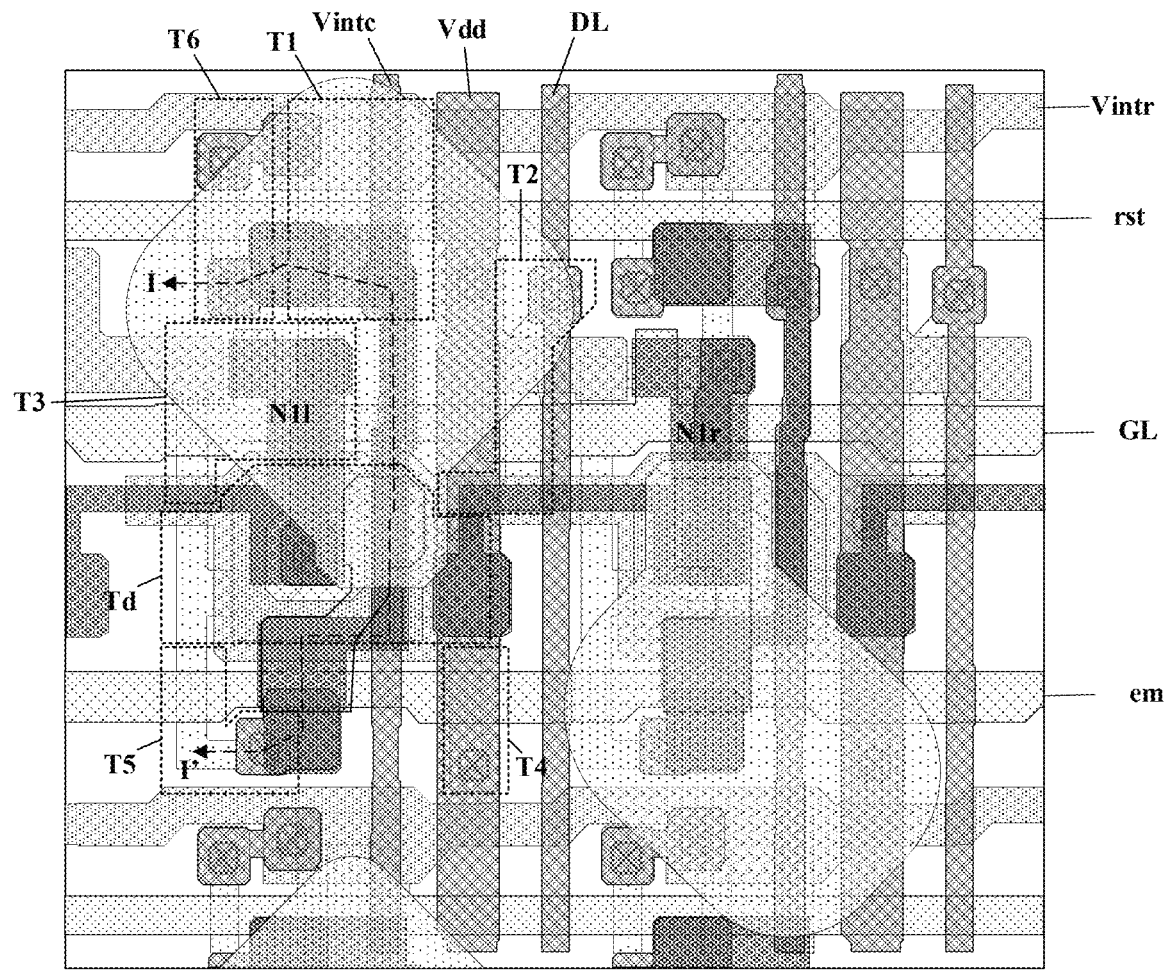
FIG. 11A is a diagram illustrating the structure of an array substrate in some embodiments according to the present disclosure.
Figure 11B:
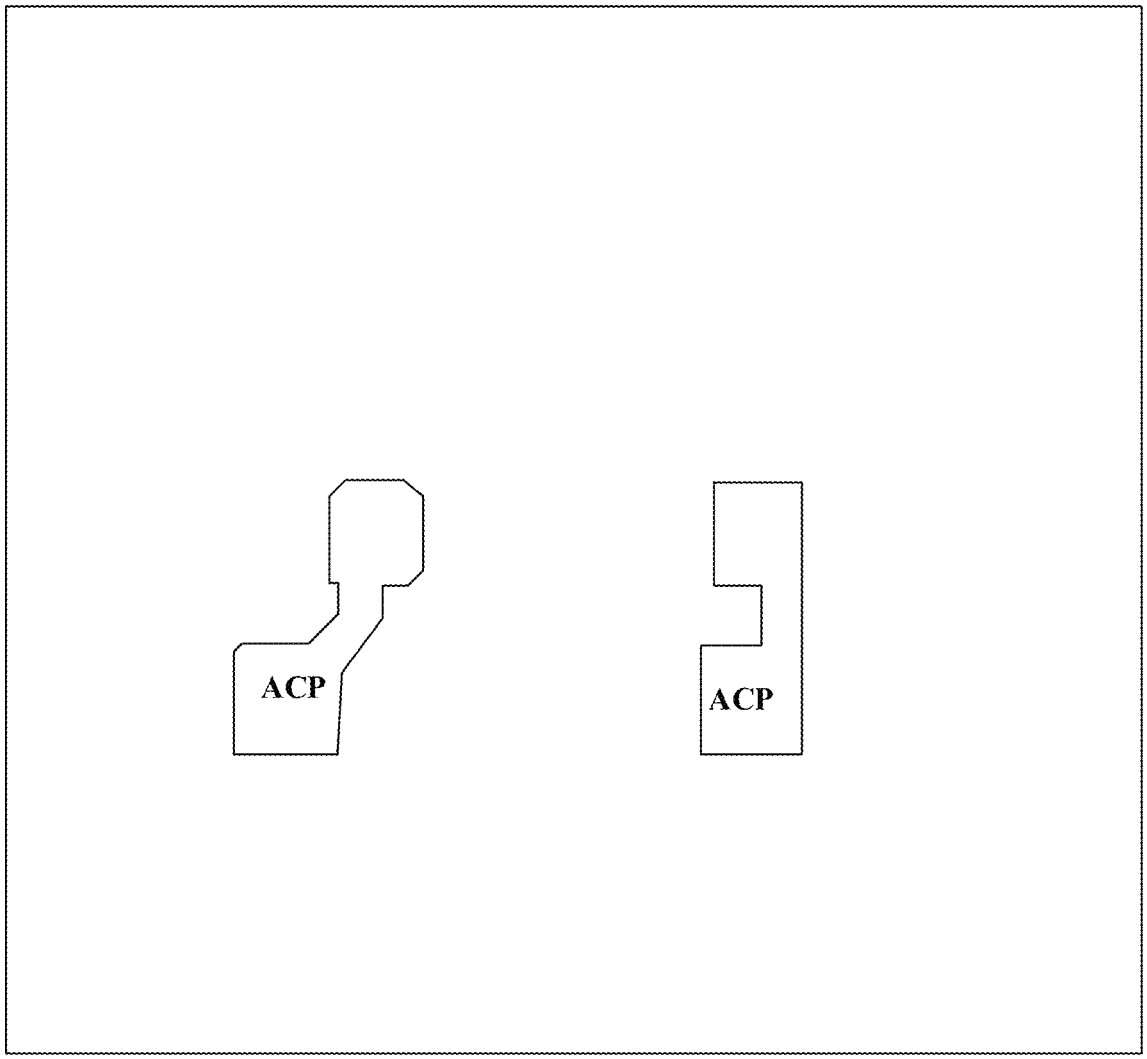
FIG. 11B is a diagram illustrating the structure of an anode connecting pad layer in an array substrate depicted in FIG. 11A.
Figure 11C:
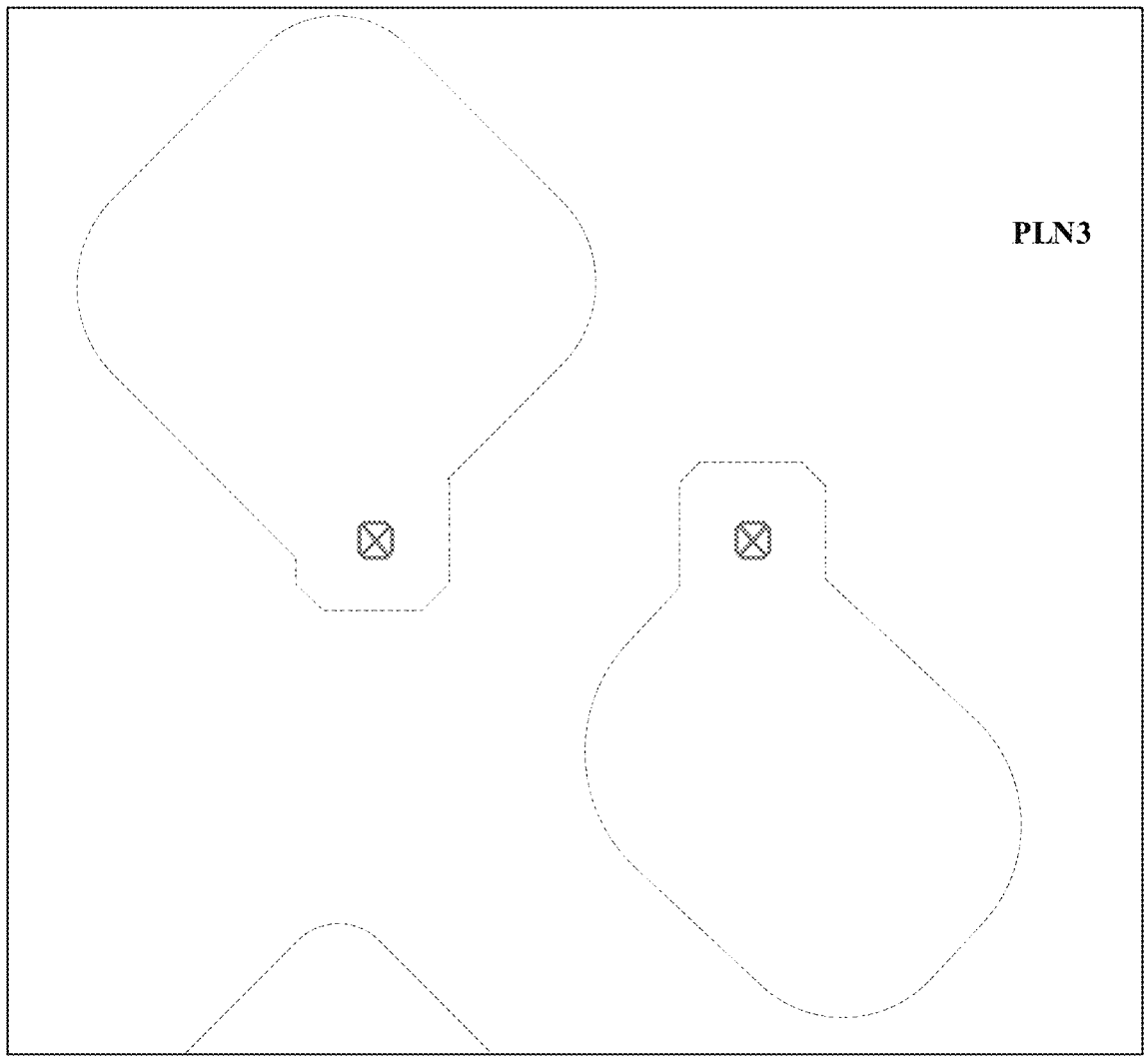
FIG. 11C is a diagram illustrating the structure of a third planarization layer in an array substrate depicted in FIG. 11A.
Figure 11D:
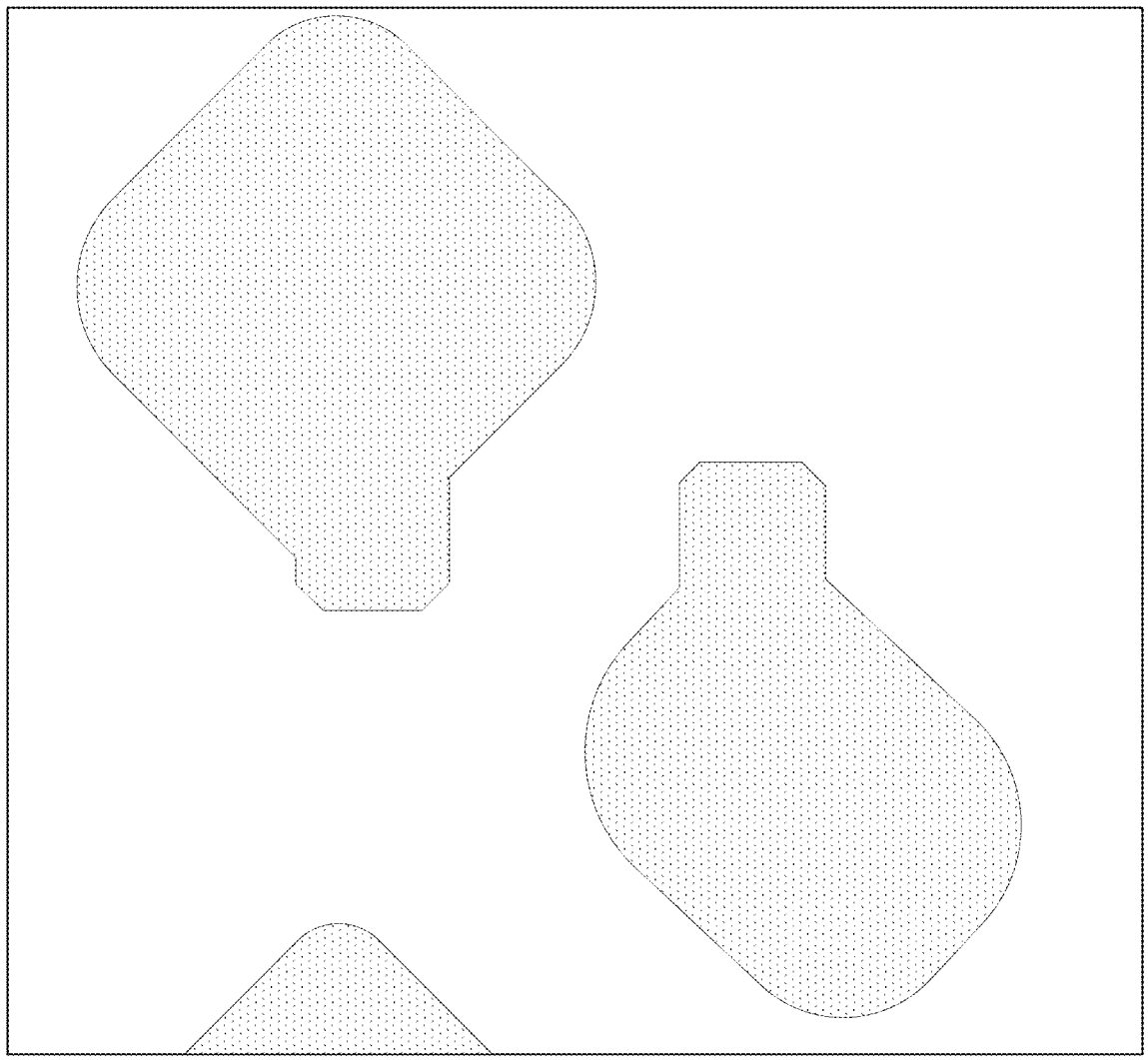
FIG. 11D is a diagram illustrating the structure of an anode layer in an array substrate depicted in FIG. 11A.
Figure 12:
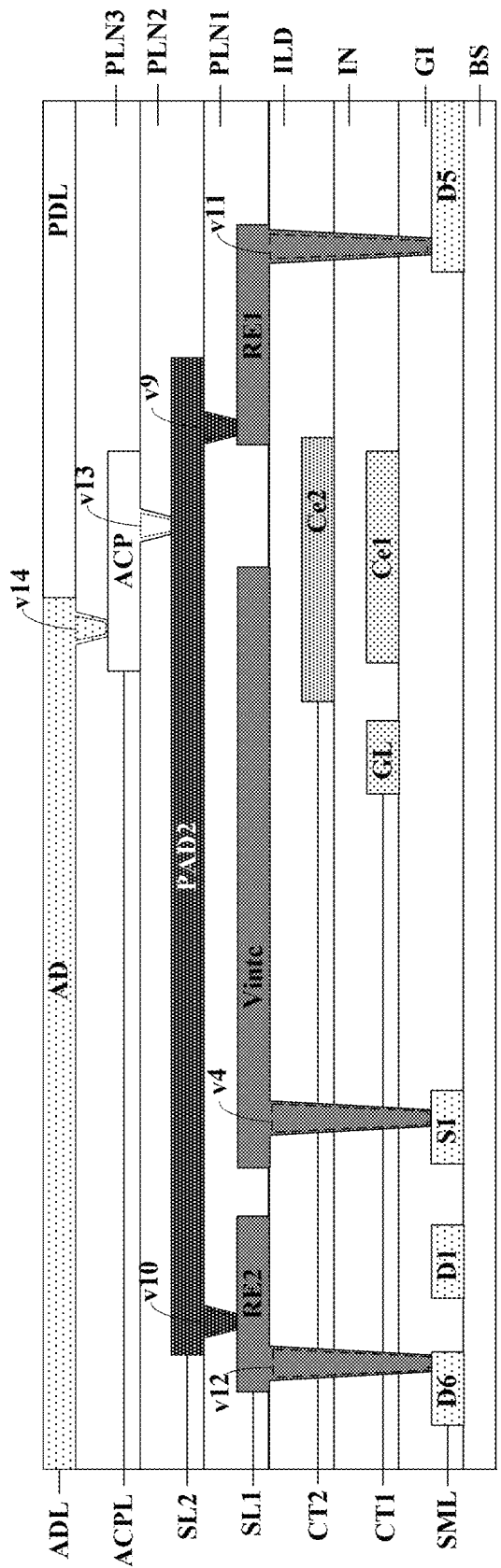
FIG. 12 is a cross-sectional view along an I-I' line in FIG. 11A.

Various appropriate anode layouts may be implemented in the array substrate depicted in FIG. 3A or FIG. 8A. FIG. 11A is a diagram illustrating the structure of an array substrate in some embodiments according to the present disclosure. FIG. 11B is a diagram illustrating the structure of an anode connecting pad layer in an array substrate depicted in FIG. 11A. FIG. 11C is a diagram illustrating the structure of a third planarization layer in an array substrate depicted in FIG. 11A. FIG. 11D is a diagram illustrating the structure of an anode layer in an array substrate depicted in FIG. 11A. FIG. 12 is a cross-sectional view along an I-I' line in FIG. 11A. FIG. 11A to FIG. 11D, and FIG. 12 illustrate an exemplary anode layout in an array substrate according to the present disclosure.

Referring to FIG. 11A to FIG. 11D, and FIG. 12, in some embodiments, the array substrate includes a base substrate BS, a semiconductor material layer SML on the base substrate BS, a gate insulating layer G1 on a side of the semiconductor material layer SML away from the base substrate BS, a first conductive layer CT1 on a side of the gate insulating layer G1 away from the semiconductor material layer SML, an insulating layer IN on a side of the first conductive layer away from the gate insulating layer G1, a second conductive layer CT2 on a side of the insulating layer IN away from the first conductive layer CT1, an inter-layer dielectric layer ILD on a side of the second conductive layer CT2 away from the insulating layer IN, a first signal line layer SL1 on a side of the inter-layer dielectric layer ILD away from the second conductive layer CT2, a first planarization layer PLN1 on a side of the first signal line layer SL1 away from the inter-layer dielectric layer ILD, a second signal line layer SL2 on a side of the first planarization layer PLN1 away from the first signal line layer SL1, a second planarization layer PLN2 on a side of the second signal line layer SL2 away from the first planarization layer PLN1, an anode connecting pad layer ACPL on a side of the second planarization layer PLN2 away from the second signal line layer SL2, a third planarization layer PLN3 on a side of the anode connecting pad layer ACPL away from the second planarization layer PLN2, and an anode layer ADL on a side of the third planarization layer PLN3 away from the anode connecting pad layer ACPL.

Referring to FIG. 11A, FIG. 11B, and FIG. 12, the anode connecting pad layer in some embodiments includes an anode connecting pad ACP in a respective pixel driving circuit. The anode connecting pad ACP connects an anode of a light emitting element in the respective pixel driving circuit to a first pad PAD1 in the respective pixel driving circuit. Various appropriate conductive materials and various appropriate fabricating methods may be used to make the anode connecting pad layer. For example, a conductive material may be deposited on the substrate by a plasma-enhanced chemical vapor deposition (PECVD) process and patterned. Examples of appropriate conductive materials for making the anode connecting pad layer include, but are not limited to, metal oxide materials such as indium tin oxide, and metallic materials such as aluminum, copper, molybdenum, chromium, aluminum copper alloy, copper molybdenum alloy, molybdenum aluminum alloy, aluminum chromium alloy, copper chromium alloy, molybdenum chromium alloy, copper molybdenum aluminum alloy, and the like.

Vias extending through the third planarization layer PLN3 are depicted in FIG. 11C. In FIG. 11C, corresponding positions of a plurality of anodes are depicted in dotted lines.

Referring to FIG. 11A, FIG. 11D, and FIG. 12, the array substrate further includes an anode layer. A respective anode is connected to an anode connecting pad through a respective via extending through the third planarization layer PLN3.

Referring to Referring to FIG. 11A, FIG. 11B, and FIG. 12, in some embodiments, the second pad PAD2 is connected to a first relay electrode RE1 in the first signal line layer SL1 through a ninth via v9 extending through the first planarization layer PLN1, and is connected to a second relay electrode RE2 in the first signal line layer SL1 through a tenth via v10 extending through the first planarization layer PLN1. The first relay electrode RE1 is connected to the drain electrode D5 of the fifth transistor T5 through an eleventh via v11 extending through the inter-layer dielectric layer ILD, the insulating layer IN, and the gate insulating layer G1. The second relay electrode RE2 is connected to the drain electrode D6 of the sixth transistor T6 through a twelfth via v12 extending through the inter-layer dielectric layer ILD, the insulating layer IN, and the gate insulating layer G1. The anode connecting pad ACP is connected to the second pad PAD2 through a thirteenth via v13 extending through the second planarization layer PLN2. The anode AD is connected to the anode connecting pad ACP through a fourteenth via v14 extending through a third planarization layer PLN3.

In some embodiments, the array substrate includes a connecting line layer (e.g., the anode connecting pad layer ACPL in FIG. 12) on a side of the second signal line layer away from the base substrate. The connecting line layer includes a plurality of connecting lines (e.g., the anode connecting pad ACP). The array substrate further includes an anode layer ADL on a side of the connecting line layer away from the base substrate. The second pad PAD2 is connected to a respective anode AD through a respective connecting line (e.g., the anode connecting pad ACP in FIG. 12) of the plurality of connecting lines. Optionally, the respective connecting line is made of a transparent conducting material such as a transparent metal oxide.

As shown in FIG. 11A, first nodes respectively in different pixel driving circuits are situated in environments having different anode layouts. In the context of the present disclosure, a respective first node may include a portion of the semiconductor material layer between a source electrode of a first transistor and a drain electrode of the driving transistor. Referring to FIG. 11A, the first node on the left N1*l* (in the pixel driving circuit on the left) and the first node on the right N1*r* (in the pixel driving circuit on the right) are situated in environments having different anode layouts. For example, an upper portion of the first node on the left N1*l* is completely covered by an anode on the left with a lower left corner uncovered; whereas an upper portion of the first node on the right N1*r* is completely uncovered by an anode on the right with a lower portion covered. Moreover, a greater percentage of the first node on the left N1*l* is covered as compared to the first node on the right N1*r*. Because the first nodes respectively in different pixel driving circuits are situated in environments having different anode layouts, without the first pads according to the present disclosure, effects of anodes on the first nodes could vary to different degrees, resulting in display non-uniformity. By having the first pads respectively in the pixel driving circuits, the first nodes respectively underneath the first pads can be situated in a highly uniform environment.

Referring to FIG. 3A to FIG. 3J, FIG. 4A to FIG. 4D, FIG. 7A to FIG. 7J, FIG. 8A to FIG. 8D, FIG. 11A to FIG. 11D, and FIG. 12, in some embodiments, a respective pixel driving circuit includes a node connecting line Cln in a first signal line layer SL1; and a first pad PAD1 in a second signal line layer SL2. The node connecting line Cln connects a first capacitor electrode Ce1 in the respective pixel driving circuit and a portion of a semiconductor material layer SML together, the portion of the semiconductor material layer SML being between a source electrode S1 of a first transistor T1 and a drain electrode Dd of the driving transistor Td. An orthographic projection of the first pad PAD1 on a base substrate BS at least partially overlaps with an orthographic projection of the node connecting line Cln on the base substrate BS. Optionally, the orthographic projection of the first pad PAD1 on a base substrate BS covers the orthographic projection of the node connecting line Cln on the base substrate BS. Optionally, the orthographic projection of the first pad PAD1 on a base substrate BS at least partially overlaps with an orthographic projection of an active layer ACT3 of a third transistor T3 on the base substrate BS. Optionally, the orthographic projection of the first pad PAD1 on a base substrate BS at least partially overlaps with an orthographic projection of a first gate protrusion GP1 of a respective gate line of a plurality of gate lines GL on the base substrate BS.

In some embodiments, the first pad PAD1 is configured to receive a continuous direct current.

In some embodiments, the respective pixel driving circuit further includes a second pad PAD2 in the second signal line layer SL2. The second pad PAD2 is connected to a drain electrode D5 of a fifth transistor T5 and a drain electrode D6 of a sixth transistor T6, and electrically connected to an anode of a light emitting element connected to the respective pixel driving circuit. Optionally, an orthographic projection of the second pad PAD2 on the base substrate BS at least partially overlaps with an orthographic projection of a signal line in the first signal line layer on the base substrate BS. Optionally, the signal line is configured to transmit a continuous direct current.

In some embodiments, the first pad PAD1 and the second pad PAD2 cross over a respective gate line of the plurality of gate lines GL.

In some embodiments, a portion of the second pad PAD2 extends along a direction substantially parallel to an extension direction of a respective second reset signal line of a plurality of second reset signal lines Vintc. Optionally, an orthographic projection of the respective second reset signal line on the base substrate BS at least partially overlaps with an orthographic projection of the portion of the second pad PAD2 on the base substrate BS.

In some embodiments, a portion of the second pad PAD2 extends along a direction substantially parallel to an extension direction of a respective voltage supply line of a plurality of voltage supply lines VDD. Optionally, an orthographic projection of the respective voltage supply line on the base substrate BS at least partially overlaps with an orthographic projection of the portion of the second pad PAD2 on the base substrate BS.

In some embodiments, the second pad PAD2 is connected to a first relay electrode RE1 in the first signal line layer SL1 through a ninth via v9, and connected to a second relay electrode RE2 in the first signal line layer SL1 through a tenth via v10. Optionally, the first relay electrode RE1 is connected to a drain electrode D5 of a fifth transistor T5 through an eleventh via v11. Optionally, the second relay electrode RE2 is connected to a drain electrode D6 of a sixth transistor T6 through a twelfth via v12.

In some embodiments, the first pad PAD1 is configured to receive a reset signal. Optionally, the first pad PAD1 is connected to two adjacent first reset signal lines of a plurality of first reset signal lines Vintr in a same layer, forming an interconnected first reset signal network. Optionally, the array substrate further includes a plurality of reset signal transmission lines vtl in the semiconductor material layer SML. A respective reset signal transmission line of the plurality of reset signal transmission lines vtl connects source electrodes of first transistors and sixth transistors in a row of pixel driving circuit together.

In some embodiments, the first pad PAD1 is configured to receive a voltage supply signal. Optionally, the first pad PAD1 is connected to a respective voltage supply line of a plurality of voltage supply lines VDD in an adjacent pixel driving circuit. Optionally, the first pad PAD1 crosses over a respective data line of a plurality of data lines DL.

In some embodiments, the plurality of pixel driving circuits include at least a first pixel driving circuit and a second pixel driving circuit. Optionally, orthographic projections of a first node connecting line in the first pixel driving circuit and a second node connecting line in the second pixel driving circuit on the base substrate respectively overlap with orthographic projections of a first anode in the first pixel driving circuit and a second anode in the second pixel driving circuit on the base substrate, at different portions, respectively, and by different percentages.

In some embodiments, the respective pixel driving circuit includes a driving transistor Td and a compensation transistor (e.g., the third transistor T3) configured to provide a compensation voltage signal to a gate electrode of the driving transistor. The compensation transistor includes a source electrode, a drain electrode and a gate electrode. The node connecting line Cln connects a gate electrode of the driving transistor Td in the first pixel driving circuit and a drain electrode of the compensation transistor (e.g., D3 of the third transistor T3) in the first pixel driving circuit. The second node connecting line connects a gate electrode of a driving transistor in the second pixel driving circuit with a drain electrode of a compensation transistor in the second pixel driving circuit. A voltage level at the first node N1 is the same as a voltage level at the gate electrode of the driving transistor in the first pixel driving circuit. A voltage level at the second node N2 is the same as a voltage level at the gate electrode of the driving transistor in the second pixel driving circuit.

Figure 13A:
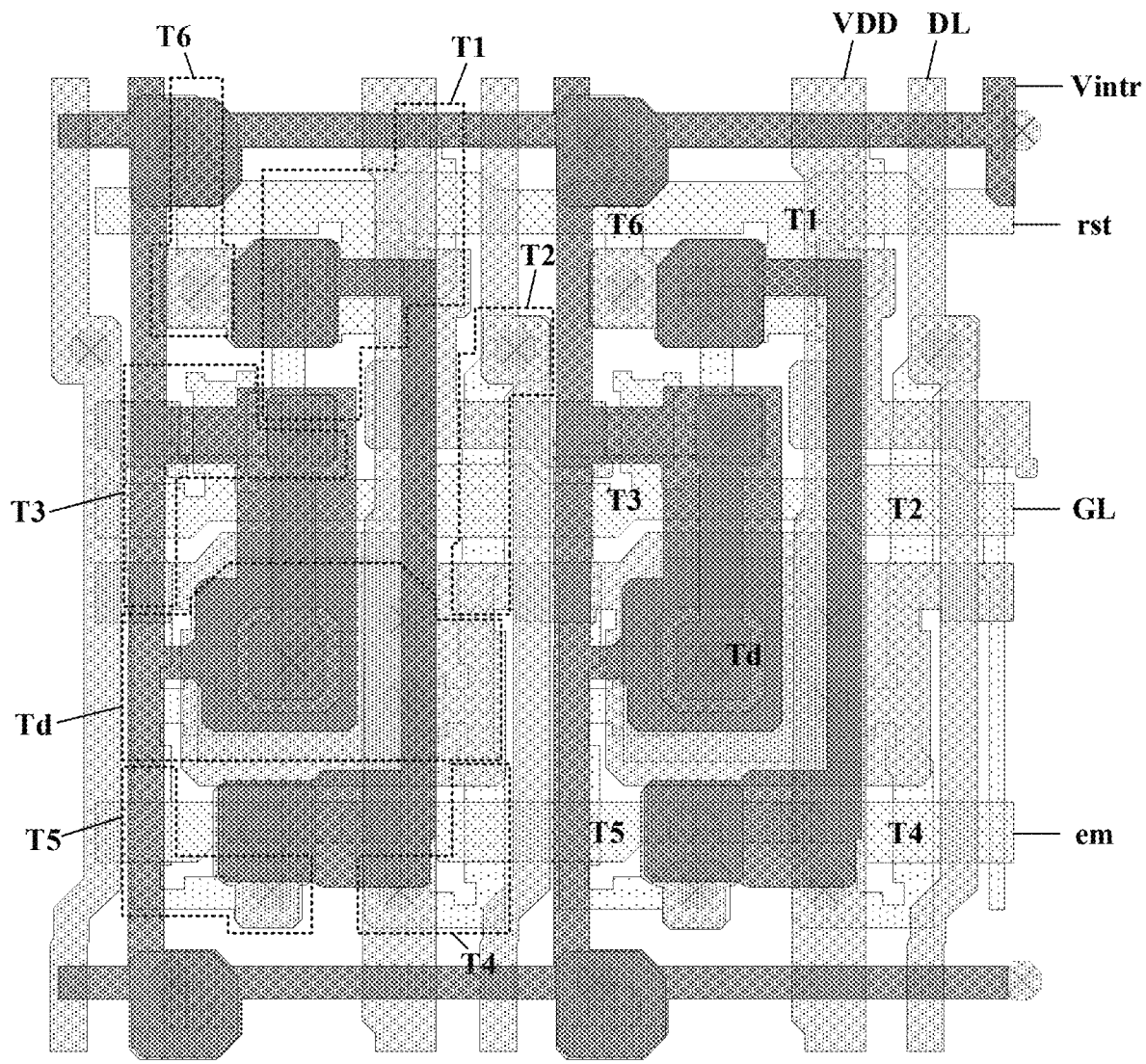
FIG. 13A is a diagram illustrating the structure of an array substrate in some embodiments according to the present disclosure.

FIG. 13A is a diagram illustrating the structure of an array substrate in some embodiments according to the present disclosure. The array substrate depicted in FIG. 13A is similar to the array substrate depicted in FIG. 3A except for that the structure of the second signal layer in the array substrate depicted in FIG. 13A is different from the structure of the second signal layer in the array substrate depicted in FIG. 3A.

Figure 13B:
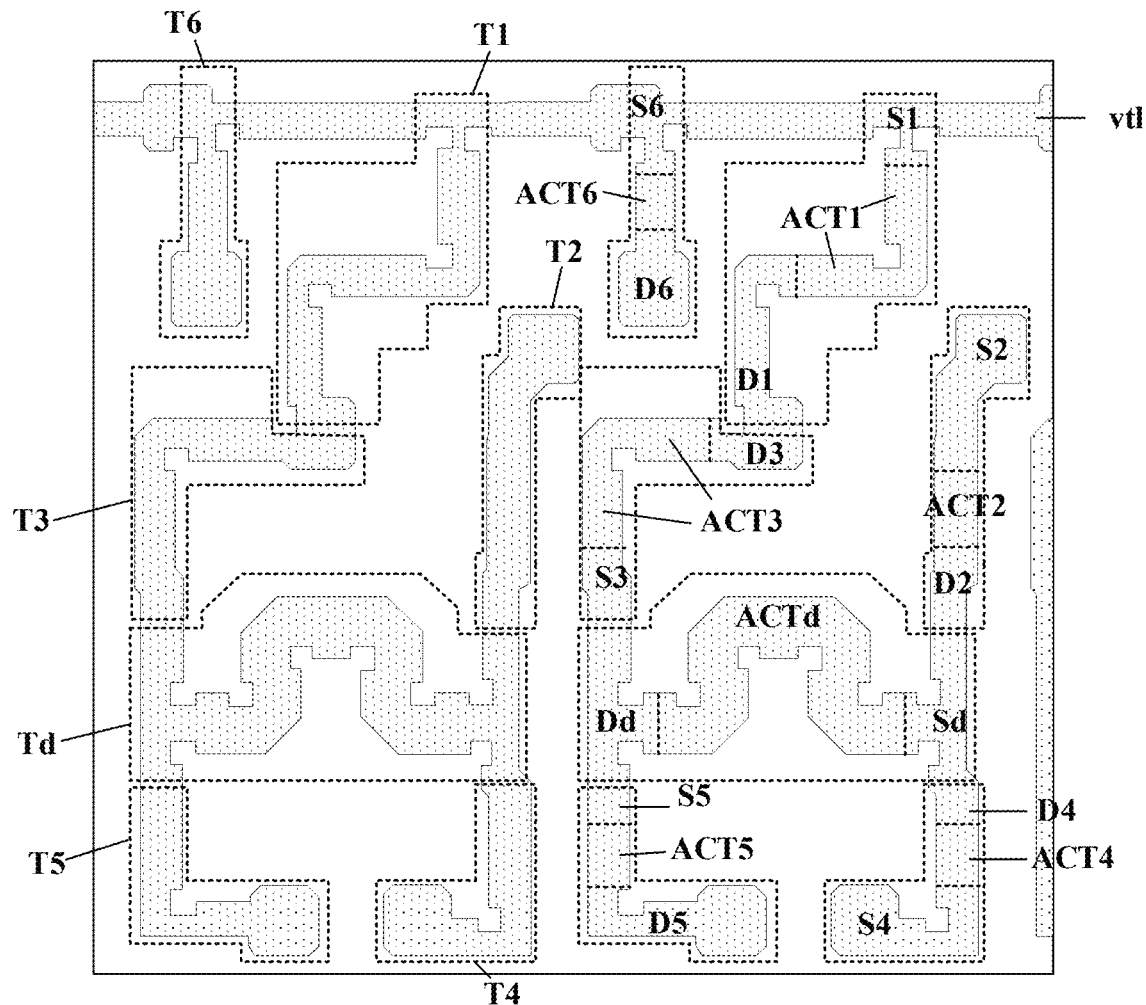
FIG. 13B is a diagram illustrating the structure of a semiconductor material layer in an array substrate depicted in FIG. 13A.
Figure 13C:
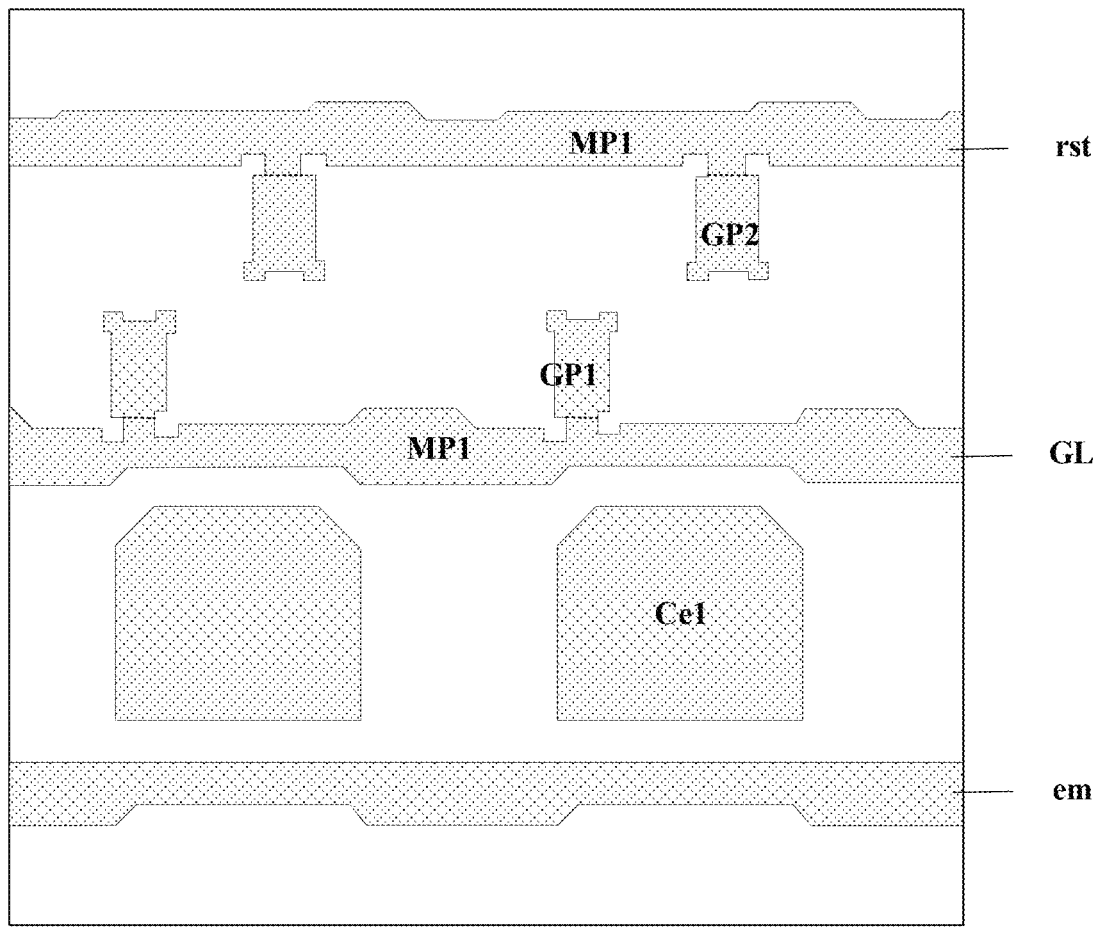
FIG. 13C is a diagram illustrating the structure of a first conductive layer in an array substrate depicted in FIG. 13A.
Figure 13D:
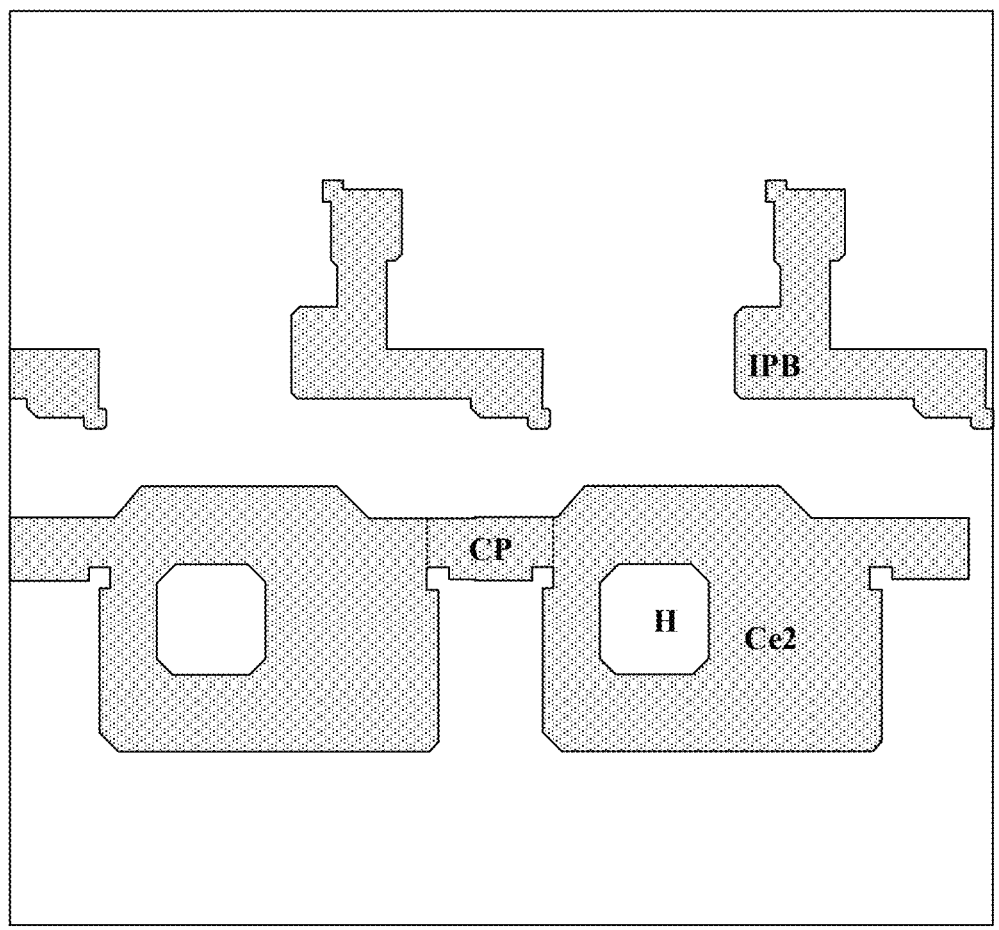
FIG. 13D is a diagram illustrating the structure of a second conductive layer in an array substrate depicted in FIG. 13A.
Figure 13E:
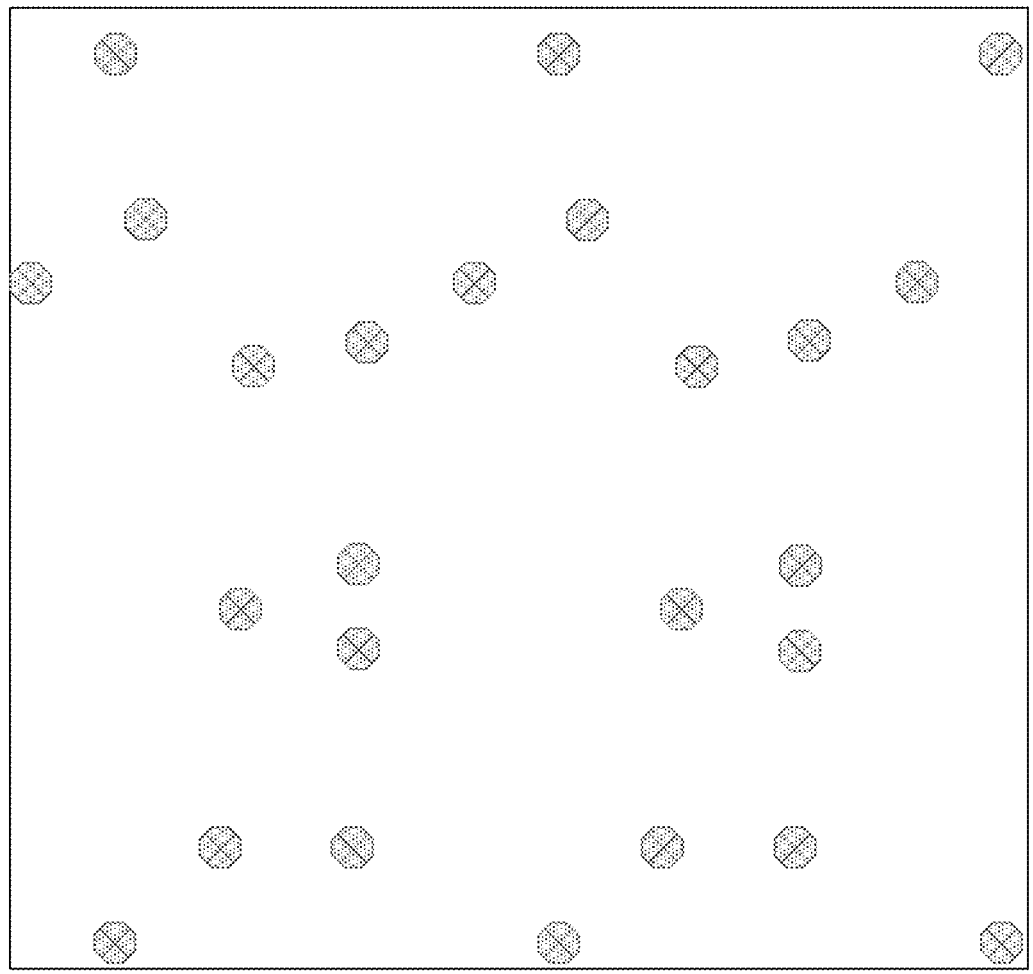
FIG. 13E is a diagram illustrating the structure of an inter-layer dielectric layer in an array substrate depicted in FIG. 13A.
Figure 13F:
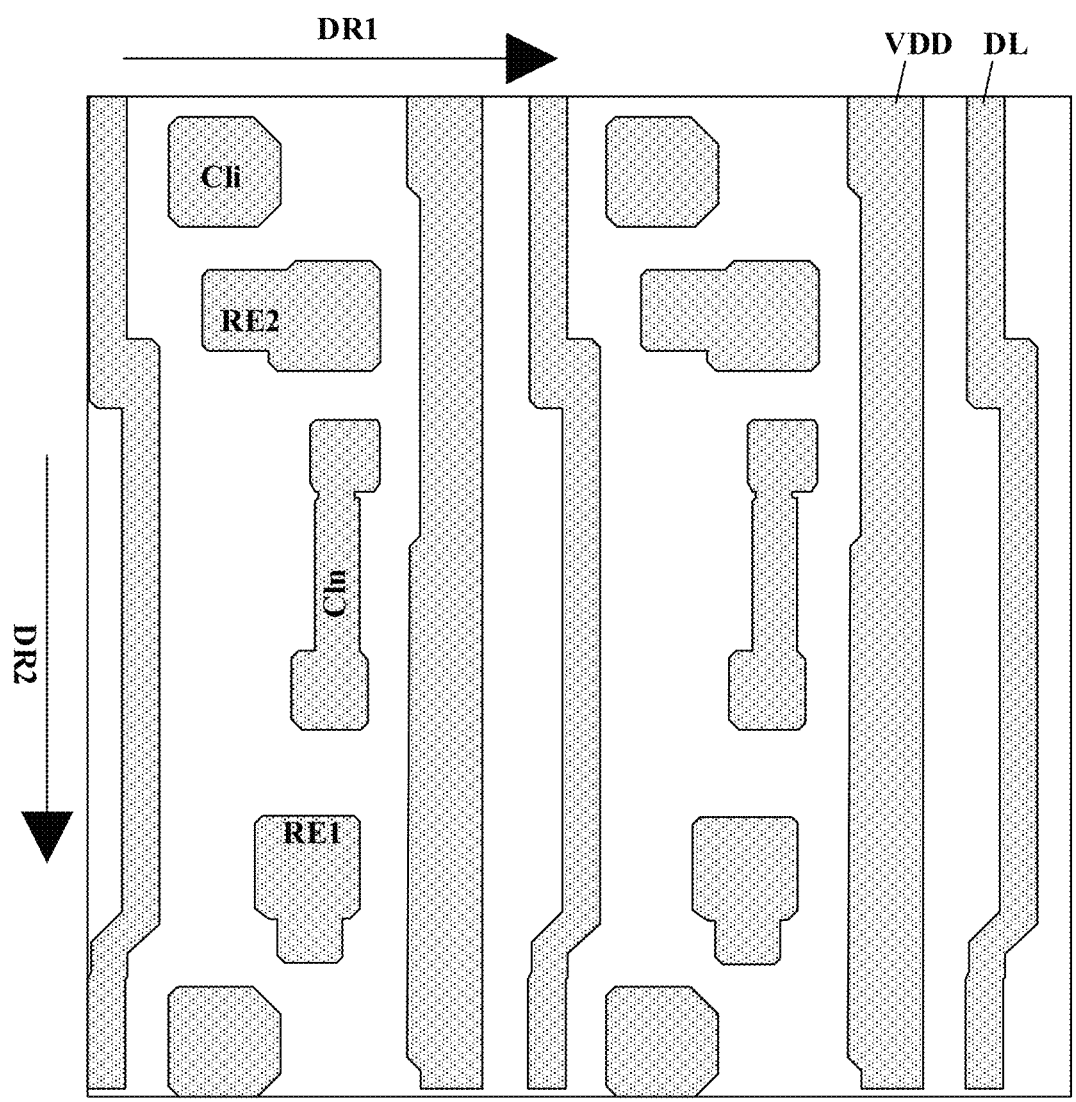
FIG. 13F is a diagram illustrating the structure of a first signal line layer in an array substrate depicted in FIG. 13A.
Figure 13G:
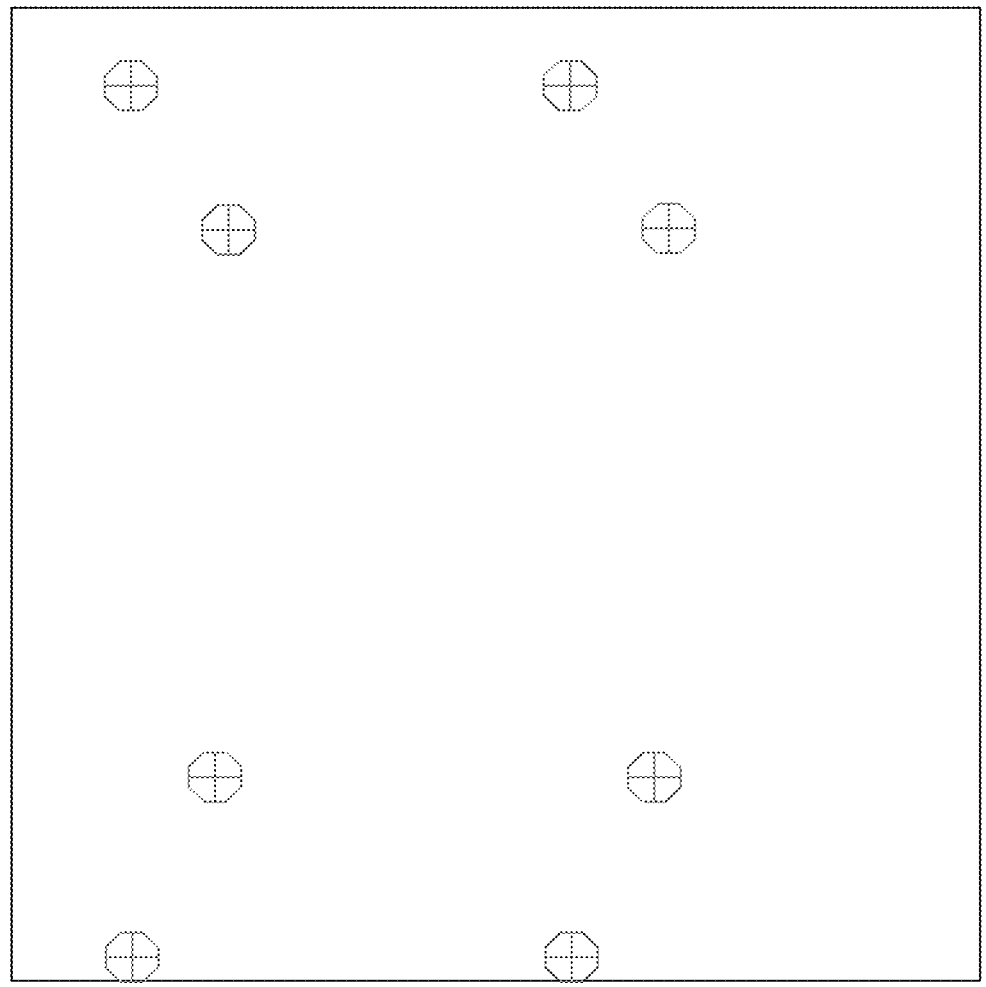
FIG. 13G is a diagram illustrating the structure of a passivation layer in an array substrate depicted in FIG. 13A.
Figure 13H:
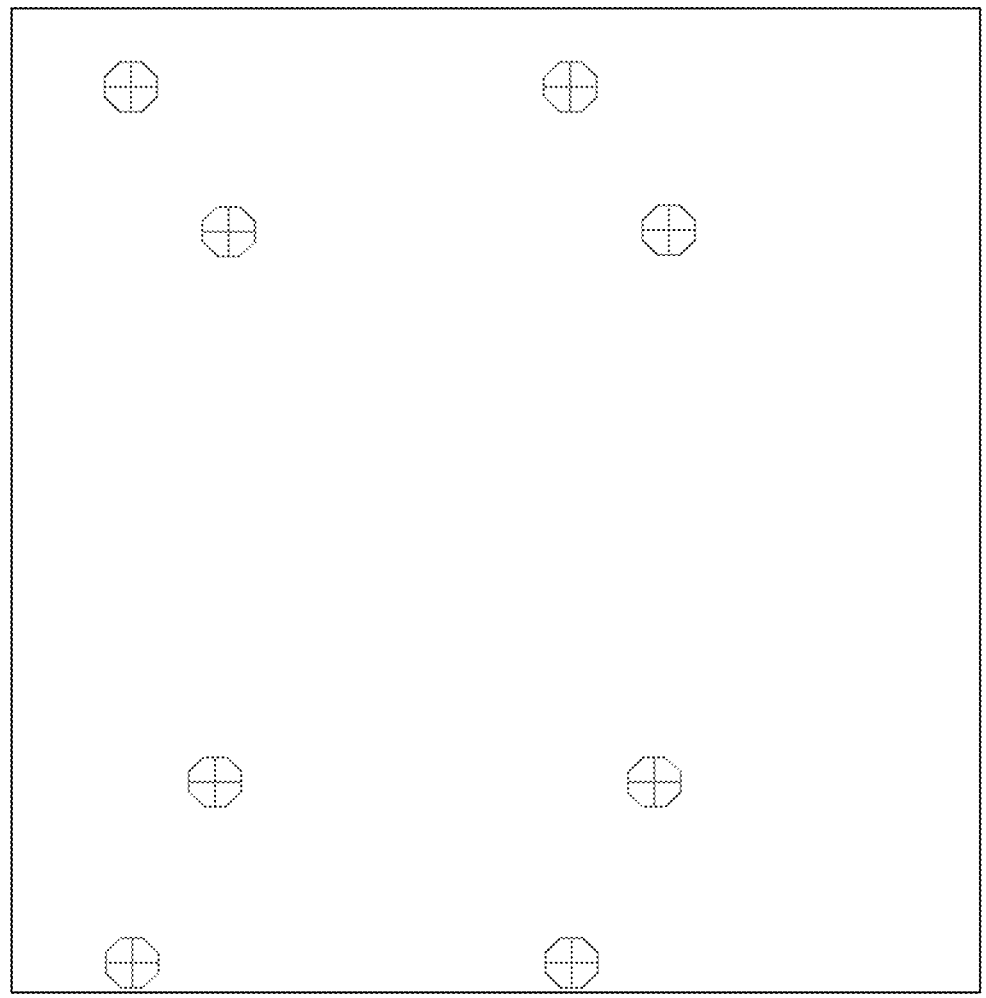
FIG. 13H is a diagram illustrating the structure of a first planarization layer in an array substrate depicted in FIG. 13A.
Figure 13I:
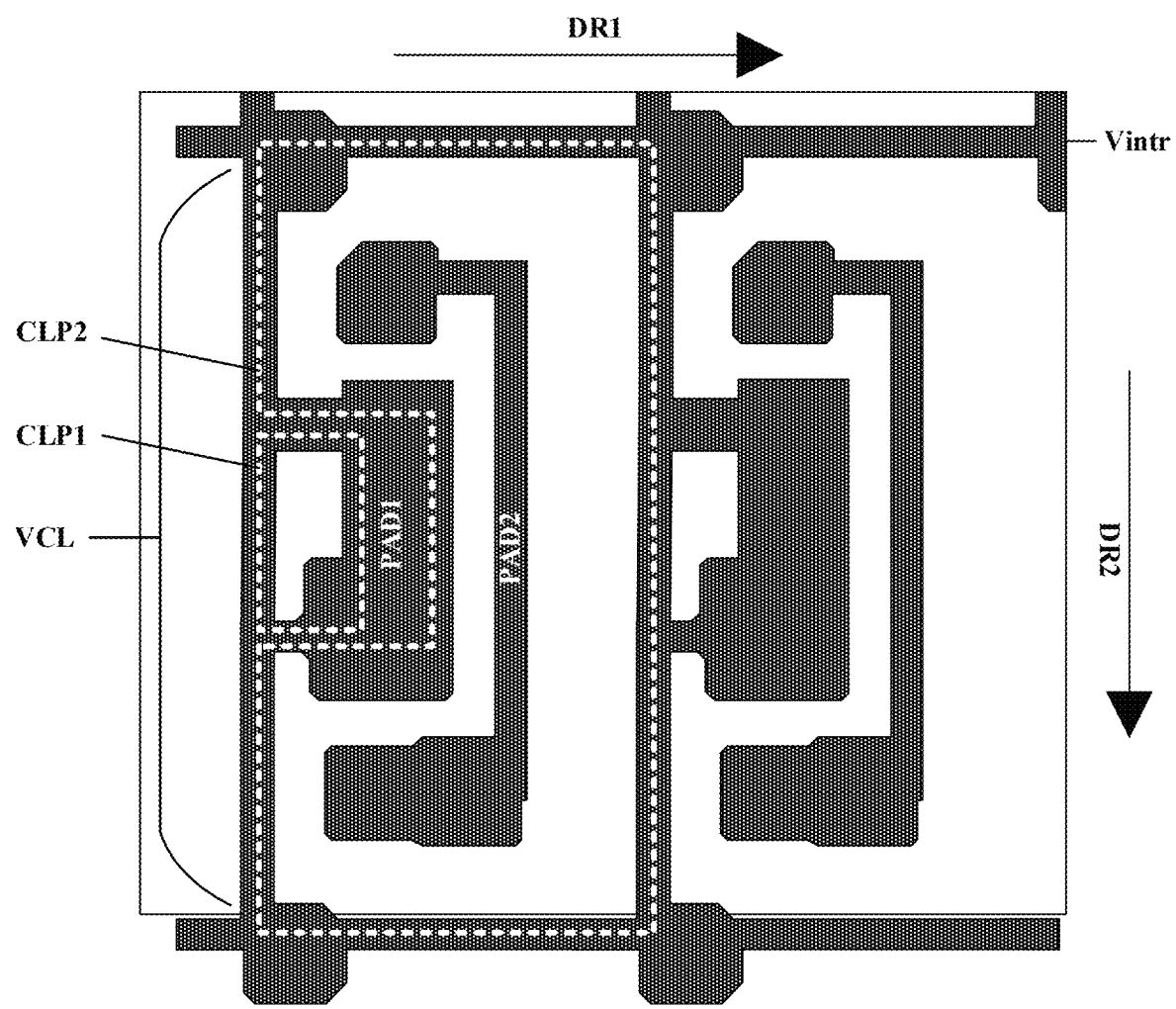
FIG. 13I is a diagram illustrating the structure of a second signal line layer in an array substrate depicted in FIG. 13A.
Figure 13J:
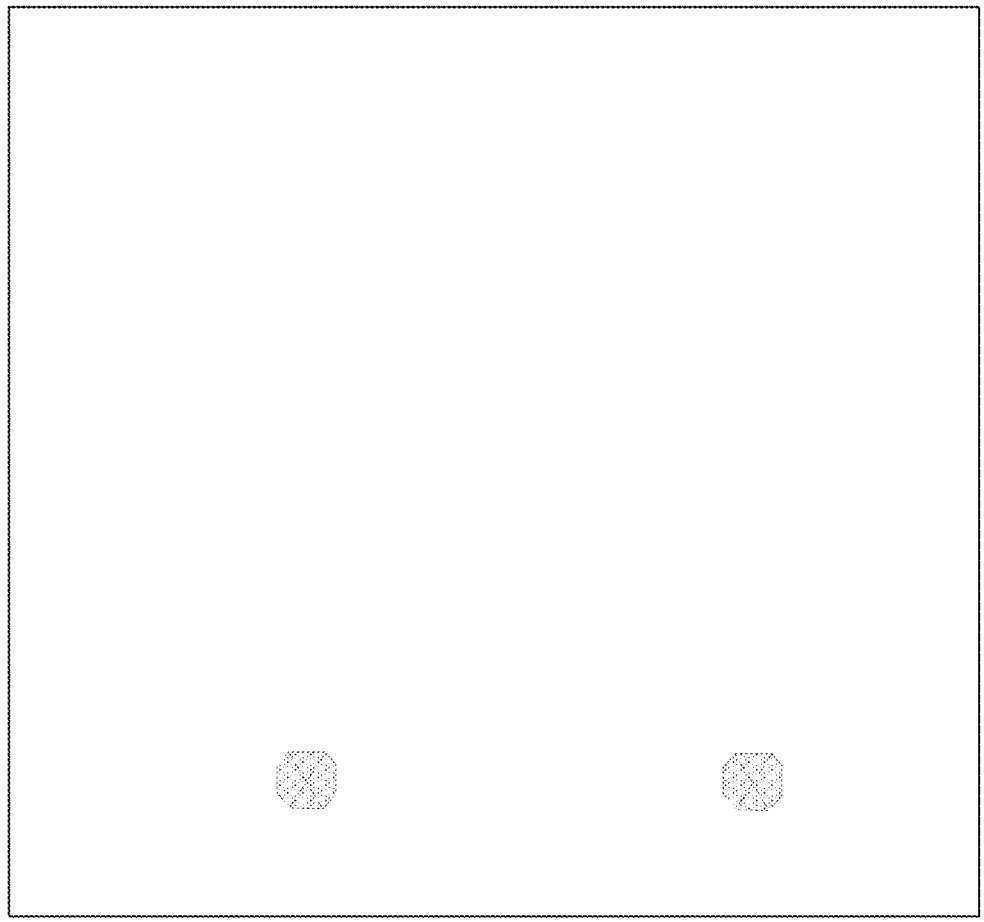
FIG. 13J is a diagram illustrating the structure of a second planarization layer in an array substrate depicted in FIG. 13A.

FIG. 13B is a diagram illustrating the structure of a semiconductor material layer in an array substrate depicted in FIG. 13A. FIG. 13C is a diagram illustrating the structure of a first conductive layer in an array substrate depicted in FIG. 13A. FIG. 13D is a diagram illustrating the structure of a second conductive layer in an array substrate depicted in FIG. 13A. FIG. 13E is a diagram illustrating the structure of an inter-layer dielectric layer in an array substrate depicted in FIG. 13A. FIG. 13F is a diagram illustrating the structure of a first signal line layer in an array substrate depicted in FIG. 13A. FIG. 13G is a diagram illustrating the structure of a passivation layer in an array substrate depicted in FIG. 13A. FIG. 13H is a diagram illustrating the structure of a first planarization layer in an array substrate depicted in FIG. 13A. FIG. 13I is a diagram illustrating the structure of a second signal line layer in an array substrate depicted in FIG. 13A. FIG. 13J is a diagram illustrating the structure of a second planarization layer in an array substrate depicted in FIG. 13A. The first pad PAD1 in the array substrate depicted in FIG. 13A and FIG. 13I is part of a closed loop; whereas the first pad PAD1 in the array substrate depicted in FIG. 3A and FIG. 3I is part of an open loop.

In some embodiments, a respective pixel driving circuit in the array substrate includes a node connecting line Cln in a first signal line layer; and a first pad PAD1 in a second signal line layer on a side of the first signal line layer away from the base substrate. The respective pixel driving circuit in the array substrate further includes a voltage line configured to output a constant voltage signal, and a voltage connecting line VCL electrically connecting the first pad PAD1 with the voltage line. In FIG. 13I, a respective first reset signal line of a plurality of first reset signal lines Vintr may be considered as the voltage line configured to output a constant reset voltage signal. The voltage line is electrically connected to a source electrode of the sixth transistor. For example, as shown in FIG. 2A and FIG. 2B, a source electrode of the sixth transistor T6 is electrically connected to the respective one of the plurality of first reset signal lines Vintr (e.g., the voltage line).

In some embodiments, the voltage connecting line VCL electrically connects the plurality of first reset signal lines Vintr together, forming a reset signal line network. As shown in FIG. 13I, the first pad PAD1 and a first portion of the voltage connecting line VCL form a first closed loop CLP1. The first pad PAD1, a second portion of the voltage connecting line VCL, and a portion of the voltage line (e.g., the respective one of the plurality of first reset signal lines Vintr) are parts of a second closed loop CLP2. More specifically, the second closed loop CLP2 includes the first pad PAD1, the second portion of the voltage connecting line VCL, a voltage connecting line VCL in an adjacent pixel driving circuit, and portions of two adjacent voltage lines (e.g., portions of two adjacent first reset signal lines of the plurality of first reset signal lines Vintr).

The inventors of the present disclosure discover that, surprisingly and unexpectedly, by having the first pad PAD1 as a part of a closed loop, the first pad PAD1 is configured to better ensure that first nodes respectively in different pixel driving circuits are situated in a similar environment, as compared to an array substrate in which the first pad is a part of an open loop (see, e.g., FIG. 3I).

In some embodiments, the respective pixel driving circuit includes a driving transistor Td and a compensation transistor (e.g., the third transistor T3) configured to provide a compensation voltage signal to a gate electrode of the driving transistor. The compensation transistor includes a source electrode, a drain electrode and a gate electrode. The node connecting line Cln connects the gate electrode of the driving transistor Td and a drain electrode of the compensation transistor (e.g., D3 of the third transistor T3).

Referring to FIG. 13A to FIG. 13J, in some embodiments, an orthographic projection of the voltage line and the voltage connecting line VCL on the base substrate is spaced apart from the orthographic projection of the node connecting line Cln on the base substrate. An orthographic projection of the first pad PAD1 on a base substrate at least partially overlaps with an orthographic projection of the node connecting line Cln on the base substrate. The orthographic projection of the first pad PAD1 on the base substrate at least partially overlaps with an orthographic projection of an active layer of the compensation transistor (e.g., the third transistor T3) on the base substrate, see, e.g., FIG. 4A depicts that the orthographic projection of the first pad PAD1 on the base substrate BS at least partially overlaps with an orthographic projection of the active layer ACT3 of the third transistor (compensation transistor) on the base substrate BS.

Referring to FIG. 13A to FIG. 13J, in some embodiments, the node connecting line Cln has a length along a first direction DR1 less than a length along a second direction DR2. The voltage line (e.g., each of the plurality of first reset signal lines Vintr) has a length along the first direction DR1 less than a length along the second direction DR2. The first direction DR1 and the second direction DR2 cross over each other. In some embodiments, a length of the second pad PAD2 along the first direction DR1 is greater than a length of the first pad PAD1 along the first direction DR1; a length of the second pad PAD2 along the second direction DR2 is greater than a length of the first pad PAD1 along the second direction DR2. As shown in FIG. 13I, in some embodiments, the second pad PAD2 at least partially (e.g., at least 30%, at least 35%, at least 40%, at least 45%, at least 50%, at least 55%, at least 60%, at least 65%, or at least 70%) surrounds the first pad PAD1.

Figure 14A:
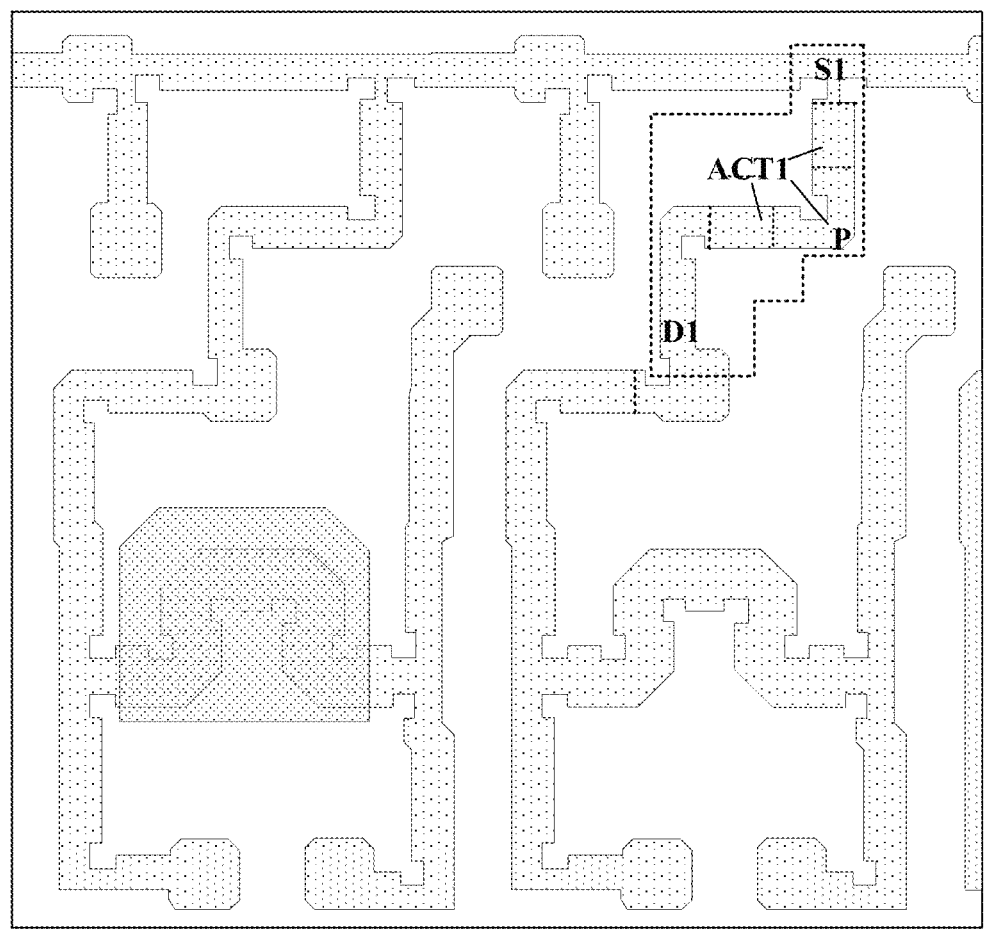
FIG. 14A illustrates the structure of a semiconductor material layer in some embodiments according to the present disclosure.
Figure 14B:
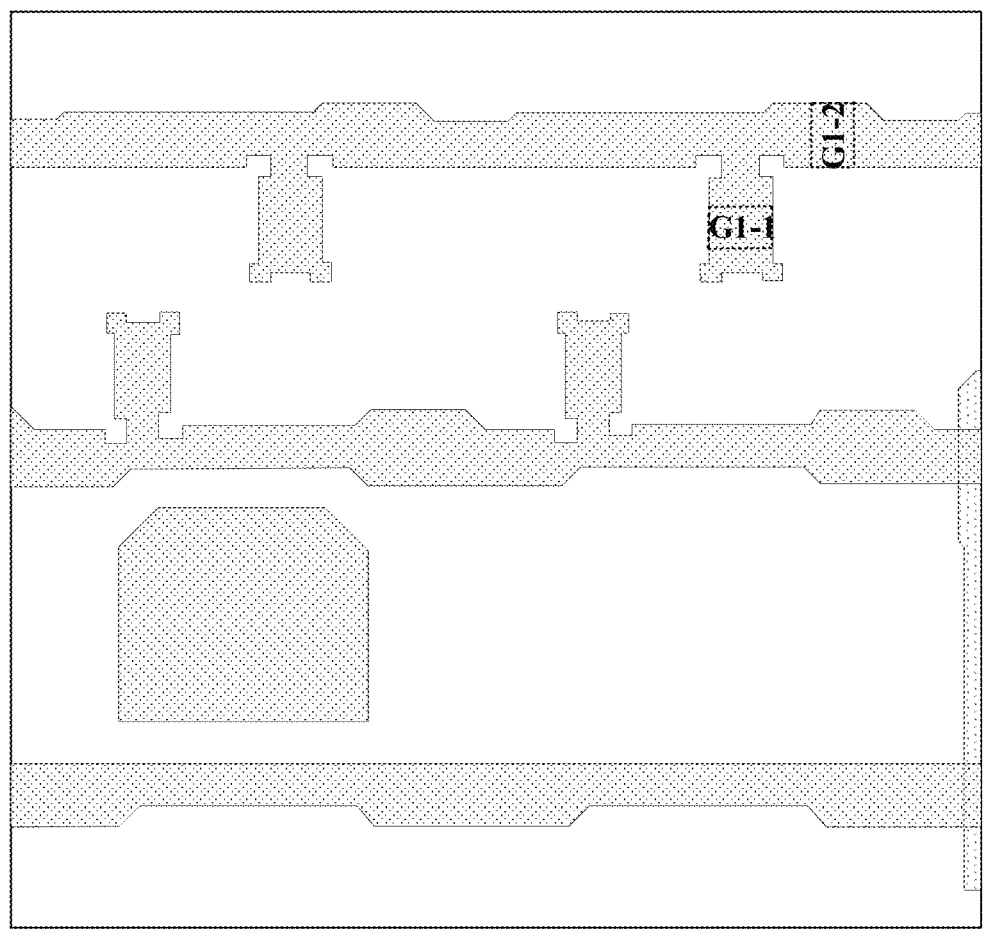
FIG. 14B illustrates the structure of a first conductive layer in some embodiments according to the present disclosure.
Figure 14C:
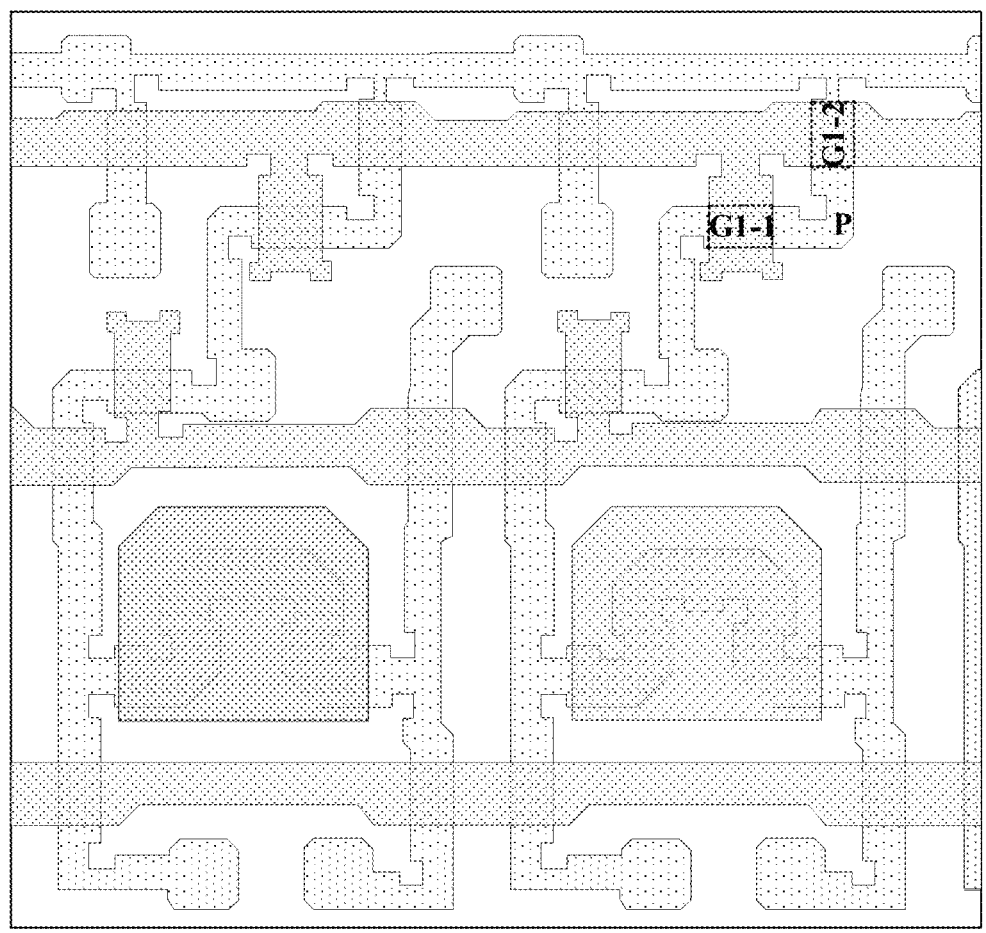
FIG. 14C illustrates the structure of a semiconductor material layer and a first conductive layer in some embodiments according to the present disclosure.

FIG. 14A illustrates the structure of a semiconductor material layer in some embodiments according to the present disclosure. FIG. 14B illustrates the structure of a first conductive layer in some embodiments according to the present disclosure. FIG. 14C illustrates the structure of a semiconductor material layer and a first conductive layer in some embodiments according to the present disclosure. Referring to FIG. 14A to FIG. 14C, an active layer ACT1 of the first transistor T1 includes a portion P, an orthographic projection of the portion P on the base substrate is non-overlapping with orthographic projections of the two gate electrodes (G1-1 and G1-2) of the first transistor T1 on the base substrate.

Figure 14D:
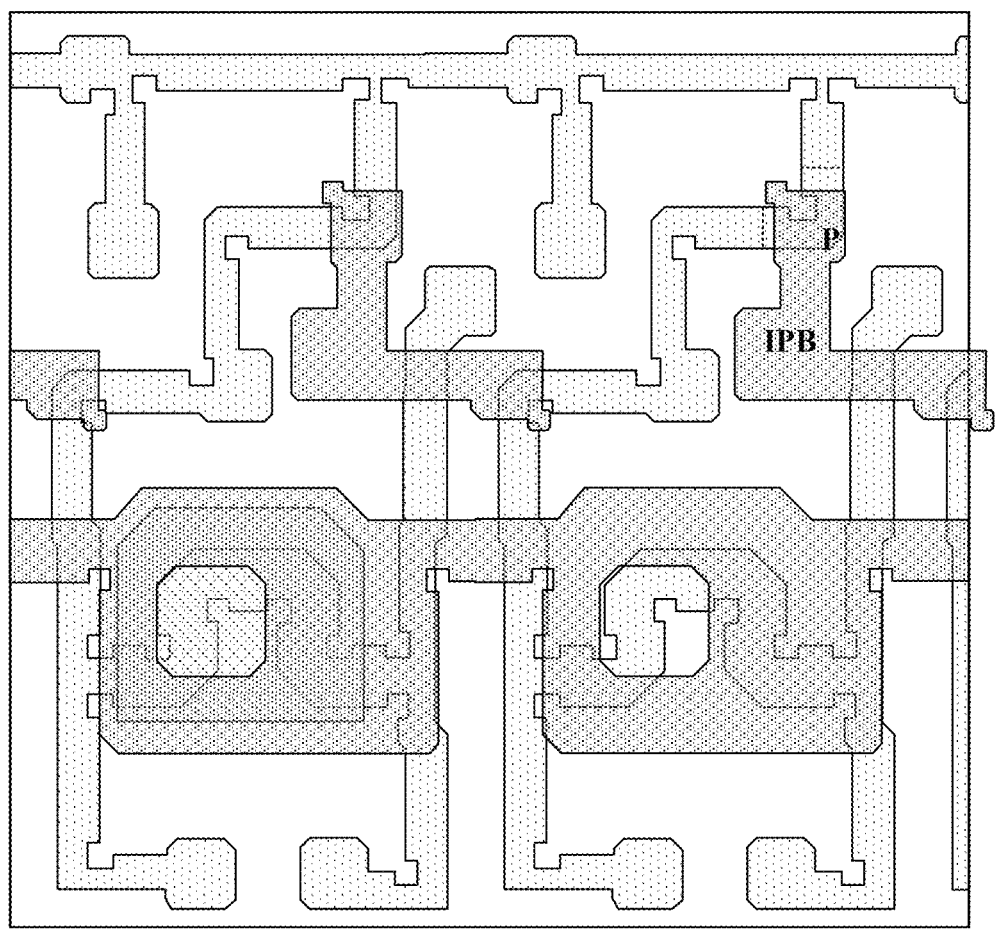
FIG. 14D illustrates the structure of a semiconductor material layer and a second conductive layer in some embodiments according to the present disclosure.

FIG. 14D illustrates the structure of a semiconductor material layer and a second conductive layer in some embodiments according to the present disclosure. Referring to FIG. 14A and FIG. 14D, the second conductive layer comprises a shielding block (e.g., the interference preventing block IPB depicted in FIG. 14D), an orthographic projection of the shielding block on the base substrate at least partially (e.g., at least 50%, at least 55%, at least 60%, at least 65%, at least 70%, at least 75%, at least 80%, at least 85%, at least 90%, at least 95%, at least 99%, or 100%) overlaps with an orthographic projection of the portion P on the base substrate.

Referring to FIG. 13D, the second conductive layer includes a plurality of second capacitor electrodes (a respective one of which is annotated as Ce2). Adjacent second capacitor electrodes of the plurality of second capacitor electrodes are connected to each other by a connecting portion CP.

Figure 14E:
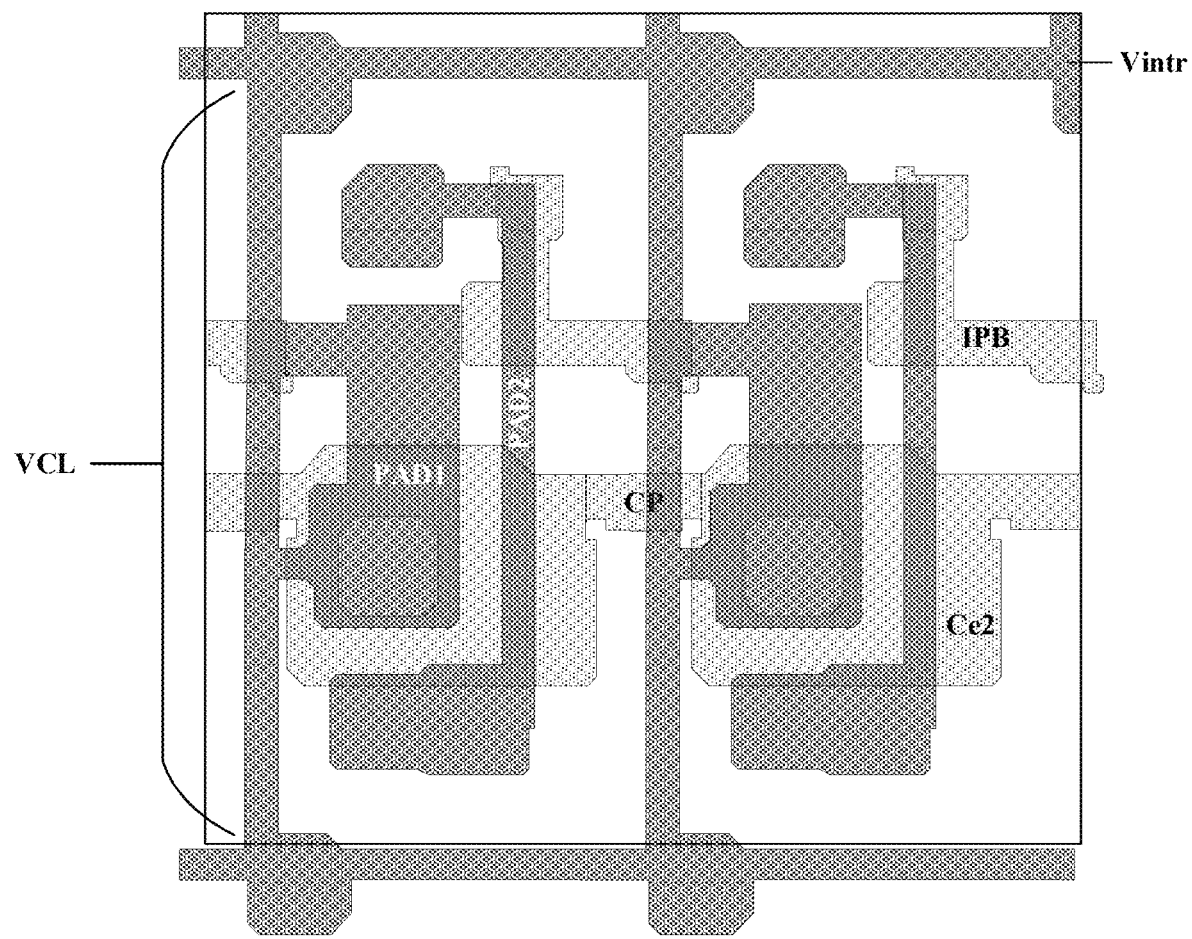
FIG. 14E illustrates the structure of a second conductive layer and a second signal line layer in some embodiments according to the present disclosure.

FIG. 14E illustrates the structure of a second conductive layer and a second signal line layer in some embodiments according to the present disclosure. Referring to FIG. 13D and FIG. 14E, the voltage connecting line VCL crosses over the connecting portion CP. An orthographic projection of the connecting portion CP on the base substrate at least partially overlaps with an orthographic projection of the voltage connecting line VCL on the base substrate.

In some embodiments, referring to FIG. 13A to FIG. 13I, the reset signal line network discussed above includes horizontal reset signal lines and vertical reset signal lines intersecting each other. A respective first reset signal line of the plurality of first reset signal lines Vintr may be considered as a horizontal reset signal line, and the voltage connecting line VCL may be considered as a vertical reset signal line. In some embodiments, the first pad PAD1 is electrically connected to a vertical reset signal line (e.g., the VCL), the vertical reset signal line is electrically connected to a horizontal reset signal line (e.g., the Vintr). The vertical reset signal line extends along the second direction DR2, the horizontal reset signal line extends along the first direction DR1. The horizontal reset signal line is in a second signal line layer. Optionally, the horizontal reset signal line and the vertical reset signal line are both in the second signal line layer.

Figure 15A:
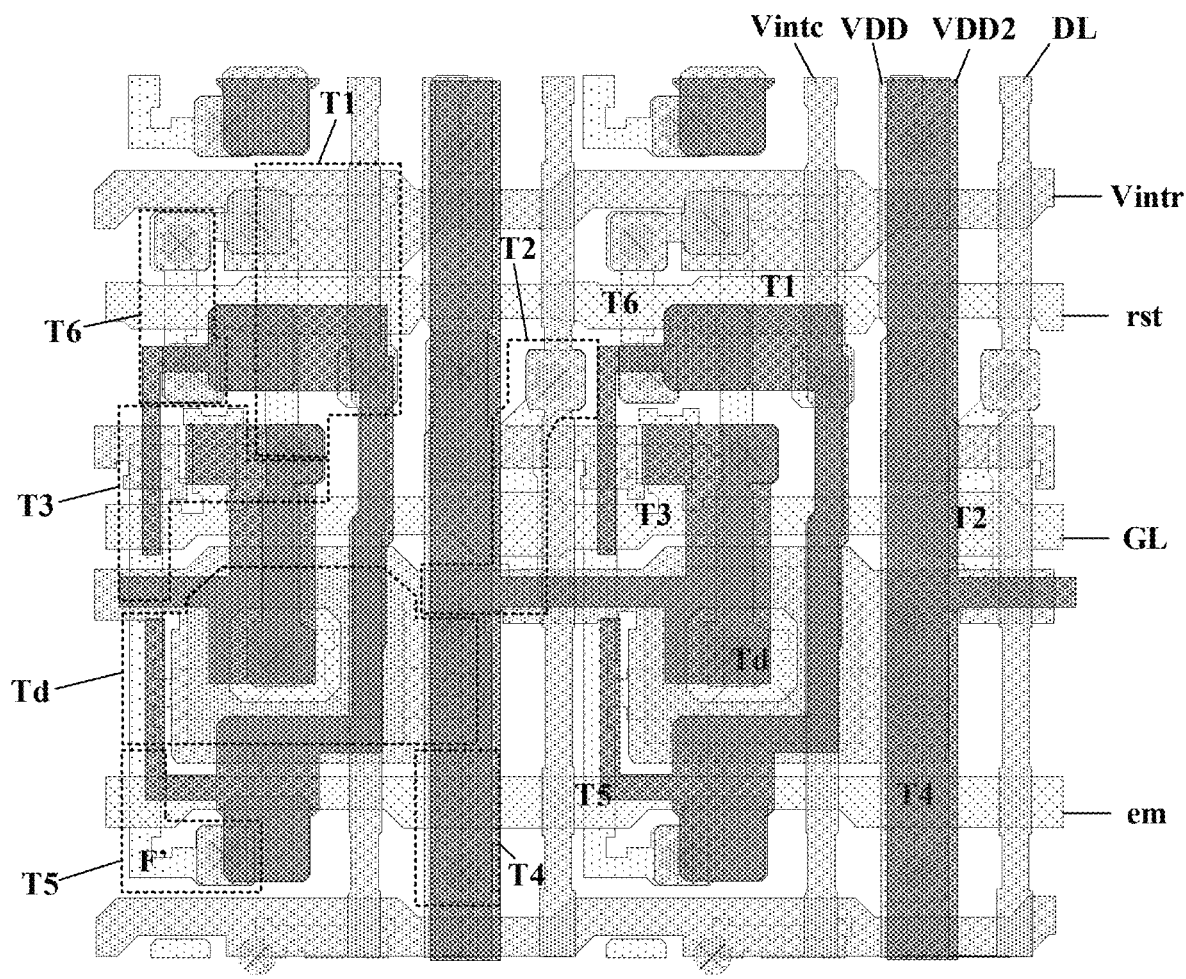
FIG. 15A is a diagram illustrating the structure of an array substrate in some embodiments according to the present disclosure.
Figure 15B:
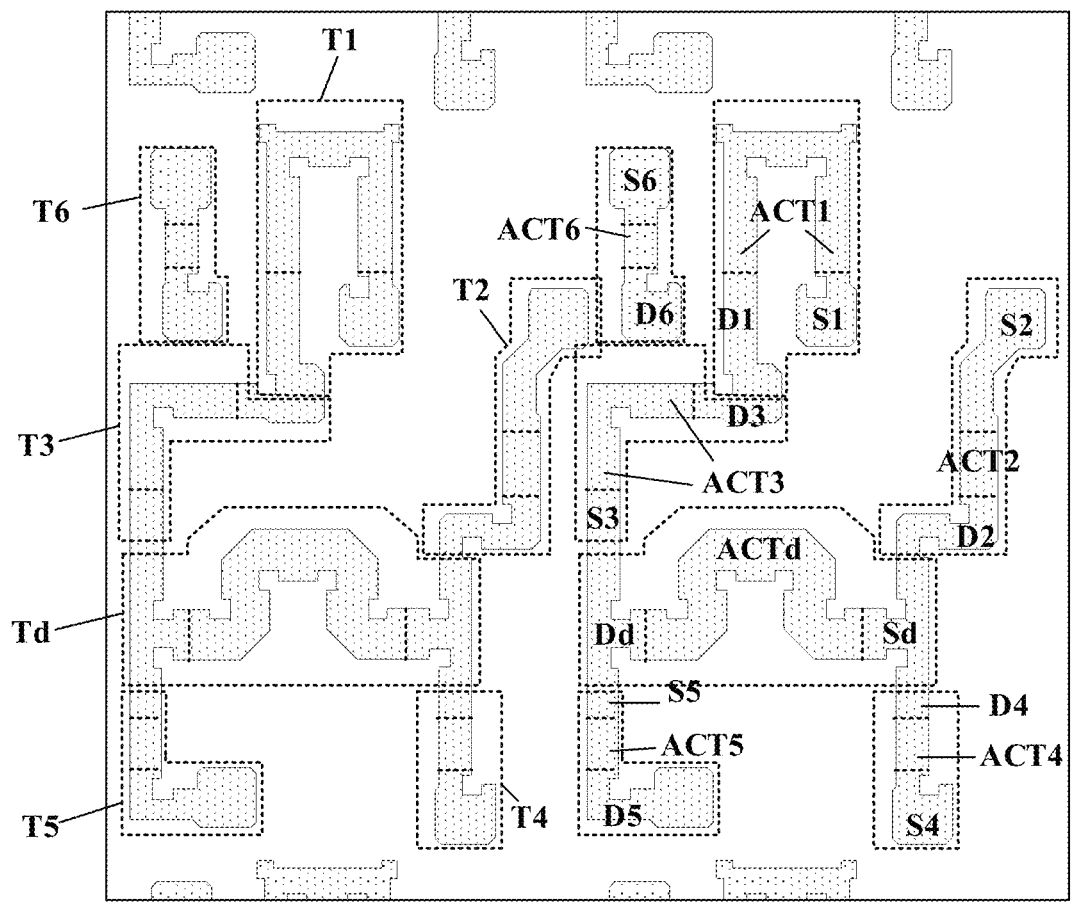
FIG. 15B is a diagram illustrating the structure of a semiconductor material layer in an array substrate depicted in FIG. 15A.
Figure 15C:
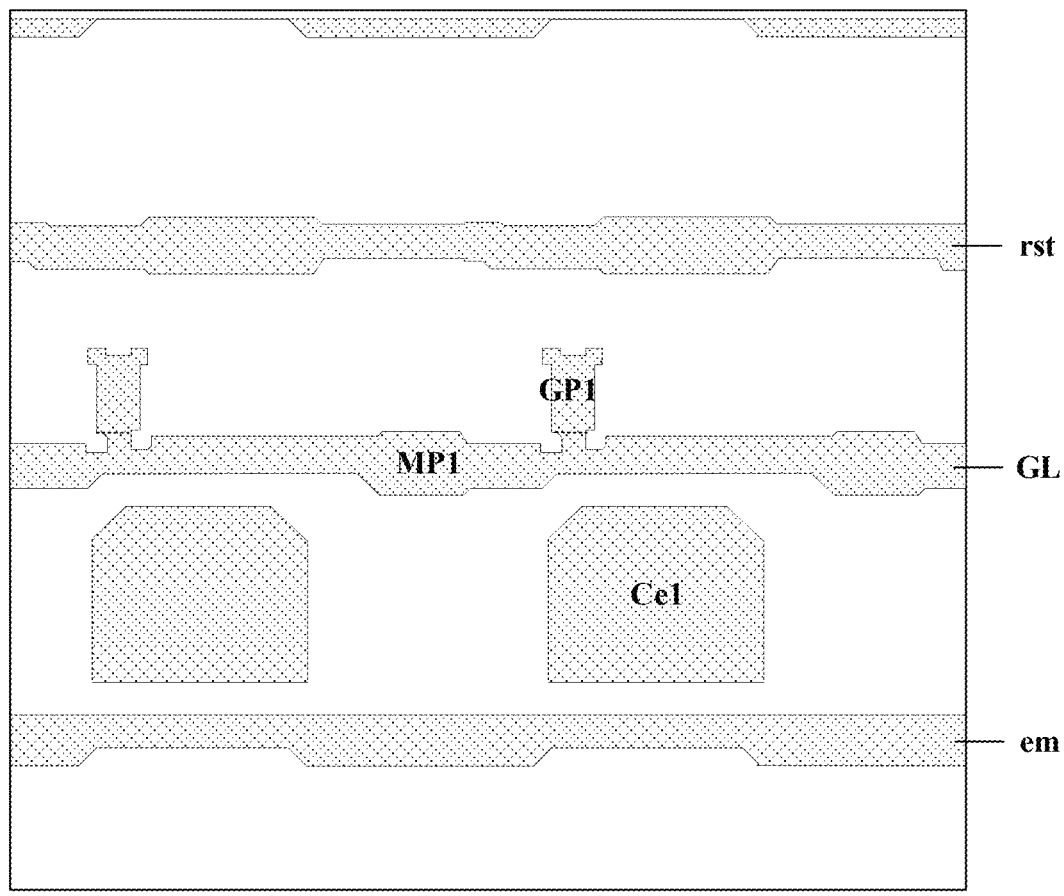
FIG. 15C is a diagram illustrating the structure of a first conductive layer in an array substrate depicted in FIG. 15A.
Figure 15D:
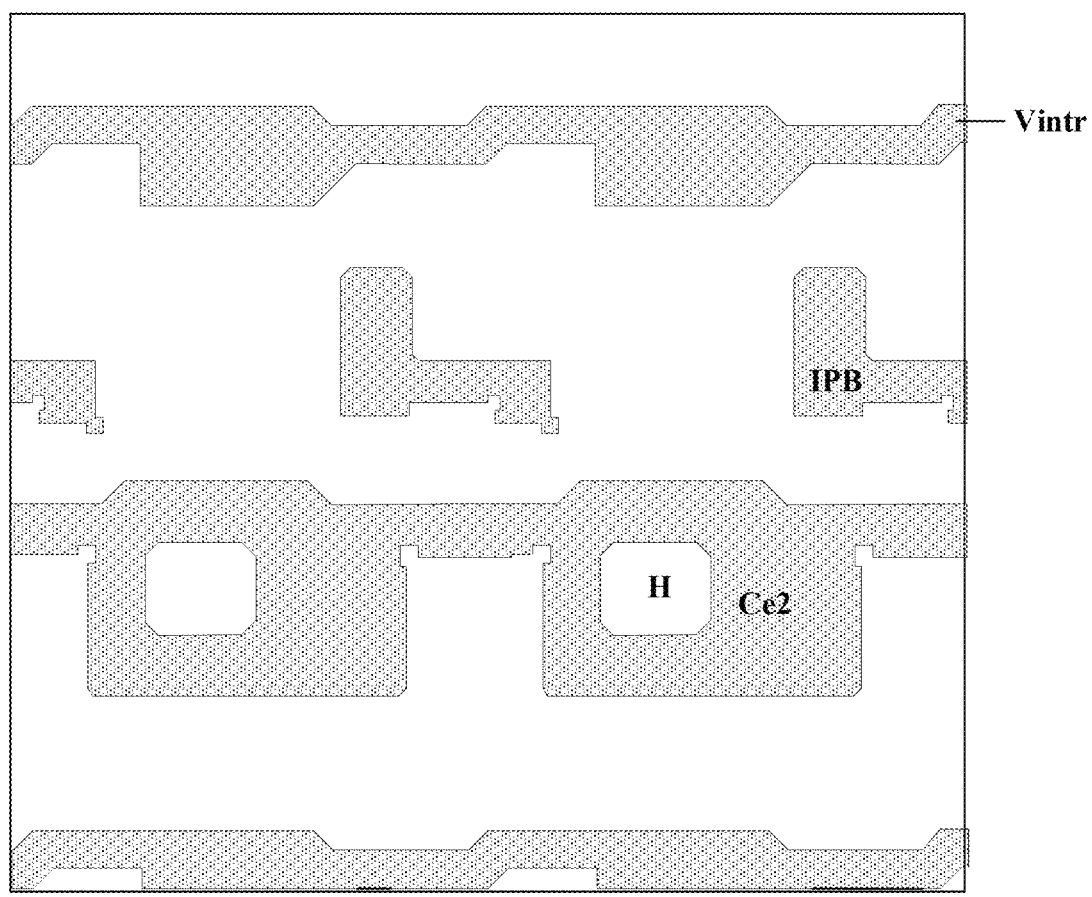
FIG. 15D is a diagram illustrating the structure of a second conductive layer in an array substrate depicted in FIG. 15A.
Figure 15E:
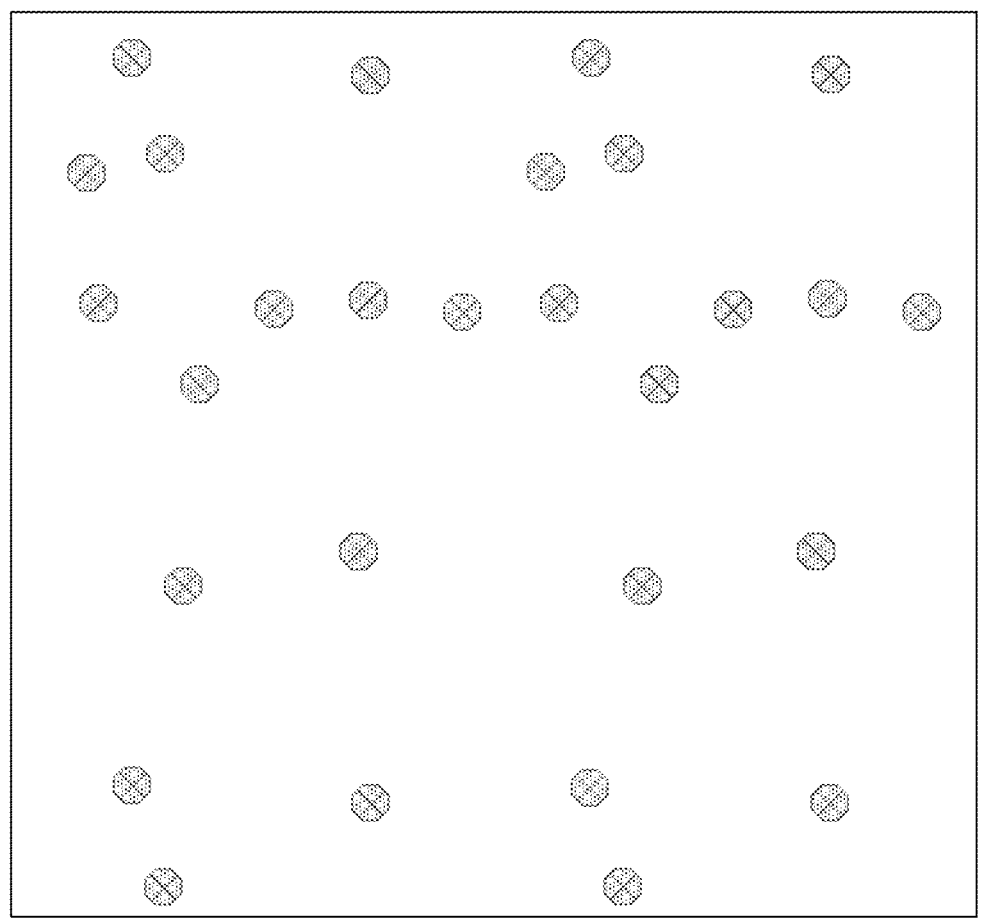
FIG. 15E is a diagram illustrating the structure of an inter-layer dielectric layer in an array substrate depicted in FIG. 15A.
Figure 15F:
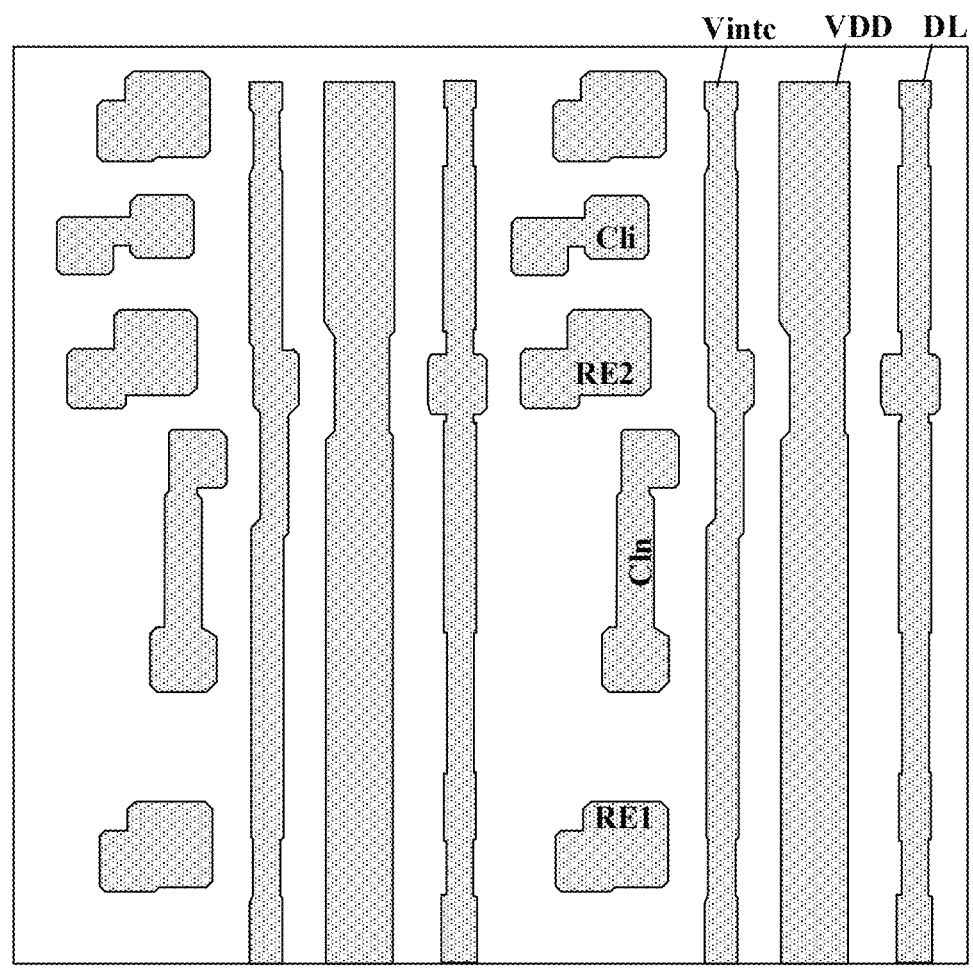
FIG. 15F is a diagram illustrating the structure of a first signal line layer in an array substrate depicted in FIG. 15A.
Figure 15G:
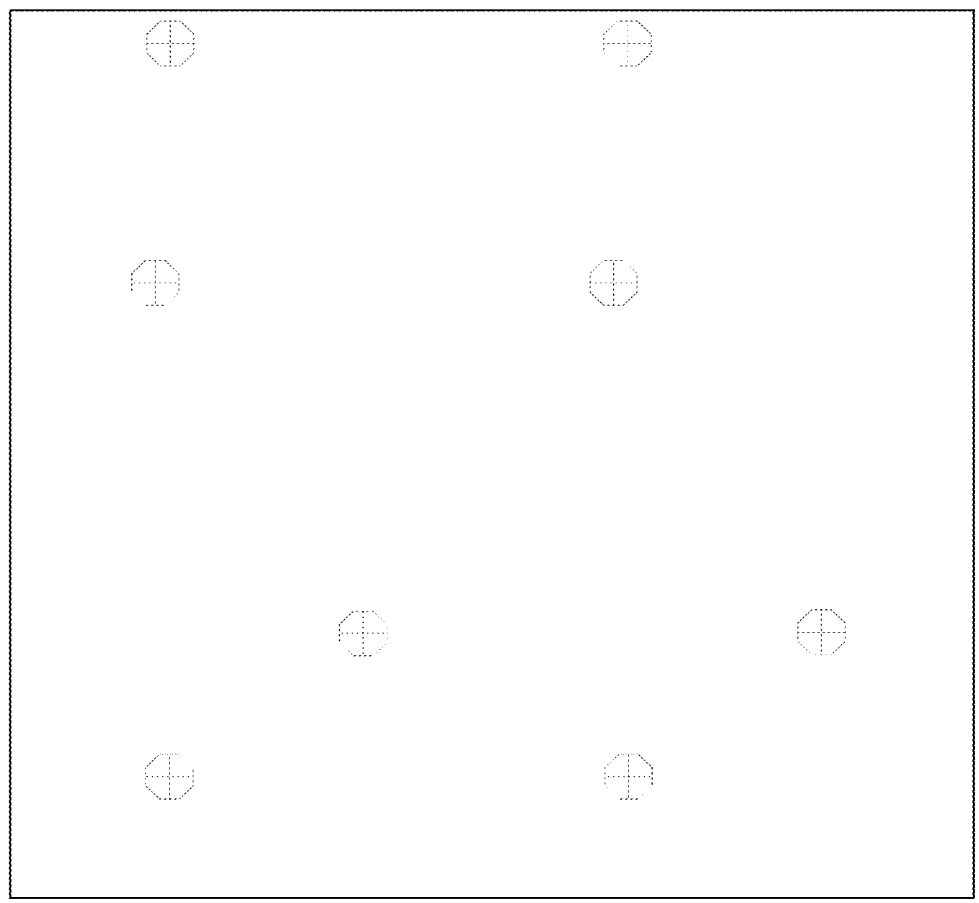
FIG. 15G is a diagram illustrating the structure of a passivation layer in an array substrate depicted in FIG. 15A.
Figure 15H:
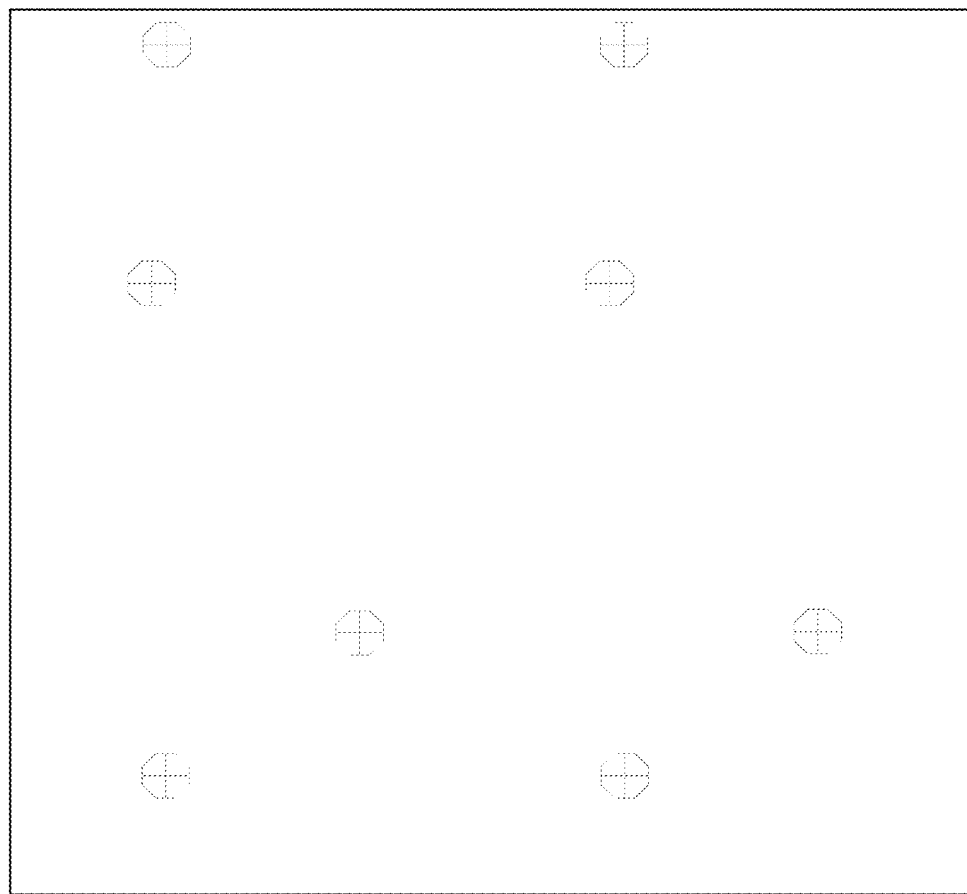
FIG. 15H is a diagram illustrating the structure of a first planarization layer in an array substrate depicted in FIG. 15A.
Figure 15I:
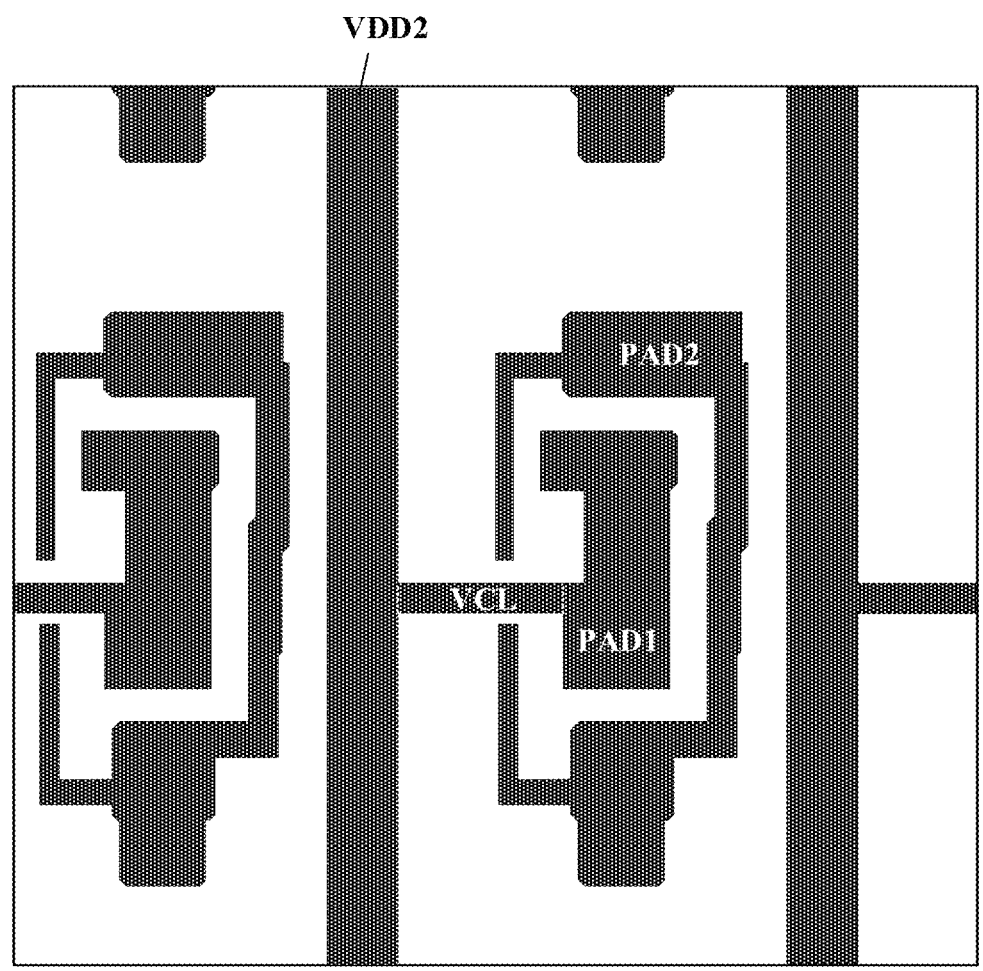
FIG. 15I is a diagram illustrating the structure of a second signal line layer in an array substrate depicted in FIG. 15A.
Figure 15J:
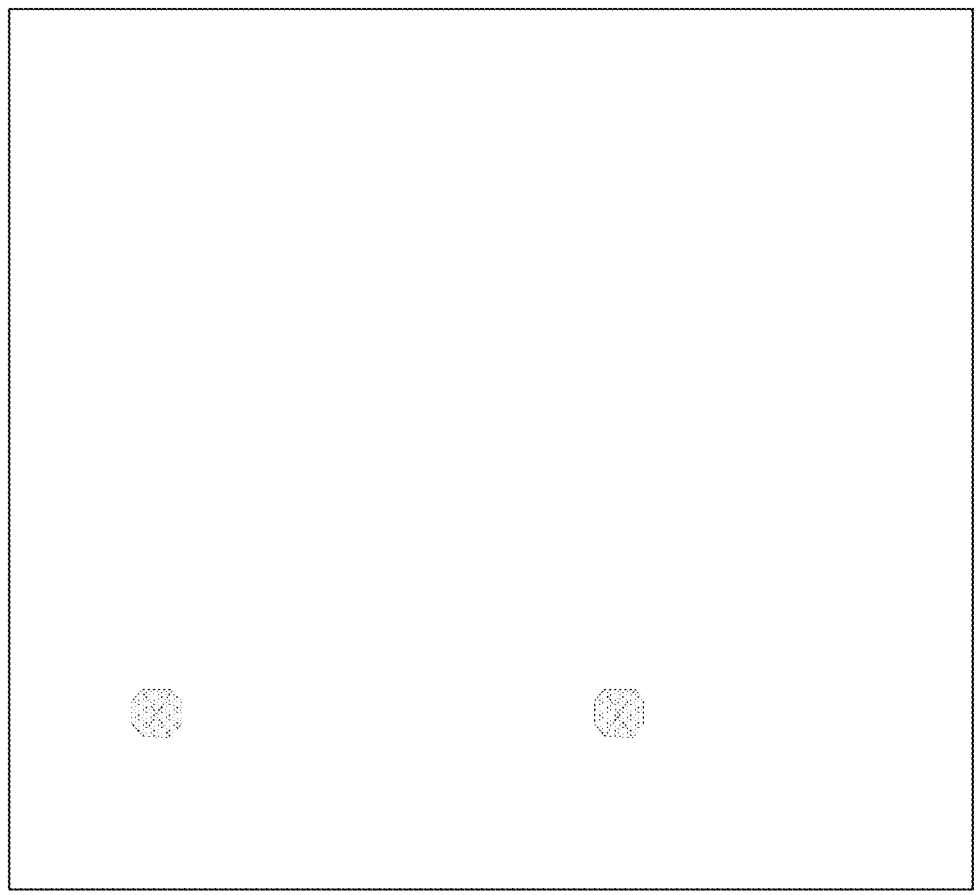
FIG. 15J is a diagram illustrating the structure of a second planarization layer in an array substrate depicted in FIG. 15A.

FIG. 15A is a diagram illustrating the structure of an array substrate in some embodiments according to the present disclosure. FIG. 15B is a diagram illustrating the structure of a semiconductor material layer in an array substrate depicted in FIG. 15A. FIG. 15C is a diagram illustrating the structure of a first conductive layer in an array substrate depicted in FIG. 15A. FIG. 15D is a diagram illustrating the structure of a second conductive layer in an array substrate depicted in FIG. 15A. FIG. 15E is a diagram illustrating the structure of an inter-layer dielectric layer in an array substrate depicted in FIG. 15A. FIG. 15F is a diagram illustrating the structure of a first signal line layer in an array substrate depicted in FIG. 15A. FIG. 15G is a diagram illustrating the structure of a passivation layer in an array substrate depicted in FIG. 15A. FIG. 15H is a diagram illustrating the structure of a first planarization layer in an array substrate depicted in FIG. 15A. FIG. 15I is a diagram illustrating the structure of a second signal line layer in an array substrate depicted in FIG. 15A. FIG. 15J is a diagram illustrating the structure of a second planarization layer in an array substrate depicted in FIG. 15A.

The array substrate depicted in FIG. 15A to FIG. 15J differs from the array substrate depicted in FIG. 7A to FIG. 7J in that it includes a plurality of second voltage signal lines VDD2, e.g., in the second signal line layer. A respective one of the plurality of second voltage signal lines VDD2 is connected to a respective one of the plurality of voltage signal lines VDD through a via extending through the first planarization layer. Structural details of the array substrate depicted in FIG. 15A to FIG. 15J are largely similar to those discussed in association with FIG. 7A to FIG. 7J, FIG. 8A to FIG. 8D, FIG. 9A, FIG. 9B, FIG. 10A, and FIG. 10B, except for those specifically discussed below.

As shown in FIG. 15I, the voltage connecting line VCL, the first pad PAD1, and a respective one of the plurality of second voltage signal lines VDD2 are parts of a unitary structure. The first pad PAD1 is connected to a respective voltage supply line of the plurality of voltage supply lines Vdd in an adjacent pixel driving circuit through the voltage connecting line VCL and the respective one of the plurality of second voltage signal lines VDD2. The voltage connecting line VCL is connected to the respective voltage supply line of the plurality of voltage supply lines Vdd in the adjacent pixel driving circuit through the respective one of the plurality of second voltage signal lines VDD2 in the adjacent pixel driving circuit. The respective one of the plurality of second voltage signal lines VDD2 in the adjacent pixel driving circuit is connected to the respective voltage supply line of the plurality of voltage supply lines Vdd in the adjacent pixel driving circuit through a via (e.g., a seventh via v7) extending through the first planarization layer PLN1. The respective voltage supply line of the plurality of voltage supply lines Vdd is connected to the second capacitor electrode Ce2 through an eighth via v8 extending through the inter-layer dielectric layer ILD.

Referring to FIG. 15I, the second pad PAD2 in some embodiments is a partial loop that surrounds at least 75% (e.g., at least 80%, at least 85%, at least 90%, at least 95%, or at least 98%) of the first pad PAD1. The partial loop of the second pad PAD2 is open at a position between a respective second voltage signal line of the plurality of second voltage signal lines VDD2 and the first pad PAD1, and the voltage connecting line VCL extends from the respective second voltage signal line of the plurality of second voltage signal lines VDD2 to the first pad PAD1 through the opening. The inventors of the present disclosure discover that, by having the second pad PAD2 to have a partial loop configuration that surrounds at least 75% of the first pad PAD1, it can be better ensured that first nodes respectively in different pixel driving circuits are situated in a similar environment.

Figure 16A:
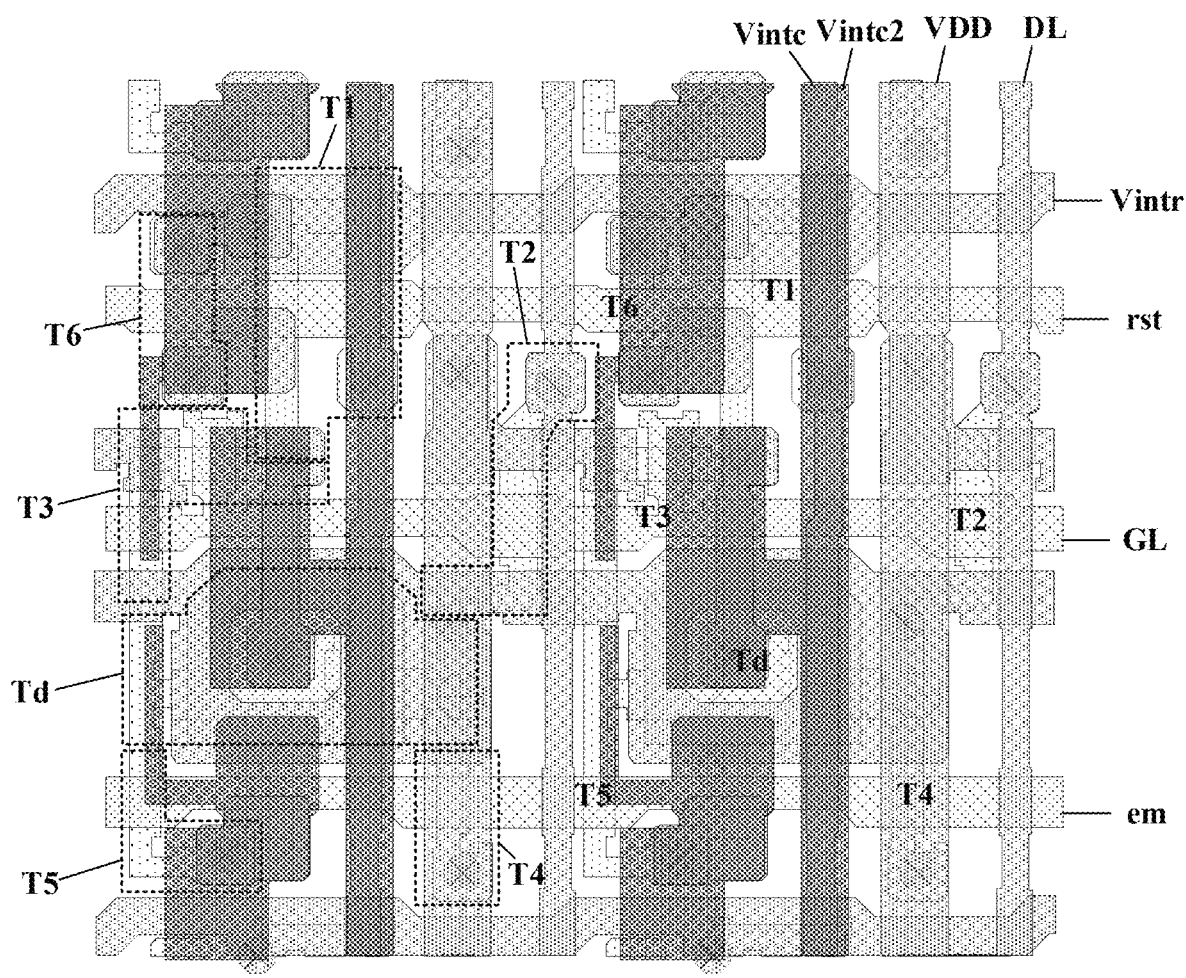
FIG. 16A is a diagram illustrating the structure of an array substrate in some embodiments according to the present disclosure.
Figure 16B:
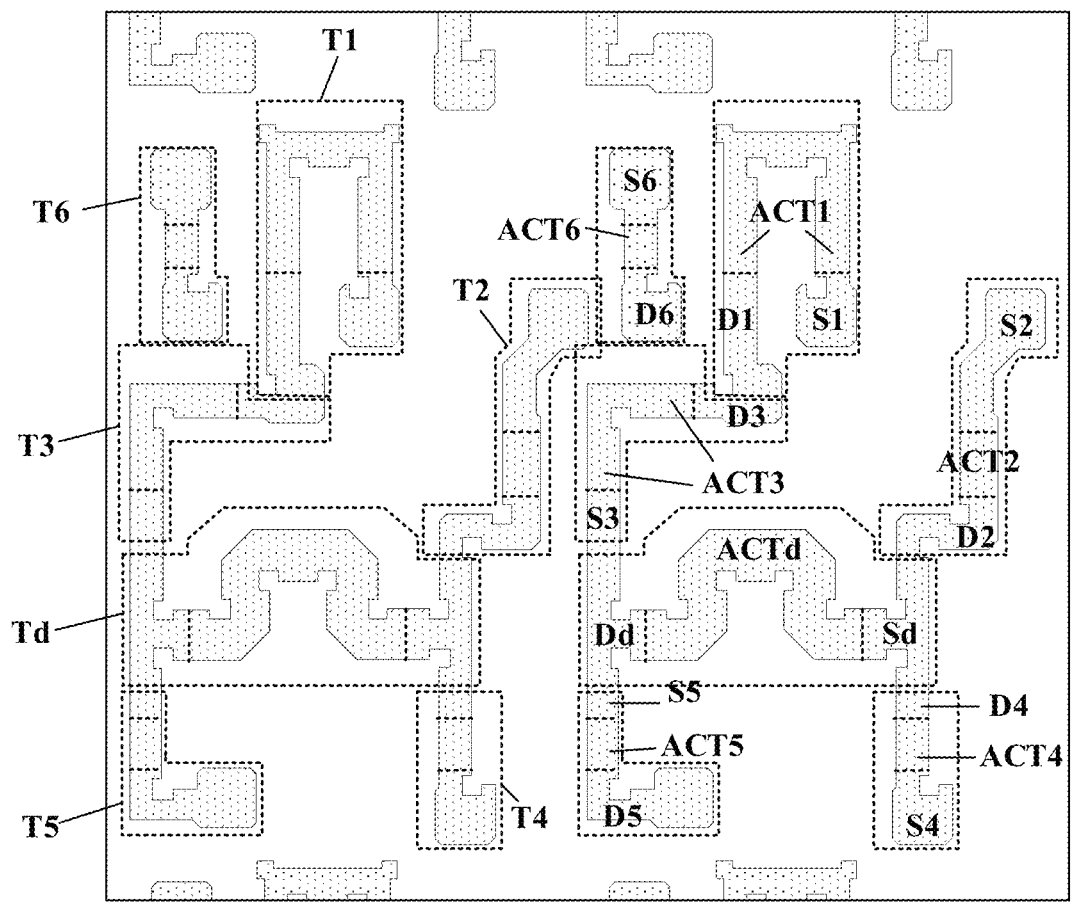
FIG. 16B is a diagram illustrating the structure of a semiconductor material layer in an array substrate depicted in FIG. 16A.
Figure 16C:
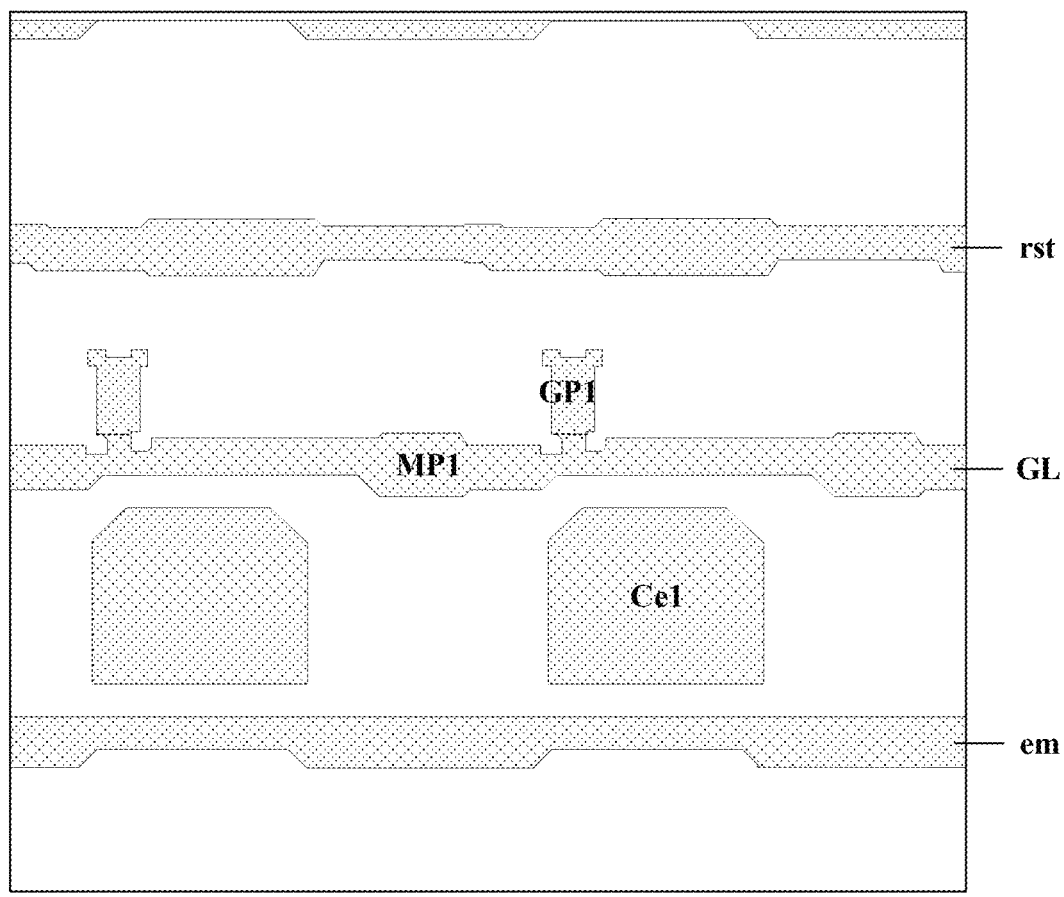
FIG. 16C is a diagram illustrating the structure of a first conductive layer in an array substrate depicted in FIG. 16A.
Figure 16D:
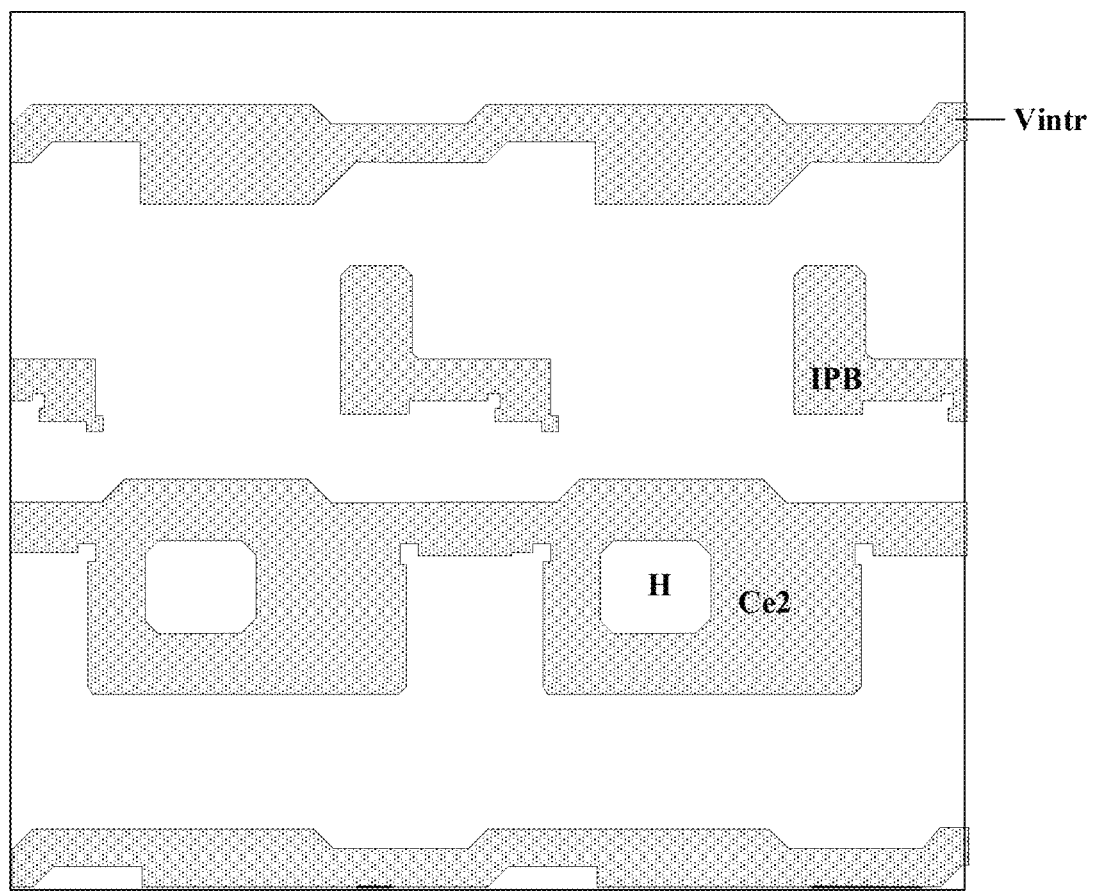
FIG. 16D is a diagram illustrating the structure of a second conductive layer in an array substrate depicted in FIG. 16A.
Figure 16E:
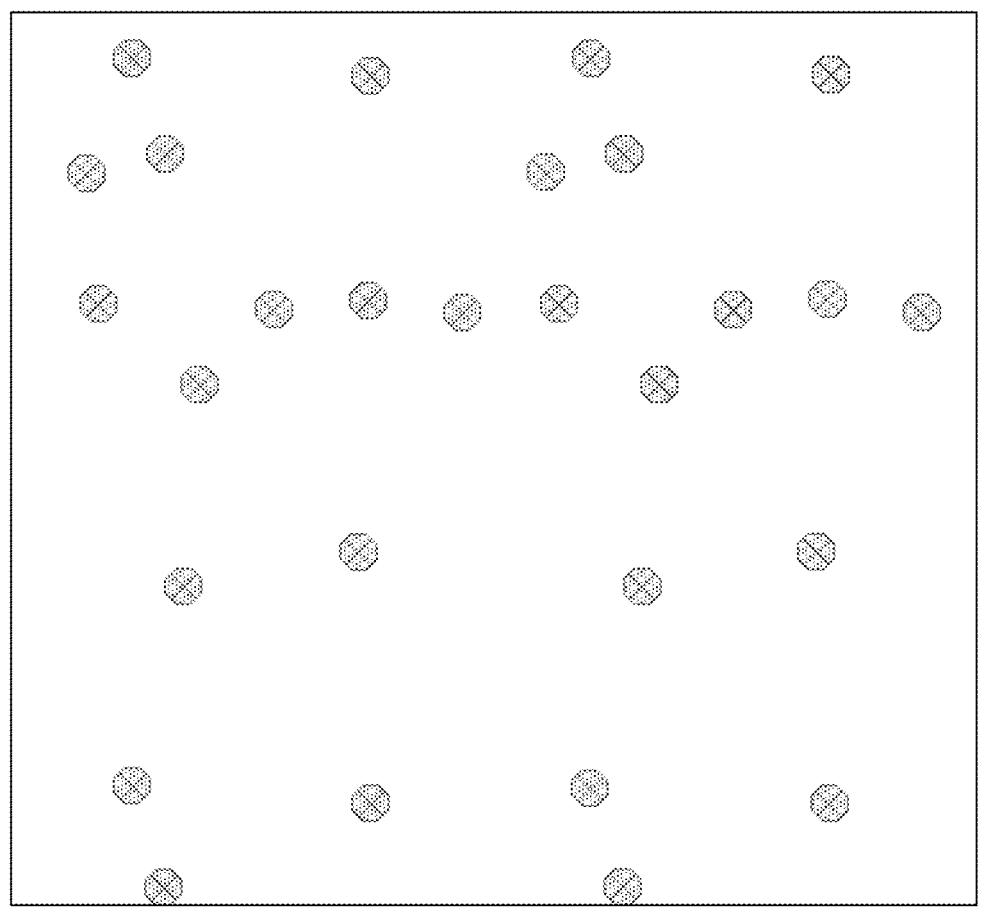
FIG. 16E is a diagram illustrating the structure of an inter-layer dielectric layer in an array substrate depicted in FIG. 16A.
Figure 16F:
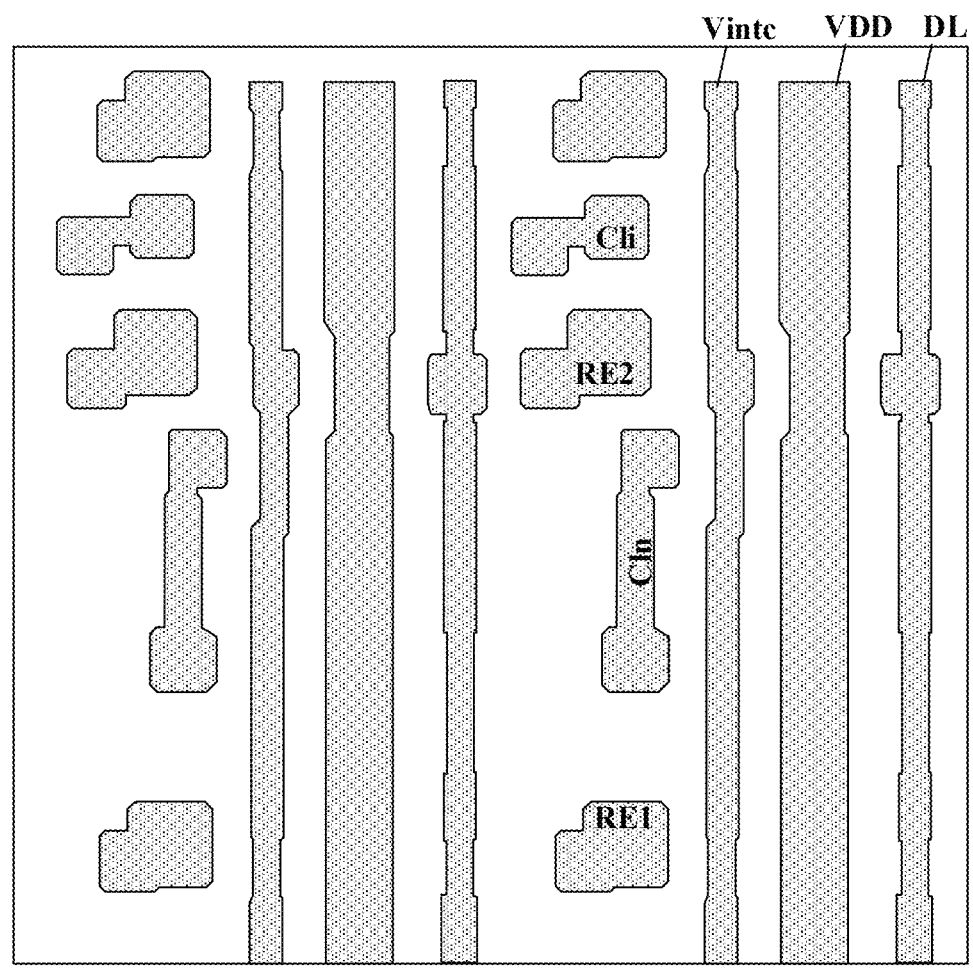
FIG. 16F is a diagram illustrating the structure of a first signal line layer in an array substrate depicted in FIG. 16A.
Figure 16G:
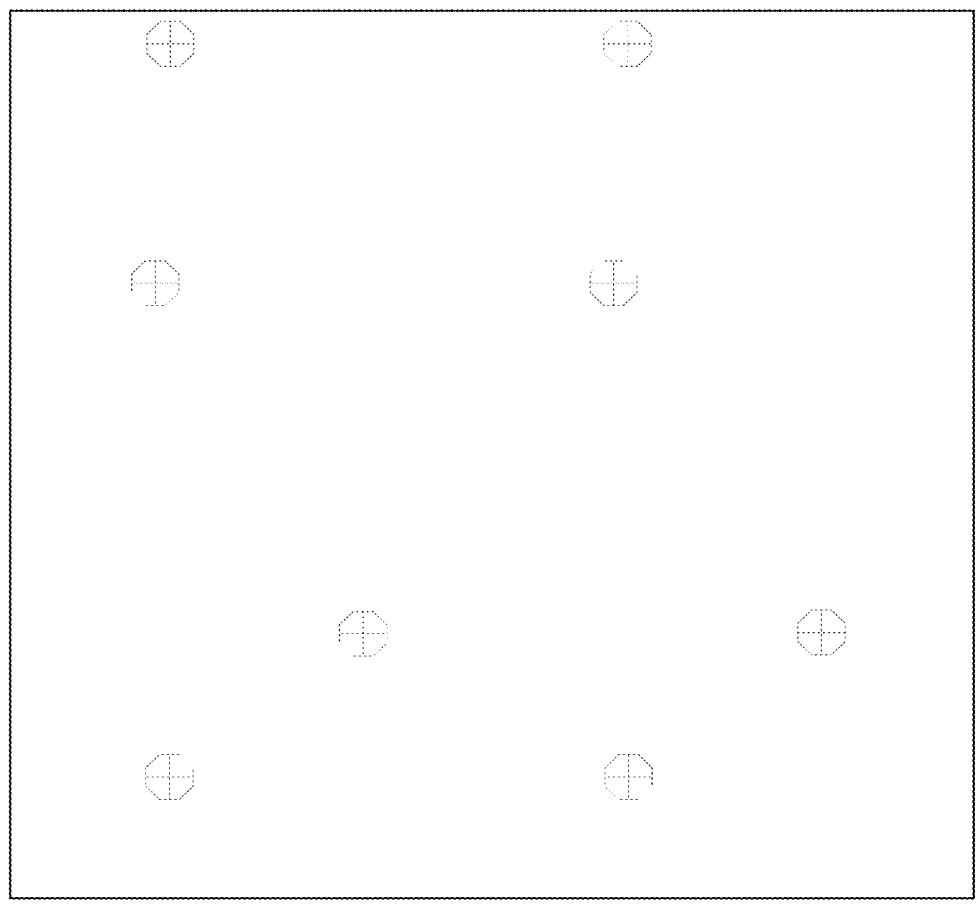
FIG. 16G is a diagram illustrating the structure of a passivation layer in an array substrate depicted in FIG. 16A.
Figure 16H:
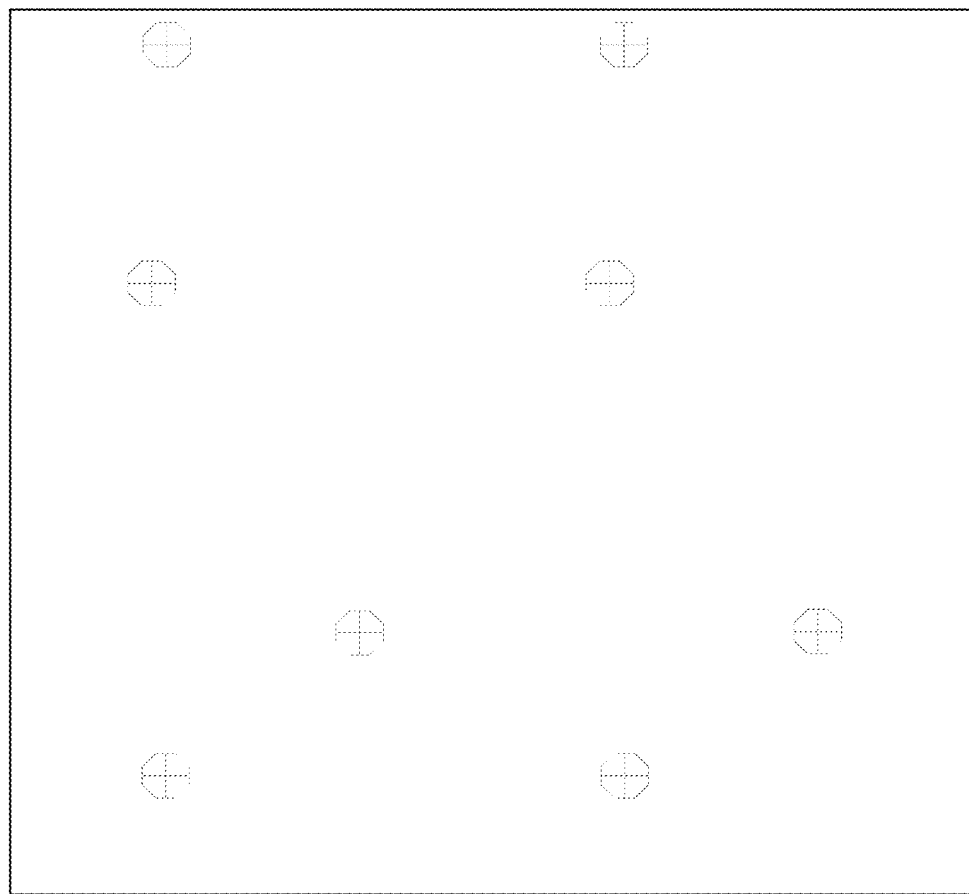
FIG. 16H is a diagram illustrating the structure of a first planarization layer in an array substrate depicted in FIG. 16A.
Figure 16I:
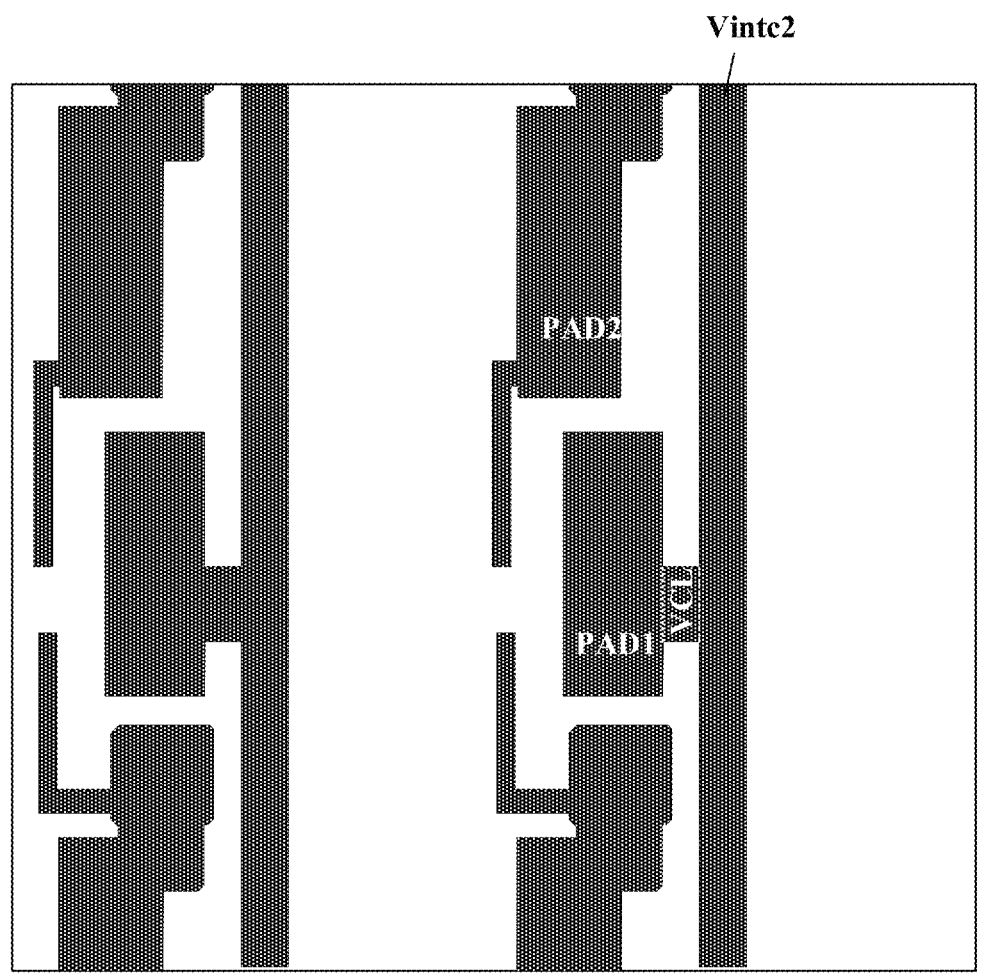
FIG. 16I is a diagram illustrating the structure of a second signal line layer in an array substrate depicted in FIG. 16A.
Figure 16J:
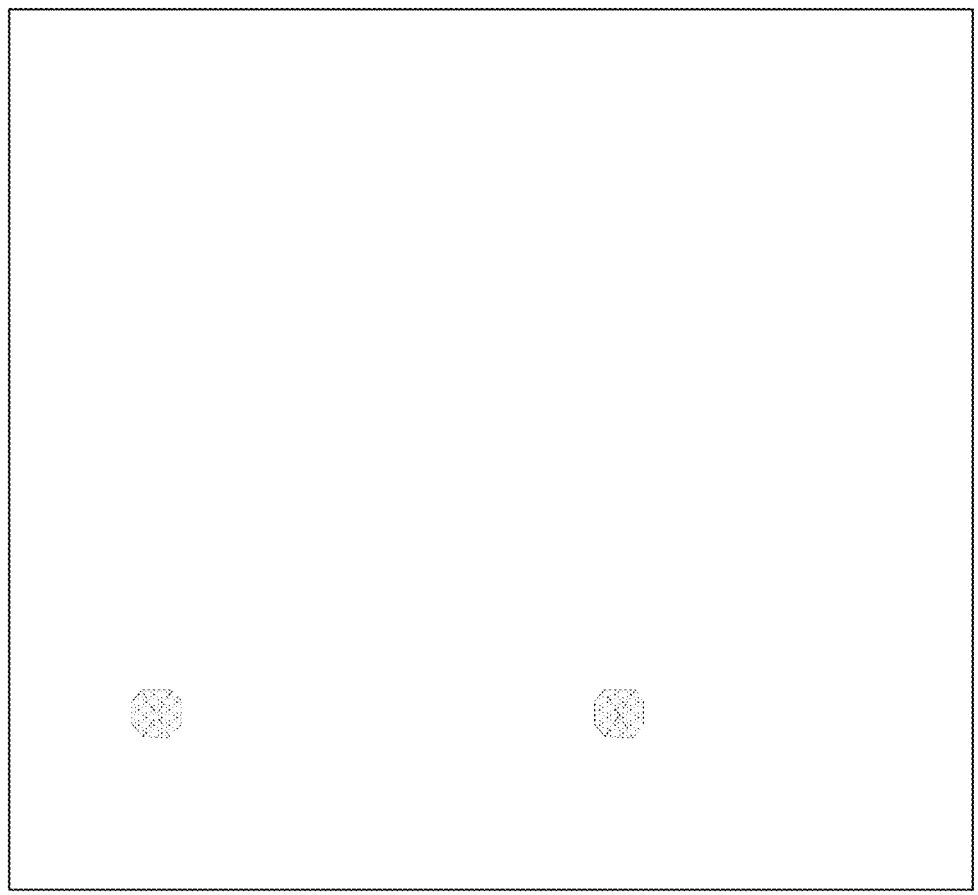
FIG. 16J is a diagram illustrating the structure of a second planarization layer in an array substrate depicted in FIG. 16A.

FIG. 16A is a diagram illustrating the structure of an array substrate in some embodiments according to the present disclosure. FIG. 16B is a diagram illustrating the structure of a semiconductor material layer in an array substrate depicted in FIG. 16A. FIG. 16C is a diagram illustrating the structure of a first conductive layer in an array substrate depicted in FIG. 16A. FIG. 16D is a diagram illustrating the structure of a second conductive layer in an array substrate depicted in FIG. 16A. FIG. 16E is a diagram illustrating the structure of an inter-layer dielectric layer in an array substrate depicted in FIG. 16A. FIG. 16F is a diagram illustrating the structure of a first signal line layer in an array substrate depicted in FIG. 16A. FIG. 16G is a diagram illustrating the structure of a passivation layer in an array substrate depicted in FIG. 16A. FIG. 16H is a diagram illustrating the structure of a first planarization layer in an array substrate depicted in FIG. 16A. FIG. 16I is a diagram illustrating the structure of a second signal line layer in an array substrate depicted in FIG. 16A. FIG. 16J is a diagram illustrating the structure of a second planarization layer in an array substrate depicted in FIG. 16A.

The array substrate depicted in FIG. 16A to FIG. 16J differs from the array substrate depicted in FIG. 7A to FIG. 7J in that it includes a plurality of third reset signal lines Vintc2, e.g., in the second signal line layer. A respective one of the plurality of third reset signal lines Vintc2 is connected to a respective one of the plurality of second reset signal lines Vintc through a via extending through the first planarization layer. Structural details of the array substrate depicted in FIG. 16A to FIG. 16J are largely similar to those discussed in association with FIG. 7A to FIG. 7J, FIG. 8A to FIG. 8D, FIG. 9A, FIG. 9B, FIG. 10A, and FIG. 10B, except for those specifically discussed below.

As shown in FIG. 16I, the voltage connecting line VCL, the first pad PAD1, and a respective one of the plurality of third reset signal lines Vintc2 are parts of a unitary structure. The first pad PAD1 is connected to a respective second reset signal line of the plurality of second reset signal lines Vintc through the voltage connecting line VCL and the respective third reset signal line of the plurality of third reset signal lines Vintc2. The voltage connecting line VCL is connected to the respective second reset signal line of the plurality of second reset signal lines Vintc through the respective third reset signal line of the plurality of third reset signal lines Vintc2. The respective third reset signal line of the plurality of third reset signal lines Vintc2 is connected to the respective second reset signal line of the plurality of second reset signal lines Vintc through a via extending through the first planarization layer. The respective second reset signal line of the plurality of second reset signal lines Vintc are configured to provide a reset signal to a gate electrode of the driving transistor. The respective second reset signal line of the plurality of second reset signal lines Vintc is connected to the source electrode S1 of the first transistor T1 through a fourth via extending through the inter-layer dielectric layer, the insulating layer, and the gate insulating layer, thereby providing an initialization signal to the source electrode S1 of the first transistor T1.

Figure 17:
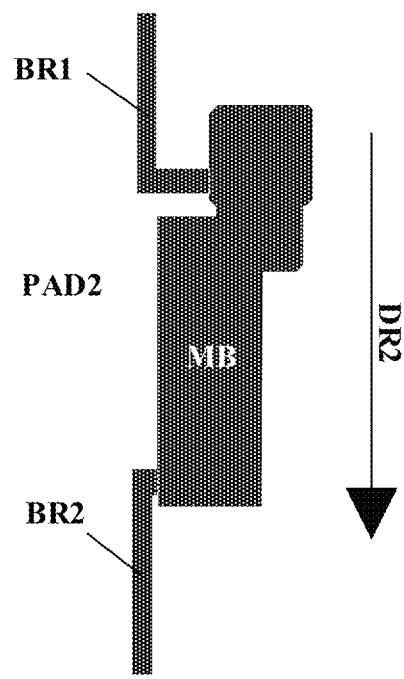
FIG. 17 illustrates the structure of a second pad in an array substrate depicted in FIG. 16A.

FIG. 17 illustrates the structure of a second pad in an array substrate depicted in FIG. 16A. Referring to FIG. 17, the second pad PAD2 includes a first branch BR1 and a second branch BR2 extend from a main body MB of the second pad PAD2. Optionally, the first branch BR1 and the second branch BR2 extend along a second direction DR2. Referring to FIG. 16I and FIG. 17, a first branch BR1 and a second branch BR2 respectively from two adjacent pixel driving circuits at least partially (e.g., at least 70%, at least 75%, at least 80%, at least 85%, at least 90%, at least 95%, or at least 98%) surround the first pad PAD1 on a side away from the respective third reset signal line of the plurality of third reset signal lines Vintc2. The inventors of the present disclosure discover that, by having the first branch BR1 and the second branch BR2 respectively from two adjacent pixel driving circuits at least partially surround the first pad PAD1 on a side away from the respective third reset signal line of the plurality of third reset signal lines Vintc2, it can be better ensured that first nodes respectively in different pixel driving circuits are situated in a similar environment.

Various anode arrangements may be implemented in the present array substrate.

Figure 18A:
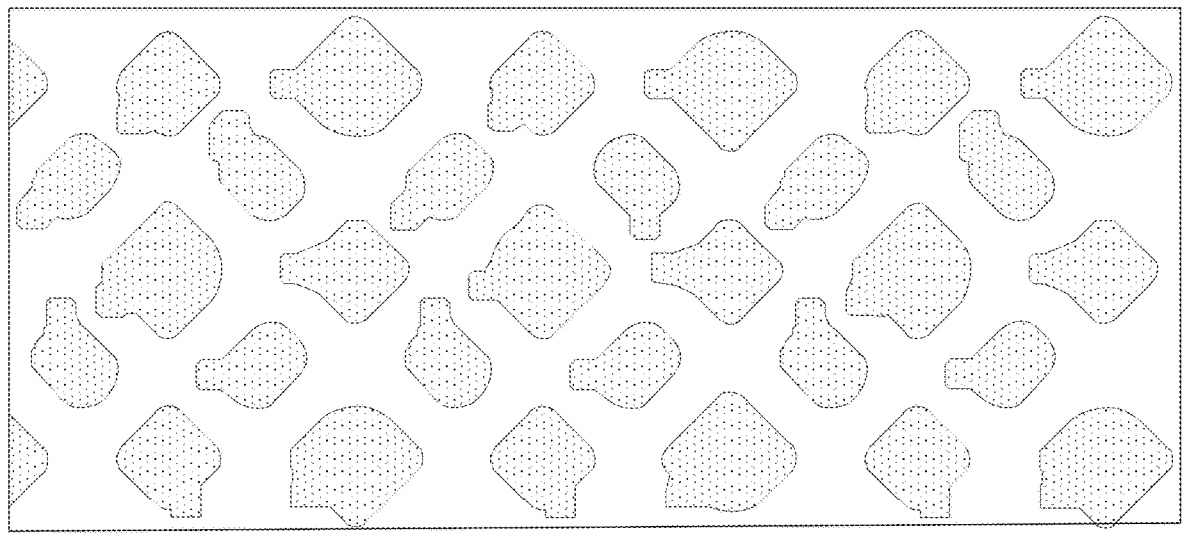
FIG. 18A illustrates an anode arrangement in an array substrate in some embodiments according to the present disclosure.
Figure 18B:
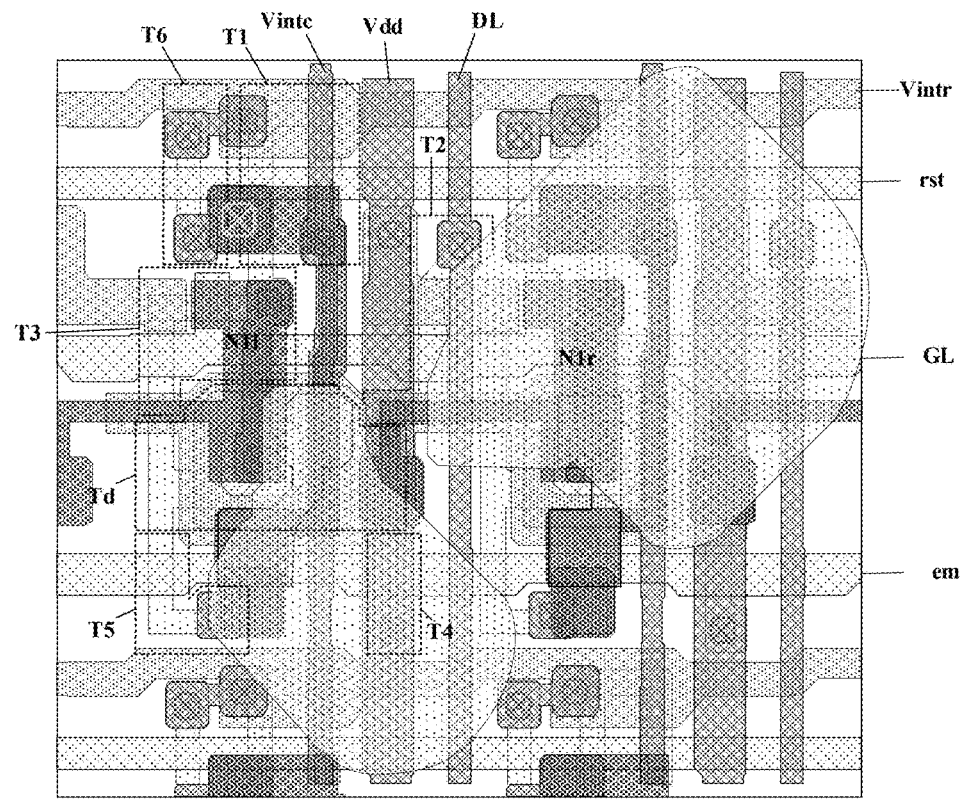
FIG. 18B is a diagram illustrating the structure of an array substrate in some embodiments according to the present disclosure.
Figure 19A:
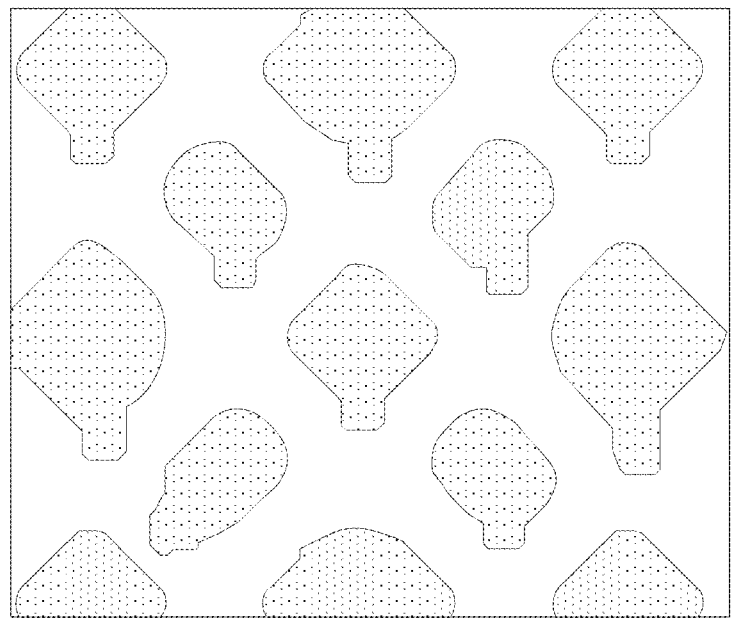
FIG. 19A illustrates an anode arrangement in an array substrate in some embodiments according to the present disclosure.
Figure 19B:
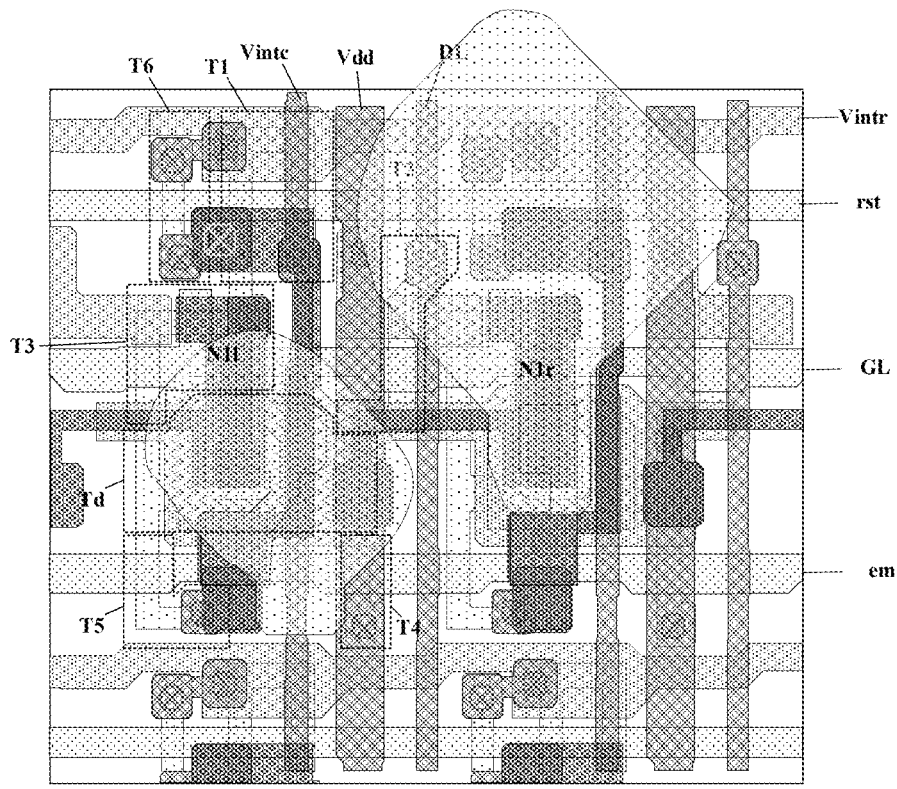
FIG. 19B is a diagram illustrating the structure of an array substrate in some embodiments according to the present disclosure.

FIG. 18A illustrates an anode arrangement in an array substrate in some embodiments according to the present disclosure. FIG. 18B is a diagram illustrating the structure of an array substrate in some embodiments according to the present disclosure. FIG. 18B shows an array substrate having the anode arrangement depicted in FIG. 18A. FIG. 19A illustrates an anode arrangement in an array substrate in some embodiments according to the present disclosure. FIG. 19B is a diagram illustrating the structure of an array substrate in some embodiments according to the present disclosure. FIG. 19B shows an array substrate having the anode arrangement depicted in FIG. 19A.

Figure 20A:
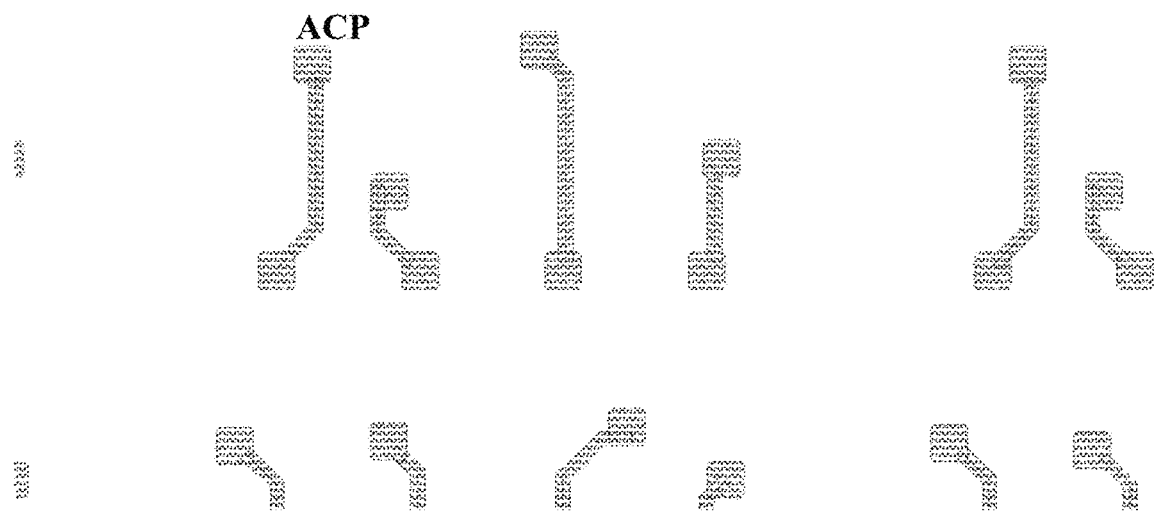
FIG. 20A is a diagram illustrating the structure of an anode connecting pad layer in an array substrate in some embodiments according to the present disclosure.
Figure 20B:
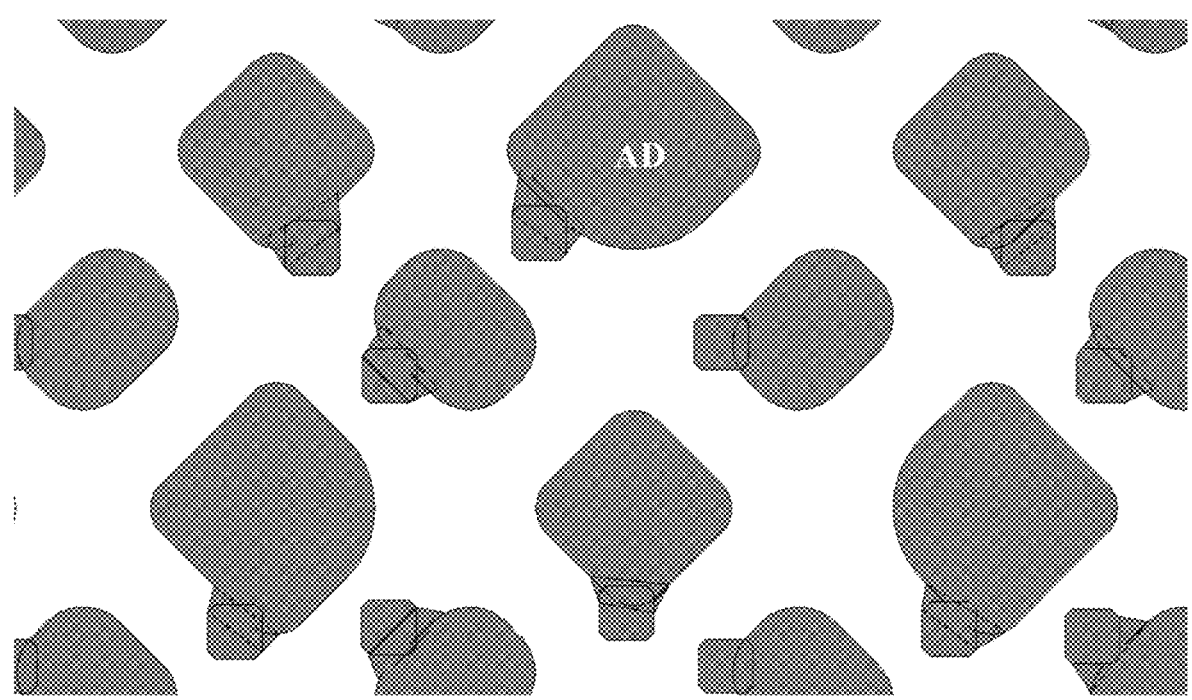
FIG. 20B is a diagram illustrating the structure of an anode layer in an array substrate in some embodiments according to the present disclosure.
Figure 20C:
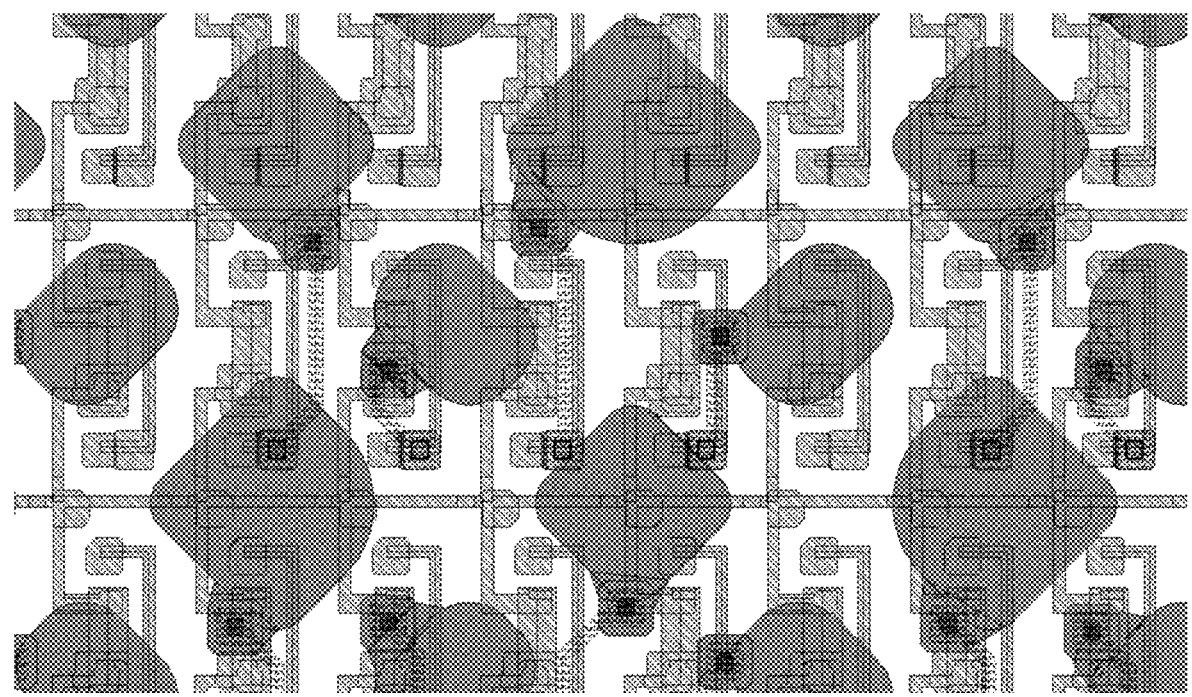
FIG. 20C is a diagram illustrating the structure of a second conductive layer, an anode connecting pad layer, and an anode layer in an array substrate in some embodiments according to the present disclosure.

FIG. 20A is a diagram illustrating the structure of an anode connecting pad layer in an array substrate in some embodiments according to the present disclosure. FIG. 20B is a diagram illustrating the structure of an anode layer in an array substrate in some embodiments according to the present disclosure. FIG. 20C is a diagram illustrating the structure of a second conductive layer, an anode connecting pad layer, and an anode layer in an array substrate in some embodiments according to the present disclosure.

Figure 21A:
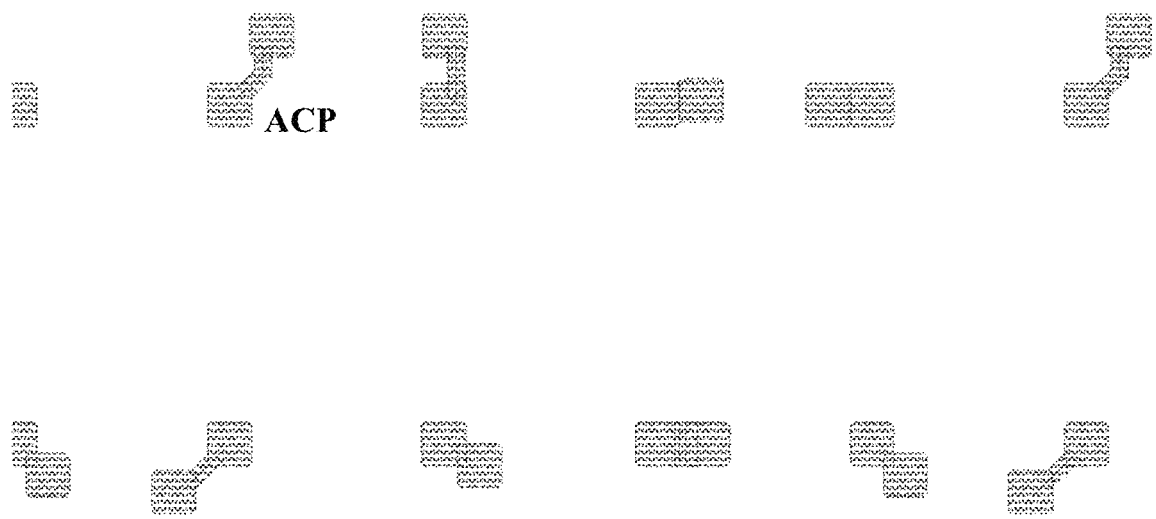
FIG. 21A is a diagram illustrating the structure of an anode connecting pad layer in an array substrate in some embodiments according to the present disclosure.
Figure 21B:
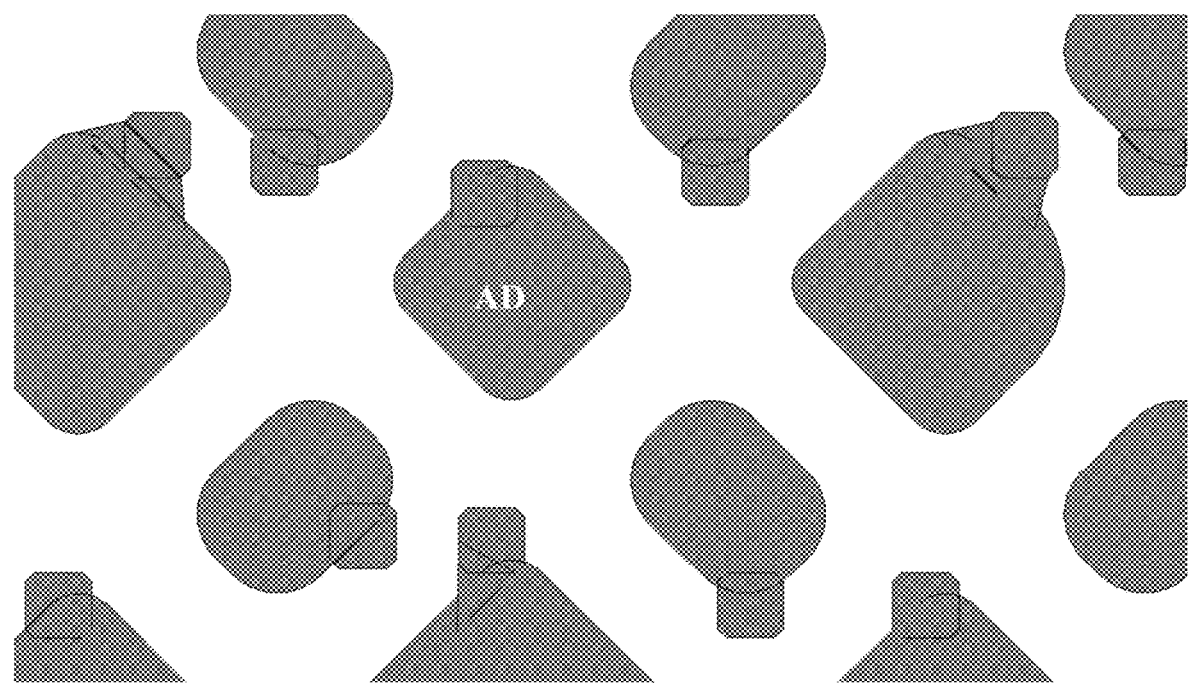
FIG. 21B is a diagram illustrating the structure of an anode layer in an array substrate in some embodiments according to the present disclosure.
Figure 21C:
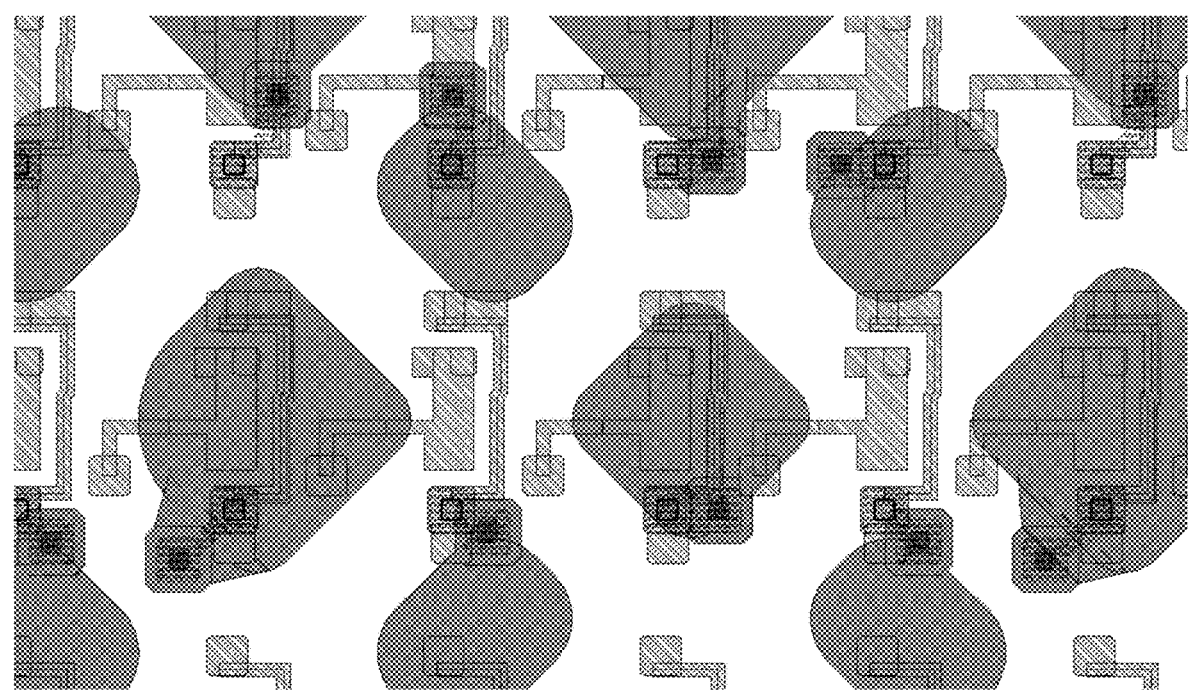
FIG. 21C is a diagram illustrating the structure of a second conductive layer, an anode connecting pad layer, and an anode layer in an array substrate in some embodiments according to the present disclosure.

FIG. 21A is a diagram illustrating the structure of an anode connecting pad layer in an array substrate in some embodiments according to the present disclosure. FIG. 21B is a diagram illustrating the structure of an anode layer in an array substrate in some embodiments according to the present disclosure. FIG. 21C is a diagram illustrating the structure of a second conductive layer, an anode connecting pad layer, and an anode layer in an array substrate in some embodiments according to the present disclosure.

In another aspect, the present invention provides a display apparatus, including the array substrate described herein or fabricated by a method described herein, and one or more integrated circuits connected to the array substrate. Examples of appropriate display apparatuses include, but are not limited to, an electronic paper, a mobile phone, a tablet computer, a television, a monitor, a notebook computer, a digital album, a GPS, etc. Optionally, the display apparatus is an organic light emitting diode display apparatus. Optionally, the display apparatus is a liquid crystal display apparatus.

In some embodiments, a gate-on-array (GOA) circuit is disposed in a display area of the display apparatus. In the area corresponding to the gate-on-array circuit, the pixel driving circuits are absent, and anodes of light emitting elements are present. The display area includes a transition area adjacent to the area corresponding to the gate-on-array circuit. The anodes in the area corresponding to the gate-on-array circuit are connected to pixel driving circuits in the transition area. Accordingly, the transition area has a higher density of pixel driving circuits as compared to a normal display area, which is on a side of transition area away from the gate-on-array. In the transition area, the relative position between the node connecting line and the first node is different from that in the normal display area.

In another aspect, the present invention provides a method of fabricating an array substrate. In some embodiments, the method includes forming a plurality of pixel driving circuits configured to drive light emission in a plurality of subpixels. Optionally, forming a respective pixel driving circuit includes forming a node connecting line in a first signal line layer; and forming a first pad in a second signal line layer. Optionally, the node connecting line is formed to connect a first capacitor electrode in the respective pixel driving circuit and a portion of a semiconductor material layer together, the portion of the semiconductor material layer being between a source electrode of a first transistor and a drain electrode of the driving transistor. Optionally, an orthographic projection of the first pad on a base substrate at least partially overlaps with an orthographic projection of the node connecting line on the base substrate.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. An array substrate, comprising a base substrate, and a plurality of pixel driving circuits configured to drive light emission in a plurality of subpixels;
   wherein a respective pixel driving circuit comprises:
   a driving transistor;
   a compensation transistor configured to provide a compensation voltage signal to a gate electrode of the driving transistor; the compensation transistor comprising a source electrode, a drain electrode and a gate electrode;
   a node connecting line in a first signal line layer;
   a first pad in a second signal line layer on a side of the first signal line layer away from the base substrate;
   a voltage line configured to output a constant voltage signal; and
   a voltage connecting line electrically connecting the first pad with the voltage line;
   wherein the node connecting line connects the gate electrode of the driving transistor and a drain electrode of the compensation transistor;
   an orthographic projection of the first pad on a base substrate at least partially overlaps with an orthographic projection of the node connecting line on the base substrate; and
   an orthographic projection of the voltage line and the voltage connecting line on the base substrate is spaced apart from the orthographic projection of the node connecting line on the base substrate.

2. The array substrate of claim 1, wherein the first pad, a portion of the voltage connecting line, and a portion of the voltage line are parts of a closed loop.

3. The array substrate of claim 1, further comprising:
   a connecting line layer on a side of the second signal line layer away from the base substrate, the connecting line layer comprising a plurality of connecting lines;
   an anode layer on a side of the connecting line layer away from the base substrate;
   wherein the respective pixel driving circuit further comprises a second pad in the second signal line layer;
   the second pad is connected to a respective anode through a respective connecting line of the plurality of connecting lines; and
   the respective connecting line comprises a transparent conducting material.

4. The array substrate of claim 1, wherein the respective pixel driving circuit further comprises a first transistor having two gate electrodes, and an active layer comprising a portion, an orthographic projection of the portion on the base substrate is non-overlapping with orthographic projections of the two gate electrodes of the first transistor on the base substrate;
   wherein a drain electrode of the first transistor is electrically connected to the gate electrode of the driving transistor;
   the array substrate further comprising a second conductive layer on a side of the first signal line layer closer to the base substrate;
   wherein the second conductive layer comprises a shielding block, an orthographic projection of the shielding block on the base substrate at least partially overlaps with an orthographic projection of the portion on the base substrate.

5. The array substrate of claim 1, wherein the array substrate further comprising a second conductive layer on a side of the first signal line layer closer to the base substrate;
   the second conductive layer comprises a plurality of second capacitor electrodes, adjacent second capacitor electrodes of the plurality of second capacitor electrodes being connected to each other by a connecting portion; and
   an orthographic projection of the connecting portion on the base substrate at least partially overlaps with an orthographic projection of the voltage connecting line on the base substrate.

6. The array substrate of claim 1, wherein the node connecting line has a length along a first direction less than a length along a second direction;
   the voltage line has a length along the first direction less than a length along the second direction; and
   the first direction and the second direction cross over each other.

7. The array substrate of claim 1, wherein the orthographic projection of the first pad on the base substrate covers the orthographic projection of the node connecting line on the base substrate; and
   the orthographic projection of the first pad on the base substrate at least partially overlaps with an orthographic projection of an active layer of the compensation transistor on the base substrate.

8. The array substrate of claim 1, wherein the orthographic projection of the first pad on the base substrate at least partially overlaps with an orthographic projection of the gate electrode of the compensation transistor on the base substrate.

9. The array substrate of claim 1, wherein the respective pixel driving circuit further comprises a second pad in the second signal line layer;
   wherein the second pad is connected to a drain electrode of a fifth transistor and a drain electrode of a sixth transistor, and electrically connected to an anode of a light emitting element connected to the respective pixel driving circuit;
   a source electrode of the fifth transistor is electrically connected to a drain electrode of the driving transistor; and
   a source electrode of the sixth transistor is electrically connected to the voltage line.

10. The array substrate of claim 9, wherein the first pad and the second pad cross over a respective gate line of a plurality of gate lines.

11. The array substrate of claim 9, wherein a length of the second pad along a first direction is greater than a length of the first pad along the first direction;
   a length of the second pad along a second direction is greater than a length of the first pad along the second direction; and
   the second pad at least partially surrounds the first pad.

12. The array substrate of claim 11, wherein an orthographic projection of the second pad on the base substrate at least partially overlaps with an orthographic projection of a signal line in the first signal line layer on the base substrate; and the signal line is configured to transmit a continuous direct current.

13. The array substrate of claim 11, wherein a portion of the second pad extends along a direction substantially parallel to an extension direction of a respective second reset signal line of a plurality of second reset signal lines, a respective second reset signal line of the plurality of second reset signal lines being configured to provide a reset signal to the gate electrode of the driving transistor; and an orthographic projection of the respective second reset signal line on the base substrate at least partially overlaps with an orthographic projection of the portion of the second pad on the base substrate.

14. The array substrate of claim 11, wherein a portion of the second pad extends along a direction substantially parallel to an extension direction of a respective voltage supply line of a plurality of voltage supply lines;

an orthographic projection of the respective voltage supply line on the base substrate at least partially overlaps with an orthographic projection of the portion of the second pad on the base substrate; and the respective voltage supply line is configured to provide a driving voltage to a light emitting element connected to the respective pixel driving circuit.

15. The array substrate of claim 1, wherein the first pad is configured to receive a reset signal;

the first pad is electrically connected to a vertical reset signal line, the vertical reset signal line extending along a second direction;

the vertical reset signal line is electrically connected to a horizontal reset signal line, the horizontal reset signal line extending along a first direction; and the horizontal reset signal line is in the second signal line layer.

16. The array substrate of claim 15, further comprising a plurality of reset signal transmission lines in a semiconductor material layer, the semiconductor material layer being on a side of the first signal line layer closer to the base substrate;

wherein a respective reset signal transmission line of the plurality of reset signal transmission lines connects source electrodes of first transistors and sixth transistors in a row of pixel driving circuit together;

the respective reset signal transmission line extends along the first direction; and a drain electrode of a respective one of the first transistors is electrically connected to the gate electrode of the driving transistor.

17. The array substrate of claim 1, wherein the first pad is configured to receive a voltage supply signal;

the first pad is connected to a respective voltage supply line of a plurality of voltage supply lines in an adjacent pixel driving circuit; and the respective voltage supply line is configured to provide a driving voltage to a light emitting element connected to the respective pixel driving circuit.

18. The array substrate of claim 1, wherein the voltage connecting line crosses over a respective data line of a plurality of data lines, the respective data line being in an adjacent pixel driving circuit adjacent to the respective pixel driving circuit.

19. The array substrate of claim 1, wherein the plurality of pixel driving circuits comprise at least a first pixel driving circuit and a second pixel driving circuit;

orthographic projections of a first node connecting line in the first pixel driving circuit and a second node connecting line in the second pixel driving circuit on the base substrate respectively overlap with orthographic projections of a first anode in the first pixel driving circuit and a second anode in the second pixel driving circuit on the base substrate, at different portions, respectively, and by different percentages;

the second node connecting line connects a gate electrode of a driving transistor in the second pixel driving circuit with a drain electrode of a compensation transistor in the second pixel driving circuit;

a voltage level at a first node is the same as a voltage level at a gate electrode of a driving transistor in the first pixel driving circuit; and a voltage level at a second node is the same as a voltage level at the gate electrode of the driving transistor in the second pixel driving circuit.

20. A display apparatus, comprising the array substrate of claim 1, and an integrated circuit connected to the array substrate.

* * * * *